US006738283B2

(12) United States Patent
Kasai et al.

(10) Patent No.: US 6,738,283 B2
(45) Date of Patent: May 18, 2004

(54) METHOD OF READING STORED DATA AND SEMICONDUCTOR MEMORY DEVICE

(75) Inventors: Gen Kasai, Kanagawa (JP); Koji Furumi, Kanagawa (JP)

(73) Assignee: Sony Corporation (JP)

( * ) Notice: Subject to any disclaimer, the term of this patent is extended or adjusted under 35 U.S.C. 154(b) by 4 days.

(21) Appl. No.: 10/104,024

(22) Filed: Mar. 25, 2002

(65) Prior Publication Data

US 2002/0159312 A1 Oct. 31, 2002

(30) Foreign Application Priority Data

| Mar. 27, 2001 | (JP) | P2001-090755 |
| Mar. 28, 2001 | (JP) | P2001-092954 |
| Aug. 7, 2001 | (JP) | P2001-239176 |
| Feb. 22, 2002 | (JP) | P2002-046046 |

(51) Int. Cl.[7] ............................................. G11C 11/00
(52) U.S. Cl. ..................... 365/154; 365/156; 365/189.11
(58) Field of Search ................................. 365/154, 156, 365/189.11

(56) References Cited

U.S. PATENT DOCUMENTS

| 5,070,482 A | * | 12/1991 | Miyaji .......................... 365/154 |
| 5,881,010 A | * | 3/1999 | Artieri .......................... 365/156 |
| 6,552,923 B2 | * | 4/2003 | Houston ....................... 365/154 |
| 2001/0000308 A1 | * | 4/2001 | Marr .......................... 365/154 |

* cited by examiner

Primary Examiner—Huan Hoang
(74) Attorney, Agent, or Firm—Rader, Fishman & Grauer PLLC; Ronald P. Kananen

(57) ABSTRACT

A semiconductor memory device includes a smaller number of elements. A method for reading stored data within the semiconductor memory device suppresses the reduction in the static noise margin accompanying a voltage drop of a power supply voltage, and improves the degree of integration of the circuit.

43 Claims, 26 Drawing Sheets

FIG.22

| MC1 | MC1 |  | MC1 |
|---|---|---|---|
| MC2 | MC2 |  | MC2 |
| MC1 | MC1 |  | MC1 |
| MC2 | MC2 |  | MC2 |
|  |  |  |  |
| MC1 | MC1 |  | MC1 |
| MC2 | MC2 |  | MC2 |

METHOD OF READING STORED DATA AND SEMICONDUCTOR MEMORY DEVICE

BACKGROUND OF THE INVENTION

1. Field of the Invention

The present invention relates to a method of reading stored data and a semiconductor memory device, more particularly relates to a method of reading data stored in a semiconductor memory device including a static type random access memory (RAM) and such a semiconductor memory device and to a semiconductor memory device including a static type content addressable memory (CAM).

2. Description of the Related Art

First, an explanation will be made of a static RAM (SRAM) and a CAM having a SRAM type memory circuit.

(SRAM)

SRAMs enable high speed read and write operations and, at the same time, eliminate the need for a refresh operation of the stored data as with a dynamic RAM (DRAM) and enable streamlining of peripheral circuits. Due to these advantages, they are being widely used as cache memories, memories of portable terminals, and other relatively small capacity memory devices for which high speed operation and streamlining are required.

As basic configurations of a memory cell of an SRAM (hereinafter referred to as an "SRAM cell"), a six-transistor type SRAM cell using six transistors and a four-transistor type SRAM cell omitting the load transistors of this six-transistor type SRAM cell are generally known.

First, an explanation will be made of the six-transistor type SRAM cell.

FIG. 23 is a circuit diagram of a six-transistor type SRAM cell. The SRAM cell shown in FIG. 23 has an n-type MOS transistor Qn1a to n-type MOS transistor Qn1d and a p-type MOS transistor Qp1a and p-type MOS transistor Qp1b.

Drains of the p-type MOS transistor Qp1a and the n-type MOS transistor Qn1c are connected to a node N1a, while their gates are connected to a node N1b. Also, a source of the p-type MOS transistor Qp1a is connected to a power supply voltage Vcc, while the source of the n-type MOS transistor Qn1c is connected to a reference potential. These p-type MOS transistor Qp1a and n-type MOS transistor Qn1c form one CMOS inverter using the node N1b as an input and using the node N1a as an output.

The drains of the p-type MOS transistor Qp1b and the n-type MOS transistor Qn1d are connected to the node N1b, while their gates are connected to the node N1a. Also, the source of the p-type MOS transistor Qp1b is connected to the power supply voltage Vcc, while the source of the n-type MOS transistor Qn1d is connected to the reference potential. These p-type MOS transistor Qp1b and n-type MOS transistor Qn1d form one CMOS inverter using the node N1a as an input and using the node N1b as an output.

The inputs and outputs of the CMOS inverter comprised by the p-type MOS transistor Qp1a and the n-type MOS transistor Qn1c and the CMOS inverter comprised by the p-type MOS transistor Qp1b and the n-type MOS transistor Qn1d are connected to each other in the form of a ring, whereby one memory circuit is comprised.

The gate of the n-type MOS transistor Qn1a is connected to a word line WORD, its drain is connected to a bit line BIT, and its source is connected to the node N1a.

The gate of the n-type MOS transistor Qn1b is connected to the word line WORD, its drain is connected to an inverted bit line BITB, and its source is connected to the node N1b.

Next, an explanation will be made of the read operation and the write operation of a six-transistor type SRAM cell having the above configuration.

The stored data of the SRAM cell is stored in the memory circuit by the CMOS inverter in either of a state where the node N1a is at high level and the node N1b is at the low level or a state where the node N1a is at the low level and the node N1b is at the high level. During a period where this stored data is held, the word line WORD is set at the low level, and the n-type MOS transistor Qn1a and the n-type MOS transistor Qn1b are brought to a cutoff state. By this, the memory circuit and the bit line are separated, so the stored data is held.

When reading the stored data of the SRAM cell, the bit line BIT and the inverted bit line BITB are pulled up to the power supply voltage Vcc in advance by a not illustrated pullup circuit. The word line WORD is set to a high level in this state. By this, the n-type MOS transistor Qn1a and the n-type MOS transistor Qn1b become conductive, and the voltage of the bit line BIT or the inverted bit line BITB changes in accordance with the stored data.

For example, when the node N1a is at the high level and the node N1b is at the low level, since the bit line BIT and the node N1a have almost equal voltages, no current flows through the n-type MOS transistor Qn1a and the potential of the bit line BIT remains at the power supply voltage Vcc as it is and does not change, but the inverted bit line BITB has a high voltage in comparison with the node N1b, so the current flows from the inverted bit line BITB to the node N1b and the potential of the inverted bit line BITB falls. The potential difference (or current difference) between these bit line BIT and inverted bit line BITB is amplified by a not illustrated differential amplifier circuit and output to a data line.

When writing the stored data of the SRAM cell, the word line WORD is set at the high level in a state where either of the bit line BIT or the inverted bit line is pulled down to the reference potential and the other is pulled up to the power supply voltage Vcc in accordance with the data to be written. By this, the node N1a and the node N1b are set to potentials in accordance with the write data.

Next, an explanation will be made of a four-transistor type SRAM cell.

FIG. 24 is a circuit diagram of a four-transistor type SRAM cell. The SRAM cell shown in FIG. 24 has an n-type MOS transistor Qn2a, n-type MOS transistor Qn2b, p-type MOS transistor Qp2a, and p-type MOS transistor Qp2b.

The drain of the n-type MOS transistor Qn2a is connected to a node N2a, its gate is connected to a node N2b, and its source is connected to the reference potential.

The drain of the n-type MOS transistor Qn2b is connected to a node N2b, its gate is connected to a node N2a, and its source is connected to the reference potential.

The gate of the p-type MOS transistor Qp2a is connected to a word line WORDB, its source is connected to the bit line BIT, and its drain is connected to the node N2a.

The gate of the p-type MOS transistor Qp2b is connected to the word line WORDB, its source is connected to the bit line BITB, and its drain is connected to the node N2b.

The inputs and outputs of the inverter by the n-type MOS transistor Qn2a and the inverter by the n-type MOS transistor Qn2b are connected to each other in the form of a ring, whereby one memory circuit is comprised. Also, the size of transistors is set so that a leakage current in the off state of the p-type MOS transistor Qp2a and the p-type MOS transistor Qp2b becomes larger than the leakage current of the n-type MOS transistor Qn2a and the n-type MOS transistor Qn2*b*, charges are supplied from the bit line BIT and the inverted bit line BITB which are pulled up to the power supply voltage Vcc to the node N2*a* and the node N2*b* by this, and the stored data of the memory circuit is held constant.

Next, an explanation will be made of a read operation and write operation of a four-transistor type SRAM cell having the above configuration.

The stored data of the SRAM cell is stored in the memory circuit of the two transistors mentioned above in either of the state where the node N2*a* is at the high level and the node N2*b* is at the low level or the state where the node N2*a* is at the low level and the node N2*b* is at the high level. During the period where this stored data is held, the word line WORDB is set at the high level and the p-type MOS transistor Qp2*a* and the p-type MOS transistor Qp2*b* are brought to a cutoff state and, at the same time, the bit line BIT and the inverted bit line BITB are pulled up to the power supply voltage Vcc. As mentioned above, charges are supplied to the node N2*a* and the node N2*b* by the leakage current of the p-type MOS transistor Qp2*a* and the p-type MOS transistor Qp2*b*, so the stored data of the memory circuits of two transistors is held constant.

When reading the stored data of the SRAM cell, the word line WORDB is set at the low level, the p-type MOS transistor Qp2*a* and the p-type MOS transistor Qp2*b* become conductive, and the voltage of the bit line BIT or the inverted bit line BITB changes in accordance with the stored data.

For example, when the node N2*a* is at the high level and the node N2*b* is at the low level, since the bit line BIT and the node N2*a* have almost equal voltages, no current flows through the n-type MOS transistor Qn2*a* and the potential of the bit line BIT remains at the power supply voltage Vcc as it is and does not change, but the inverted bit line BITB has a high voltage in comparison with the node N2*b*, so the current flows from the inverted bit line BITB to the node N2*b* and the potential of the inverted bit line BITB falls. The potential difference (or current difference) between these bit line BIT and inverted bit line BITB is amplified by a not illustrated differential amplifier circuit and output to the data line.

When writing the stored data of the SRAM cell, the word line WORDB is set at the low level in a state where either of the bit line BIT or the inverted bit line BITB is pulled down to the reference potential and the other is pulled up to the power supply voltage Vcc in accordance with the data to be written. By this, the node N2*a* and the node N2*b* are set to potentials in accordance with the write data to be written.

CAM

Next, an explanation will be made of a CAM.

As a memory having a function capable of processing for search of data at a high speed, an associative memory has been known. An associative memory is also referred to as a content addressable memory (CAM) and has a search function for searching for data from the inside of the memory matching with data input from the outside and outputting the address thereof in addition to the memory functions provided in an usual RAM such as the writing and reading of data.

A CAM enables data for search to be searched for from among all stored data by only a few clocks. Since the search speed is extremely high in comparison with software, CAMs are utilized for various processing for performing high speed data search. CAMs are utilized in a variety of fields, for example, for applications for searching for an IP address cached in the memory in a router, for a translation lookaside buffer (TLB) for converting an address from a virtual address in a virtual memory system to a physical address, for an artificial intelligence machine for pattern recognition of faces, fingerprints, etc., and for compression and decompression of image data.

A CAM has a group of memory cells arranged in a matrix (CAM cell array). Each memory cell thereof has a logical circuit (for example, exclusive OR circuit) for judging a match or mismatch of the search data and the memory data in addition to SRAM type and DRAM type memory circuits.

Also, there are two types of CAMs: a binary CAM storing binary data of a logical value "1" or a logical value "0" in its memory cell and a ternary CAM storing ternary data of the logical value "1", logical value "0", or logical value "x" (don't care). The logical value "x" in the ternary CAM is a value by which the data are always judged to match at the time of search of data.

Below, an explanation will be made of a binary CAM and ternary CAM having SRAM type memory circuits by referring to FIG. 25 to FIG. 27.

FIG. 25 is a circuit diagram of an example of the configuration of a binary CAM cell having an SRAM type memory circuit.

In FIG. 25, the notation Qp1 and notation Qp3 designate p-type MOS transistors, while the notation Qn2 and notation Qn4 to notation Qn9 designate n-type MOS transistors.

In the p-type MOS transistor Qp1 and the n-type MOS transistor Qn2, the drain and source terminals are connected in series between the power supply voltage Vcc and the reference potential with a storage node N1 as the midpoint of connection. Also, both gates are connected to a storage node N2.

In the p-type MOS transistor Qp3 and the n-type MOS transistor Qn4, the drain and source terminals are connected in series between the power supply voltage Vcc and the reference potential with the storage node N2 as the midpoint of connection. Also, both gates are connected to the storage node N1.

In the n-type MOS transistor Qn5, the source and drain terminals are connected between a bit line BL and the storage node N1, and the gate is connected to the word line WL.

In the n-type MOS transistor Qn6, the source and drain terminals are connected between a bit line/BL and the storage node N2, and the gate is connected to the word line WL.

In the n-type MOS transistor Qn7 and the n-type MOS transistor Qn8, the source and drain terminals are connected in series with a node N3 as the midpoint of connection. Also, the gate of the n-type MOS transistor Qn7 is connected to the storage node N2, while the gate of the n-type MOS transistor Qn8 is connected to the storage node N1.

In the n-type MOS transistor Qn9, the gate is connected to the node N3, and the source and drain terminals are connected between a mismatch detection line ML and the reference potential.

Next, an explanation will be made of the operation of the binary CAM cell of FIG. 25 having the above configuration.

The p-type MOS transistor Qp1 and the n-type MOS transistor Qn2 connected in series between the power supply voltage Vcc and the reference potential form one CMOS inverter using the storage node N2 as the input and using the storage node N1 as the output. Similarly, the p-type MOS transistor Qp3 and the n-type MOS transistor Qn4 form one CMOS inverter using the storage node N1 as the input and using the storage node N2 as the output. The stored data of the memory cell is stored in a circuit obtained by connecting these two CMOS inverters in the form of a ring, in either of a state where the storage node N1 is at the high level and the storage node N2 is at the low level or a state where the storage node N1 is at the low level and the storage node N2 is at the high level.

The n-type MOS transistor Qn5 and the n-type MOS transistor Qn6 are transistors for controlling access from the bit line BL and bit line/BL to the storage nodes. While holding the stored data, the word line WL is set at the low level, the storage nodes and the bit line become separated, and the stored data is held constant in this state.

When the stored data of the CAM cell is read out, the bit line BL and the bit line/BL are pulled up to the power supply voltage Vcc in advance by a not illustrated pullup circuit, and the word line WL is set to the high level in this state. By this, the n-type MOS transistor Qn5 and the n-type MOS transistor Qn6 become on, and the voltages of the bit line BL and the bit line/BL fluctuate in accordance with the stored data.

For example, when the storage node N1 is at the high level and the storage node N2 is at the low level, the bit line BL and the storage node N1 have almost equal voltages, so no current flows through the n-type MOS transistor Qn5 and the potential of the bit line BL remains at the power supply voltage Vcc as it is and does not change, but the bit line/BL has a high voltage in comparison with the storage node N2, so current flows from the bit line/BL to the storage node N2 and the potential of the bit line/BL falls. The potential difference (or current difference) of these bit line BL and bit line/BL is amplified by a not illustrated differential amplifier circuit and output to the data line.

When the stored data is written into the CAM cell, the word line WL is set at the high level in a state where either of the bit line BL or the bit line/BL is pulled down to the reference potential and the other is pulled up to the power supply voltage Vcc in accordance with the data to be written. By this, the n-type MOS transistor Qn5 and the n-type MOS transistor Qn6 become on, and the level of the storage node N1 and the storage node N2 is set to the level in accordance with the write data.

When searching for match between the stored data of the CAM cell and the search data, in the holding state of the stored data where the word line WL is set at the low level, either of the bit line BL or the bit line /BL is pulled down to the reference potential in accordance with the value of the search data, and the other is pulled up to the power supply voltage Vcc. Also, the mismatch detection line ML is pulled up to the power supply voltage Vcc by a not illustrated voltage supply circuit.

Here, the match search operation of this binary CAM cell will be explained by concretely showing the search data and the stored data. In the following explanation, assume that the bit line BL is set at the high level and the bit line /BL is set at the low-level when the search data has the logical value "1" and that the inverse levels thereto are set in these bit lines when the search data has the logical value "0". Also, assume that the storage node N1 becomes the high level and the storage node N2 becomes the low level when the stored data of the CAM cell has the logical value "1" and that levels inverse to those are held in the storage nodes when the stored data has the logical value "0".

For example, when the search data input from the bit line has the logical value "1" and the stored data has the logical value "0", the storage node N1 becomes the low level, so the n-type MOS transistor Qn8 becomes off and the storage node N2 becomes the high level, therefore the n-type MOS transistor Qn7 becomes on. Accordingly, a positive charge is supplied from the bit line BL to the node N3 via the n-type MOS transistor Qn7 to charge it to the high level, so the n-type MOS transistor Qn9 becomes on and the mismatch detection line ML becomes the low level.

When the search data has the logical value "0" and the stored data has the logical value "1", the n-type MOS transistor Qn7 becomes off and the n-type MOS transistor Qn8 becomes on, and the mismatch detection line ML similarly becomes the low level.

When both of the search data and the stored data have the logical value "1", the storage node N2 becomes the low level, so the n-type MOS transistor Qn7 becomes off and the storage node N1 becomes the high level, therefore the n-type MOS transistor Qn8 becomes on. At this time, since the bit line /BL is at the low level, the node N3 becomes the low level, the n-type MOS transistor Qn9 becomes off, and the mismatch detection line ML becomes the high level.

When both of the search data and the stored data have the logical value "0", the n-type MOS transistor Qn7 becomes on and the n-type MOS transistor Qn8 becomes off. At this time, the bit line BL is at the low level, so the node N3 becomes the low level and the mismatch detection line ML similarly becomes the high level.

In this way, the mismatch detection line ML becomes the low level when the stored data and the search data do not match, while it becomes the high level when the stored data and the search data match. Also, one type of NOR circuit is formed by a common mismatch detection line ML and n-type MOS transistors Qn9 of a plurality of CAM cells connected in parallel to this. If there is even one CAM cell wherein the stored data and the search data do not match in these plurality of CAM cells, the common mismatch detection line ML becomes the low level. Accordingly, by only searching for a high level mismatch detection line ML from among all mismatch detection lines ML of the CAM cell array, the address of the stored data matching with the search data can be searched for from among all stored data.

This completes the explanation of operation of the binary CAM cell shown in FIG. 25.

FIG. 26 is a circuit diagram of an example of another configuration of a binary CAM cell having the SRAM type memory circuit. The difference from the binary CAM cell shown in FIG. 25 lies in the logical circuit portion for outputting the match search result.

In FIG. 26, notation Qp10 and notation Qp12 designate p-type MOS transistors, notation Qn11 and notation Qn13 to notation Qn18 designate n-type MOS transistors, notation WL designates the word line, notation BL and notation/BL designate a pair of bit lines, and notation ML designates the mismatch detection line.

In the p-type MOS transistor Qp10 and the n-type MOS transistor Qn11, the drain and source terminals are connected in series between the power supply voltage Vcc and the reference potential with a storage node N4 as the midpoint of connection. Also, both of their gates are connected to a storage node N5.

In the p-type MOS transistor Qp12 and the n-type MOS transistor Qn13, the drain and source terminals are connected in series between the power supply voltage Vcc and the reference potential with the storage node N5 as the midpoint of connection. Also, both of their gates are connected to the storage node N4.

In the n-type MOS transistor Qn14, the source and drain terminals are connected between the bit line BL and the storage node N4, while the gate is connected to the word line WL.

In the n-type MOS transistor Qn15, the source and drain terminals are connected between the bit line /BL and the storage node N5, while the gate is connected to the word line WL.

In the n-type MOS transistor Qn16 and the n-type MOS transistor Qn17, the source and drain terminals are connected in series between the bit line BL and the bit line /BL with a node N6 as the midpoint of connection. Also, the gate of the n-type MOS transistor Qn16 is connected to the storage node N4, while the gate of the n-type MOS transistor Qn17 is connected to the storage node N5.

In the n-type MOS transistor Qn18, the gate is connected to the node N6, and the source and drain terminals are inserted in series on the mismatch detection line ML.

Next, an explanation will be made of the operation of the binary CAM cell of FIG. 26 having the above configuration.

In the same way as the binary CAM cell of FIG. 25, the p-type MOS transistor Qp10 and n-type MOS transistor Qn11 form one CMOS inverter, the p-type MOS transistor Qp12 and n-type MOS transistor Qn13 form one CMOS inverter, and the stored data is held in a circuit obtained by connecting these inverters in the form of a ring. The n-type MOS transistor Qn14 and the n-type MOS transistor Qn15 are transistors for controlling access from the bit line BL and the bit line /BL to the storage nodes. The read operation and the write operation of the stored data with respect to the storage nodes are similar to those of the binary CAM cell of FIG. 25 mentioned above, so the explanation of these operations will be omitted. Below, an explanation will be made of the mismatch search operation.

Note that, in this explanation, assume that the bit line BL is set at the high level and the bit line /BL is set at the low level when the search data has the logical value "1" and that levels inverse to those are set in the bit lines when the search data has the logical value "0". Also, assume that the storage node N4 becomes the high level and the storage node N5 becomes the low level when the stored data of the CAM cell has the logical value "1" and that levels inverse to those are held in the storage nodes when the stored data has the logical value "0".

When performing a match search between the stored data of the CAM cell and the search data, in the holding state of the stored data where the word line WL is set at the low level, either of the bit line BL or the bit line /BL is pulled down to the reference potential in accordance with the value of the search data, and the other is pulled up to the power supply voltage Vcc. Also, a constant current is supplied to the mismatch detection line ML by a not illustrated current supply circuit.

For example, when the search data input from the bit line has the logical value "1" and the stored data has the logical value "0", the storage node N4 is at the low level, so the n-type MOS transistor Qn16 becomes off and the storage node N5 is at the high level, therefore the n-type MOS transistor Qn17 becomes on. Accordingly, the node N6 is connected to the bit line /BL of low level via the n-type MOS transistor Qn17, so the n-type MOS transistor Qn18 becomes off and the current flowing through the mismatch detection line ML is cut off.

When the search data has the logical value "0" and the stored data has the logical value "1", the n-type MOS transistor Qn16 becomes on, the n-type MOS transistor Qn17 becomes off, and the node N6 is connected to the bit line BL of low level via the n-type MOS transistor Qn16, so the n-type MOS transistor Qn18 becomes off and the current flowing through the mismatch detection line ML is cut off.

When both of the search data and the stored data have the logical value "1", the storage node N4 becomes the high level, so the n-type MOS transistor Qn16 becomes on and the storage node N5 becomes the low level, therefore the n-type MOS transistor Qn17 becomes off. At this time, the bit line BL is at the high level, so the node N6 becomes the high level, the n-type MOS transistor Qn18 becomes on, and the current of the mismatch detection line ML is not cut off.

When both of the search data and the stored data have the logical value "0", the n-type MOS transistor Qn17 becomes on and the n-type MOS transistor Qn16 becomes off. At this time, the bit line /BL is at the high level, so the node N6 becomes the high level and the current of the mismatch detection line ML is not cut off.

In this way, the current of the mismatch detection line ML is cut off when the stored data and the search data do not match, while it is not cut off when the stored data and the search data match. Also, one type of NAND circuit is formed by the common mismatch detection line ML and n-type MOS transistors Qn18 of a plurality of CAM cells inserted in series on this. If there is even one CAM cell wherein the stored data and the search data do not match in these plurality of CAM cells, the current of the common mismatch detection line ML is cut off. Accordingly, by only searching for a mismatch detection line ML wherein the current is not cut off from among all mismatch detection lines ML of the CAM cell array, the address of the stored data matching with the search data can be searched for from among all stored data.

This concludes the explanation of the operation of the binary CAM cell shown in FIG. 26.

Next, an explanation will be made of a ternary CAM cell.

FIG. 27 is a circuit diagram of an example of the configuration of a ternary CAM cell having an SRAM type memory circuit.

In FIG. 27, notation Qp19, notation Qp21, notation Qp25, and notation Qp27 designate p-type MOS transistors, notation Qn20, notation Qn22 to notation Qn24, notation Qn26, and notation Qn28 to notation Qn34 designate n-type MOS transistors, notation WLa and notation WLb designate word lines, notation BL and notation/BL designate a pair of bit lines, notation SD and notation/SD designate a pair of search data lines, and notation ML designates the mismatch detection line.

In the p-type MOS transistor Qp19 and the n-type MOS transistor Qn20, the drain and source terminals are connected in series between the power supply voltage Vcc and the reference potential with a storage node N7 as the midpoint of connection. Also, both gates are connected to a storage node N8.

In the p-type MOS transistor Qp21 and the n-type MOS transistor Qn22, the drain and source terminals are connected in series between the power supply voltage Vcc and the reference potential with the storage node N8 as the midpoint of connection. Also, both gates are connected to the storage node N7.

In the n-type MOS transistor Qn23, the source and drain terminals are connected between the bit line BL and the storage node N7, and the gate is connected to the word line WLa.

In the n-type MOS transistor Qn24, the source and drain terminals are connected between a bit line /BL and the storage node N8, and the gate is connected to the word line WLa.

In the p-type MOS transistor Qp25 and the n-type MOS transistor Qn26, the drain and source terminals are connected in series between the power supply voltage Vcc and the reference potential with a storage node N9 as the midpoint of connection. Also, both gates are connected to a storage node N10.

In the p-type MOS transistor Qp27 and the n-type MOS transistor Qn28, the drain and source terminals are connected in series between the power supply voltage Vcc and the reference potential with the storage node N10 as the midpoint of connection. Also, both gates are connected to the storage node N9.

In the n-type MOS transistor Qn29, the source and drain terminals are connected between the bit line BL and the storage node N9, and the gate is connected to the word line WLb.

In the n-type MOS transistor Qn30, the source and drain terminals are connected between a bit line /BL and the storage node N10, and the gate is connected to the word line WLb.

In the n-type MOS transistor Qn31 and the n-type MOS transistor Qn33, the source and drain terminals are connected in series between the mismatch detection line ML and the reference potential with a node N11 as the midpoint of the connection. The gate of the n-type MOS transistor Qn31 is connected to the storage node N8, and the gate of the n-type MOS transistor Qn33 is connected to the search data line SD.

In the n-type MOS transistor Qn32 and the n-type MOS transistor Qn34, the source and drain terminals are connected in series between the mismatch detection line ML and the reference potential with a node N12 as the midpoint of the connection. The gate of the n-type MOS transistor Qn32 is connected to the storage node N9, while the gate of the n-type MOS transistor Qn34 is connected to the search data line /SD.

Next, an explanation will be made of the ternary CAM cell of FIG. 27 having the above configuration.

The ternary CAM cell shown in FIG. 27 has two memory circuits of the above six-transistor type SRAM cells. Three values are distinguished by the combination of the data having the logical value "1" or the logical value "0" stored in these two memory circuits.

Namely, a first memory circuit is formed by the p-type MOS transistor Qp19, n-type MOS transistor Qn20, p-type MOS transistor Qp21, n-type MOS transistor Qn22, n-type MOS transistor Qn23, and n-type MOS transistor Qn24. The access from a pair of bit lines to the storage node N7 and the storage node N8 is controlled by the n-type MOS transistor Qn23 and the n-type MOS transistor Qn24 becoming on or off in accordance with the level of the word line WLa. Also, a second memory circuit is formed by the p-type MOS transistor Qp25, n-type MOS transistor Qn26, p-type MOS transistor Qp27, n-type MOS transistor Qn28, n-type MOS transistor Qn29, and n-type MOS transistor Qn30. The access from a pair of bit lines to the storage node N9 and the storage node N10 is controlled by the n-type MOS transistor Qn29 and the n-type MOS transistor Qn30 becoming on or off in accordance with the level of the word line WLb.

The read and write operations of the data with respect to these first memory circuit and second memory circuit are similar to those of the memory circuit of the binary CAM cell mentioned above, so the explanation of these operations will be omitted. Below, an explanation will be made of the match search operation in a ternary CAM cell.

Note that, in the following concrete example, assume that the search data line SD is set at the high level and the search data line /SD is set at the low level when the search data has the logical value "1" and that the levels inverse to those are set in the bit lines when the search data has the logical value "0". Also, assume that the storage node N7 and the storage node N9 become the high level and the storage node N8 and the storage node N10 become the low level when the stored data of the ternary CAM cell has the logical value "1", the storage nodes become levels inverse to those when the stored data has the logical value "0", and the storage node N8 and the storage node N9 become the low level and the storage node N7 and the storage node N10 become the high level in the case of the logical value "x".

When carrying out a match search between the stored data of the CAM cell and the search data, in a state where the word line WLa and the word line WLb are deactivated to the low level, either of the search data line SD or search data line /SD is pulled down to the reference potential in accordance with the value of the search data, and the other is pulled up to the power supply voltage Vcc. Also, the mismatch detection line ML has been pulled up to the power supply voltage Vcc by a not illustrated voltage supply circuit.

For example, when the search data has the logical value "1" and the stored data has the logical value "0", the storage node N8 becomes the high level and the n-type MOS transistor Qn31 becomes on and the storage node N9 becomes the low level and the n-type MOS transistor Qn32 becomes off. Also, the n-type MOS transistor Qn33 becomes on since the search data line SD is at the high level, and the n-type MOS transistor Qn34 becomes off since the search data line /SD is at the low level. Accordingly, the serial circuit of the n-type MOS transistor Qn31 and the n-type MOS transistor Qn33 becomes on and the mismatch detection line ML becomes the low level.

When the search data has the logical value "0" and the stored data has the logical value "1", the serial circuit of the n-type MOS transistor Qn32 and the n-type MOS transistor Qn34 becomes on and the mismatch detection line ML similarly becomes the low level.

When both of the search data and stored data have the logical value "1", the n-type MOS transistor Qn31 and the n-type MOS transistor Qn34 become off, so the mismatch detection line ML is held at the high level.

When both of the search data and stored data have the logical value "0", both of the n-type MOS transistor Qn32 and the n-type MOS transistor Qn33 become off, so the mismatch detection line ML is similarly held at the high level.

Also, when the stored data of the ternary CAM cell has the logical value "x", both of the storage node N8 and the storage node N9 become the low level, and both of the n-type MOS transistor Qn31 and n-type MOS transistor Qn32 become off. Accordingly, the mismatch detection line ML is held at the high level irrespective of the value of the search data.

In this way, the mismatch detection line ML becomes the low level when the stored data and the search data do not match, while it is held at the high level when the stored data and the search data match. Also, one type of NOR circuit is formed by the common mismatch detection line ML and n-type MOS transistor Qn31 to n-type MOS transistor Qn34 of a plurality of CAM cells connected in parallel to this. If there is even one CAM cell wherein the stored data and the search data do not match among these plurality of CAM cells, the common mismatch detection line ML becomes the low level. Accordingly, by judging the level of the mismatch detection line ML for every address corresponding to each word line, the address of the stored data matching with the search data can be searched for.

Further, when the logical value "x" is stored in the ternary CAM cell, irrespective of the value of the search data, the mismatch detection line ML is set at the high level, and it is judged that the search data and the stored data match.

This completes the explanation of the operation of the ternary CAM cell shown in FIG. 27.

Summarizing the disadvantages, when comparing the static noise margin (SNM) of SRAM cells, a four-transistor type SRAM cell, SNM tends to be smaller in SNM than a six-transistor type SRAM cell within the range of a low power supply voltage. When the SNM becomes small, the probability of destruction of the stored data of the memory cell due to noise rises, so there is the disadvantage of a degradation of the quality as a memory.

Accordingly, where the power supply voltage falls, the six-transistor type SRAM cell is frequently used, and therefore there are disadvantages such that the number of elements increases and a degree of integration falls, and the cost rises.

Also, a memory circuit comprised by the p-type MOS transistor Qp1, p-type MOS transistor Qp3, and the n-type MOS transistor Qn2 to n-type MOS transistor Qn6 in the CAM of FIG. 25 and similar memory circuits of FIG. 26 and FIG. 27 have configurations equal to that of a six-transistor type SRAM cell. In the binary CAM cell mentioned above, three further logical circuits are added to this six-transistor type SRAM cell, so 16 transistors become necessary as a whole in the ternary CAM cell. In this way, the CAM needs a larger number of elements in comparison with the usual RAM, so there is the disadvantage of a low degree of integration. Accordingly, it has been demanded that the number of elements in the CAM cell be decreased as much as possible and the degree of integration be improved.

SUMMARY OF THE INVENTION

A first object of the present invention is to provide a method of reading stored data in a semiconductor memory device capable of suppressing a fall of the SNM of a memory cell accompanying a fall of the voltage of the power supply, and a semiconductor memory device using the same method.

A second object is to provide a semiconductor memory device which can be comprised by a smaller number of elements in comparison with the related art.

To attain the above object, according to a first aspect of the present invention, there is provided a method of reading stored data of a semiconductor memory device which has a first storage node and a second storage node, a first transistor having a control terminal connected to the first storage node and having a pair of input/output terminals connected between the second storage node and a reference potential, a second transistor having a control terminal connected to the second storage node and having a pair of input/output terminals connected between the first storage node and the reference potential, a third transistor having a pair of input/output terminals connected between the first storage node and a first bit line and having a control terminal connected to a word line, and a fourth transistor having a pair of input/output terminals connected between the second storage node and a second bit line and having a control terminal connected to the word line, comprising the steps of applying a first voltage to the first bit line and the second bit line in a period for holding the stored data, and activating the word line and applying a second voltage higher than the first voltage to the first bit line and the second bit line at the time of reading the stored data.

According to the method of reading stored data in the first aspect of the present invention, in the period for holding the stored data, the first voltage is applied to the first bit line and the second bit line. At the time of reading the stored data, the word line is activated, and a second voltage higher than the first voltage is applied to the first bit line and the second bit line.

According to a second aspect of the present invention, there is provided a method of reading stored data of a semiconductor memory device having a plurality of memory cells arranged in a matrix, a plurality of word lines connected to memory cells of the same row of the matrix, and a plurality of first bit lines and second bit lines connected to memory cells of the same column of the matrix, wherein the memory cell has a first storage node and a second storage node, a first transistor having a control terminal connected to the first storage node and having a pair of input/output terminals connected between the second storage node and a reference potential, a second transistor having a control terminal connected to the second storage node and having a pair of input/output terminals connected between the first storage node and the reference potential, a third transistor having a pair of input/output terminals connected between the first storage node and a first bit line and having a control terminal connected to a word line, and a fourth transistor having a pair of input/output terminals connected between the second storage node and a second bit line and having a control terminal connected to the word line, comprising the steps of applying a first voltage to the first bit line and the second bit line in the period for holding the stored data and activating at least one of the plurality of word lines and applying a second voltage higher than the first voltage to the first bit line and the second bit line at the time of reading the stored data.

According to a third aspect of the present invention, there is provided a semiconductor memory device comprising a first storage node and a second storage node, a first transistor having a control terminal connected to the first storage node and having a pair of input/output terminals connected between the second storage node and a reference potential, a second transistor having a control terminal connected to the second storage node and having a pair of input/output terminals connected between the first storage node and the reference potential, a third transistor having a pair of input/output terminals connected between the first storage node and a first bit line and having a control terminal connected to a word line, a fourth transistor having a pair of input/output terminals connected between the second storage node and a second bit line and having a control terminal connected to the word line, and a control circuit for applying a first voltage to the first bit line and the second bit line in the period for holding the stored data and activating the word line and applying a second voltage higher than the first voltage to the first bit line and the second bit line at the time of reading the stored data.

According to the semiconductor memory device in the third aspect of the present invention, one memory circuit is comprised by the first transistor and the second transistor, and conduction between the first storage node of this memory circuit and the first bit line and conduction between the second storage node and the second bit line are controlled in accordance with an active/inactive state of the word line connected to the control terminals of the third transistor and the fourth transistor.

During the period for holding the stored data, the first voltage is applied to the first bit line and the second bit line by the control circuit.

At the time of reading the stored data, the word line is activated by the control circuit and, at the same time, a second voltage higher than the first voltage is applied to the first bit line and the second bit line by the control circuit. The stored data held in the first storage node and the second storage node are output via the third transistor and the fourth transistor to the first bit line and the second bit line.

According to a fourth aspect of the present invention, there is provided a semiconductor memory device comprising a plurality of memory cells arranged in a matrix, a plurality of word lines connected to memory cells of the same row of the matrix, a plurality of first bit lines and second bit lines connected to memory cells of the same column of the matrix, and a control circuit for applying a first voltage to the first bit line and the second bit line in a period for holding the stored data and activating at least one of the plurality of word lines and applying a second voltage higher than the first voltage to the first bit line and the second bit line at the time of reading the stored data, wherein the memory cell has a first storage node and a second storage node, a first transistor having a control terminal connected to the first storage node and having a pair of input/output terminals connected between the second storage node and a reference potential, a second transistor having a control terminal connected to the second storage node and having a pair of input/output terminals connected between the first storage node and the reference potential, a third transistor having a pair of input/output terminals connected between the first storage node and the first bit line and having a control terminal connected to the word line, and a fourth transistor having a pair of input/output terminals connected between the second storage node and the second bit line and having a control terminal connected to the word line.

According to a fifth aspect of the present invention, there is provided a semiconductor memory device comprising a first storage node and a second storage node, a first transistor having a control terminal connected to the first storage node and having a pair of input/output terminals connected between the second storage node and a reference potential, a second transistor having a control terminal connected to the second storage node and having a pair of input/output terminals connected between the first storage node and the reference potential, a third transistor for controlling access with respect to the first storage node, a fourth transistor for controlling access with respect to the second storage node, a mismatch judgement circuit for judging a mismatch between the stored data in accordance with levels of the first storage node and the second storage node and the input search data, and a control circuit for setting the third transistor and the fourth transistor in a nonconductive state and applying a stored data holding voltage to the first storage node and the second storage node via the third transistor or the fourth transistor in a period of holding the stored data.

Preferably, the third transistor and the fourth transistor have a leakage current between input/output terminals larger in comparison with that of the first transistor and the second transistor.

According to the semiconductor memory device in the fifth aspect of the present invention, one memory circuit is formed by the first transistor, the second transistor, the third transistor, and the fourth transistor. In the period where the stored data of this memory circuit is held, the third transistor and the fourth transistor are set in the nonconductive state by the control circuit and, at the same time, a stored data holding voltage is applied to the first storage node and the second storage node via the third transistor or the fourth transistor. The leakage current of the third transistor and the fourth transistor is larger in comparison with that in the first transistor and the second transistor, so the stored data in accordance with the levels of the first storage node and the second storage node are held constant by this. The mismatch between the stored data held constant and the input search data is judged at the mismatch judgement circuit.

It is also possible if the control circuit sets the third transistor and the fourth transistor in the conductive state in the reading period of the stored data and, at the same time, apply a read voltage higher than the stored data holding voltage to the first storage node and the second storage node via the third transistor or the fourth transistor. By this, the static noise margin at the time of reading the stored data can be made larger.

According to a sixth aspect of the present invention, there is provided a semiconductor memory device comprising a plurality of memory cells arranged in a matrix, a plurality of word lines connected to memory cells of the same row of the matrix, a plurality of mismatch detection lines connected to memory cells of the same row of the matrix, a plurality of first bit lines and second bit lines connected to memory cells of the same column of the matrix, and a control circuit for deactivating the word line and applying a stored data holding voltage to the first bit line and the second bit line in a period for holding the stored data of the memory cell, while deactivating the word line and applying voltage in accordance with input search data to the first bit line and the second bit line in a period for detecting mismatch between the search data and the stored data, wherein the memory cell has a first storage node and a second storage node, a first transistor having a control terminal connected to the first storage node and having a pair of input/output terminals connected between the second storage node and a reference potential, a second transistor having a control terminal connected to the second storage node and having a pair of input/output terminals connected between the first storage node and the reference potential, a third transistor having a pair of input/output terminals connected between the first storage node and the first bit line and having a control terminal connected to the word line, a fourth transistor having a pair of input/output terminals connected between the second storage node and the second bit line and having a control terminal connected to the word line, and a mismatch judgement circuit for judging a mismatch between the stored data in accordance with levels of the first storage node and the second storage node and the search data, and activating the mismatch detection line when mismatch is judged.

Preferably, the third transistor and the fourth transistor have a leakage current between input/output terminals larger in comparison with that of the first transistor and the second transistor.

According to a seventh aspect of the present invention, there is provided a semiconductor memory device comprising a first memory circuit and a second memory circuit each including a first storage node and a second storage node, a first transistor having a control terminal connected to the first storage node and having a pair of input/output terminals connected between the second storage node and a reference potential, a second transistor having a control terminal connected to the second storage node and having a pair of input/output terminals connected between the first storage node and the reference potential, a third transistor for controlling an access with respect to the first storage node, and a fourth transistor for controlling access with respect to the second storage node; a mismatch judgement circuit for judging mismatch between the stored data in accordance with the combination of data stored in the first memory circuit and the second memory circuit and the input search data; and a control circuit for setting the third transistor and the fourth drain in a nonconductive state, and applying a stored data holding voltage to the first storage node and the second storage node via the third transistor or the fourth transistor in a period of holding the stored data.

Preferably, the third transistor and the fourth transistor have a leakage current between input/output terminals larger than that of the first transistor and the second transistor.

According to the semiconductor memory device in the seventh aspect of the present invention, in the period where the stored data of the first memory circuit and the second memory circuit are held, the control circuit sets the third transistor and the fourth transistor in the nonconductive state and, at the same time, applies a stored data holding voltage to the first storage node and the second storage node via the third transistor or the fourth transistor. In the third transistor and the fourth transistor, the leakage current is larger in comparison with that of the first transistor and the second transistor, so the data of the first memory circuit and the second memory circuit held at the first storage node and the second storage node are held constant. The mismatch judgement circuit judges mismatch between the stored data of the combination of the data stored in the first memory circuit and the second memory circuit and the input search data.

It is also possible for the control circuit to set the third transistor and the fourth transistor in the conductive state in the reading period of the stored data and, at the same time, apply a read voltage higher than the stored data holding voltage to the first storage node and the second storage node via the third transistor or the fourth transistor. By this, the static noise margin at the time of reading the stored data can be made larger.

Also, preferably the device has a mismatch detection line, a first search data line and a second search data line, and a mismatch detection line voltage supply circuit for supplying voltage to the mismatch detection line; the mismatch judgement circuit includes a first activation circuit for activating the mismatch detection line in accordance with the level of the first storage node or the second storage node of the first memory circuit and the level of the first search data line, and a second activation circuit for activating the mismatch detection line in accordance with the level of the first storage node or the second storage node of the second memory circuit and the level of the second search data line; and the control circuit sets the third transistor and the fourth transistor in the nonconductive state and, at the same time, applies voltage in accordance with the search data to the first search data line and the second search data line in a period for detecting mismatch between the stored data and the search data.

According to an eighth aspect of the present invention, there is provided a semiconductor memory device comprising a plurality of memory cells arranged in a matrix, a plurality of first word lines and second word lines connected to memory cells of the same row of the matrix, a plurality of mismatch detection lines connected to memory cells of the same row of the matrix, a plurality of first bit lines and second bit lines connected to memory cells of the same column of the matrix, a first search data line and a second search data line connected to memory cells of the same column of the matrix, and a control circuit for deactivating the first word lines and the second word lines, applying a stored data holding voltage to the first bit lines and the second bit lines, and applying voltage in accordance with the search data to the first search data line and the second search data line in a period for detecting mismatch between the input search data and the stored data of the memory cell, wherein the memory cell includes a first memory circuit connected to the first word line, a second memory circuit connected to the second word line, and a mismatch judgement circuit for judging mismatch between the stored data in accordance with the combination of data stored in the first memory circuit and the second memory circuit and the search data, and activating the mismatch detection line when judging mismatch; the first memory circuit and the second memory circuit each include a first storage node and a second storage node, a first transistor having a control terminal connected to the first storage node and having a pair of input/output terminals connected between the second storage node and a reference potential, a second transistor having a control terminal connected to the second storage node and having a pair of input/output terminals connected between the first storage node and the reference potential, a third transistor having a pair of input/output terminals connected between the first storage node and the first bit line and having a control terminal connected to the first word line or the second word line, and a fourth transistor having a pair of input/output terminals connected between the second storage node and the second bit line and having a control terminal connected to the first word line or the second word line.

Preferably, the third transistor and the fourth transistor have a leakage current between input/output terminals larger in comparison with that of the first transistor and the second transistor.

According to a ninth aspect of the present invention, there is provided a semiconductor memory device comprising a plurality of memory cells arranged in a matrix, a plurality of word lines connected to memory cells of the same row of the matrix, a plurality of mismatch detection lines connected to memory cells of the same row of the matrix, a plurality of first bit line pairs and second bit line pairs connected to memory cells of the same column of the matrix, a first search data line and a second search data line connected to memory cells of the same column of the matrix, and a control circuit for deactivating the word lines, applying a stored data holding voltage to the first bit line pairs and the second bit line pairs, and applying voltage in accordance with the search data to the first search data line and the second search data line in a period for detecting mismatch between the input search data and the stored data of the memory cell, wherein the memory cell includes a first memory circuit connected to the first bit line pair, a second memory circuit connected to the second bit line pair, and a mismatch judgement circuit for judging mismatch between the stored data in accordance with the combination of data stored in the first memory circuit and the second memory circuit and the search data, and activating the mismatch detection line when judging mismatch; the first memory circuit and the second memory circuit each include a first storage node and a second storage node, a first transistor having a control terminal connected to the first storage node and having a pair of input/output terminals connected between the second storage node and a reference potential, a second transistor having a control terminal connected to the second storage node and having a pair of input/output terminals connected between the first storage node and the reference potential, a third transistor having a pair of input/output terminals connected between one bit line of the first bit line pair or the second bit line pair and the first storage node and having a control terminal connected to the word line, and a fourth transistor having a pair of input/output terminals connected between the other bit line of the first bit line pair or the second bit line pair and the second storage node and having a control terminal connected to the word line.

Preferably, the third transistor and the fourth transistor have a leakage current between input/output terminals larger in comparison with that of the first transistor and the second transistor.

BRIEF DESCRIPTION OF THE DRAWINGS

These and other objects and features of the present invention will become clearer from the following description of the preferred embodiments given with reference to the attached drawings, wherein:

FIG. 22 is a view of an example where a memory cell array is comprised by ternary CAM cells having the structure shown in FIG. 17 to FIG. 21;

DESCRIPTION OF THE PREFERRED EMBODIMENTS

Figure 1:
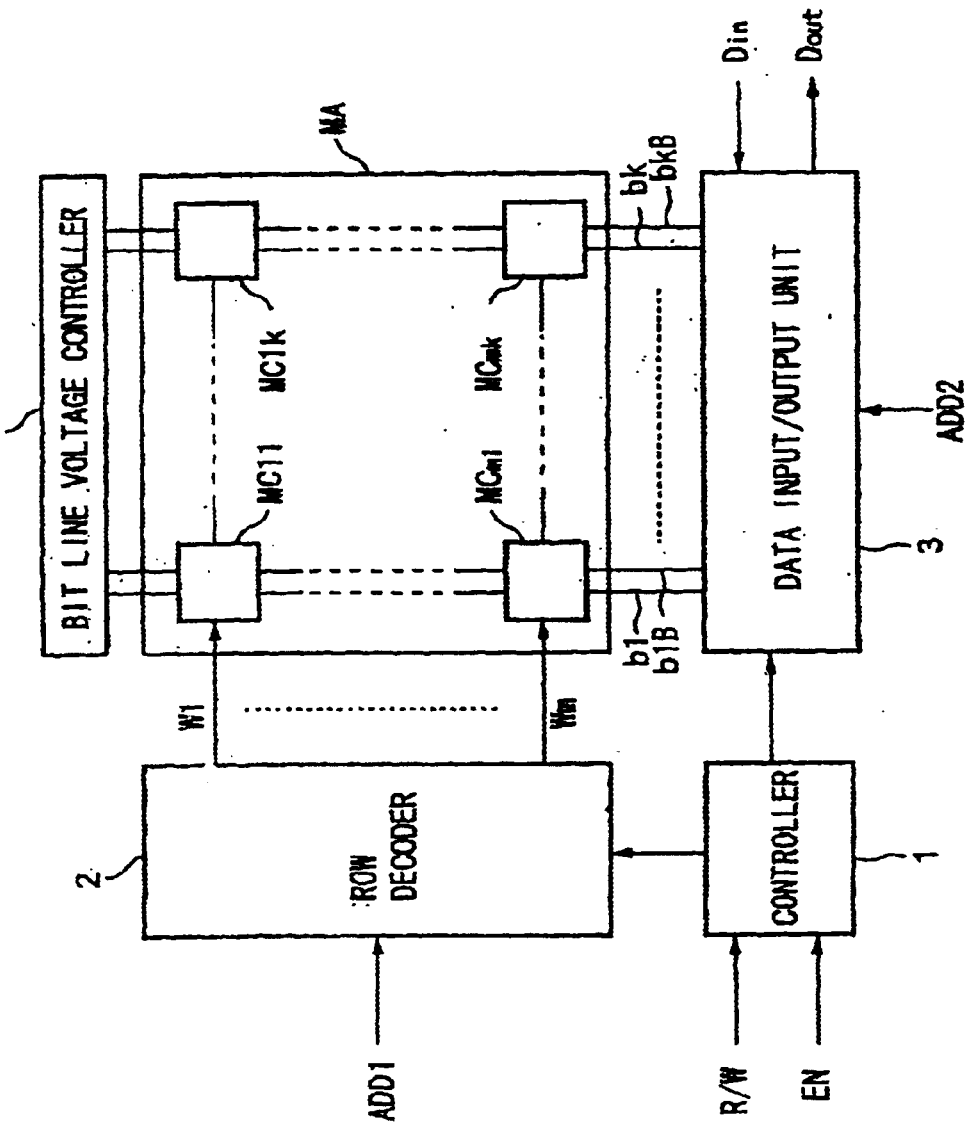
FIG. 1 is a schematic view of an example of the configuration of a SRAM according to a first embodiment of the present invention.

Below, an explanation will be made of first to fifth embodiments of the present invention by referring to the drawings.

FIRST EMBODIMENT

FIG. 1 is a schematic view of an example of the configuration of a SRAM according to a first embodiment of the present invention. The SRAM shown in FIG. 1 includes a controller 1, row decoder 2, data input/output unit 3, bit line voltage controller 4, and memory cell array MA. Also, the memory cell array MA includes a memory cell MC11 to memory cell MCmk.

When an enable signal EN is set to an active state, the controller 1 outputs various control signals for the read or write operation of data selected in accordance with a selection signal R/W to the row decoder 2, data input/output unit 3, and bit line voltage controller 4 to control the write or read operation of the data with respect to the memory cell array MA.

The row decoder 2 decodes address data ADD1 in accordance with the control signal from the controller 1 at the time of reading or writing of the data and selects and activates one of a word line W1 to word line Wm connected to the memory cell MC11 to the memory cell MCmk of the memory cell array MA.

The data input/output unit 3 decodes address data ADD2 in accordance with the control signal from the controller 1 at the time of reading or writing of the data and selects one block from among a plurality of blocks of a bit line pair (b1, b1B) to bit line pair (bk, bkB) connected to the memory cell MC11 to memory cell MCmk.

At the time of reading data, the signals from the memory cells output to the bit lines are amplified by an internal differential amplifier circuit, then the amplified signals from the memory cells connected to the selected bit line pairs are output to the data line.

Also, at the time of writing data, the signals from the data line are amplified by an internal write use amplifier circuit, then the amplified signals are output to the memory cells connected to the selected bit line pairs.

The bit line voltage controller 4 controls the pullup voltage of the bit line pair (b1, b1B) to bit line pair (bk, bkB) in accordance with the control signal from the controller 1. In the period for holding the data, each bit line is pulled up to the power supply voltage Vcc, while at the time of reading of the data, each is pulled up to a boost voltage VccX obtained by boosting this power supply voltage Vcc.

Due to the reason explained later, the SNM at the time of reading the data of the memory cell MC11 to the memory cell MCmk is improved by boosting the pullup voltage of the bit line pairs. Therefore, by adequately setting this boost voltage VccX, the reduction of the SNM of memory cells in the case where the power supply voltage Vcc falls can be suppressed.

The memory array MA has the memory cell MC11 to the memory cell MCmk arranged in a matrix. The memory cells included in the rows of this matrix are connected to the word line W1 to the word line Wm provided corresponding to the rows, while the memory cells included in columns of the matrix are connected to the bit line pair (b1, b1B) to the bit line pair (bk, bkB) provided corresponding to the columns.

Next, an explanation will be made of the operation of a SRAM having the above configuration.

First, in the period for holding the stored data of the memory cells, each bit line pair is pulled up to the power supply voltage Vcc by the bit line voltage controller 4.

When a read operation is selected by the selection signal R/W and the enable signal EN is set to the active state, the pullup voltage of each bit line pair is switched from the power supply voltage Vcc to the boost voltage VccX in the bit line voltage controller 4.

Also, one word line Wi (i indicates any natural number) is selected and activated in the row decoder unit 2 in accordance with the address data ADD1. At the same time, the signals from the memory cells connected to the activated word line Wi are amplified by the differential amplifier circuit of the data input/output unit 3. Also, one block of the bit line pairs is selected in the data input/output unit 3 in accordance with the address data ADD2, then the amplified signals from the memory cells connected to the selected block of the bit line pairs are output from the data input/output unit 3 to the data line.

When a write operation is selected by the selection signal R/W and the enable signal EN is set to the active state, one block of the bit line pairs is selected in the data input/output unit 3 in accordance with the address data ADD2, then the write data are input from the data line to this selected block of the bit line pairs. The write data are amplified by the write use amplifier circuit of the data input/output unit 3 and supplied to the memory cells connected to the selected block of the bit line pairs. Then, one word line in accordance with the address data ADD1 is selected and activated in the row decoder unit 2, whereupon the write data are stored in the memory cells connected to this activated word line.

Here, a further detailed explanation will be made of details of the bit line voltage controller 4 and the memory cells by referring to FIG. 2 to FIG. 4.

Figure 2:
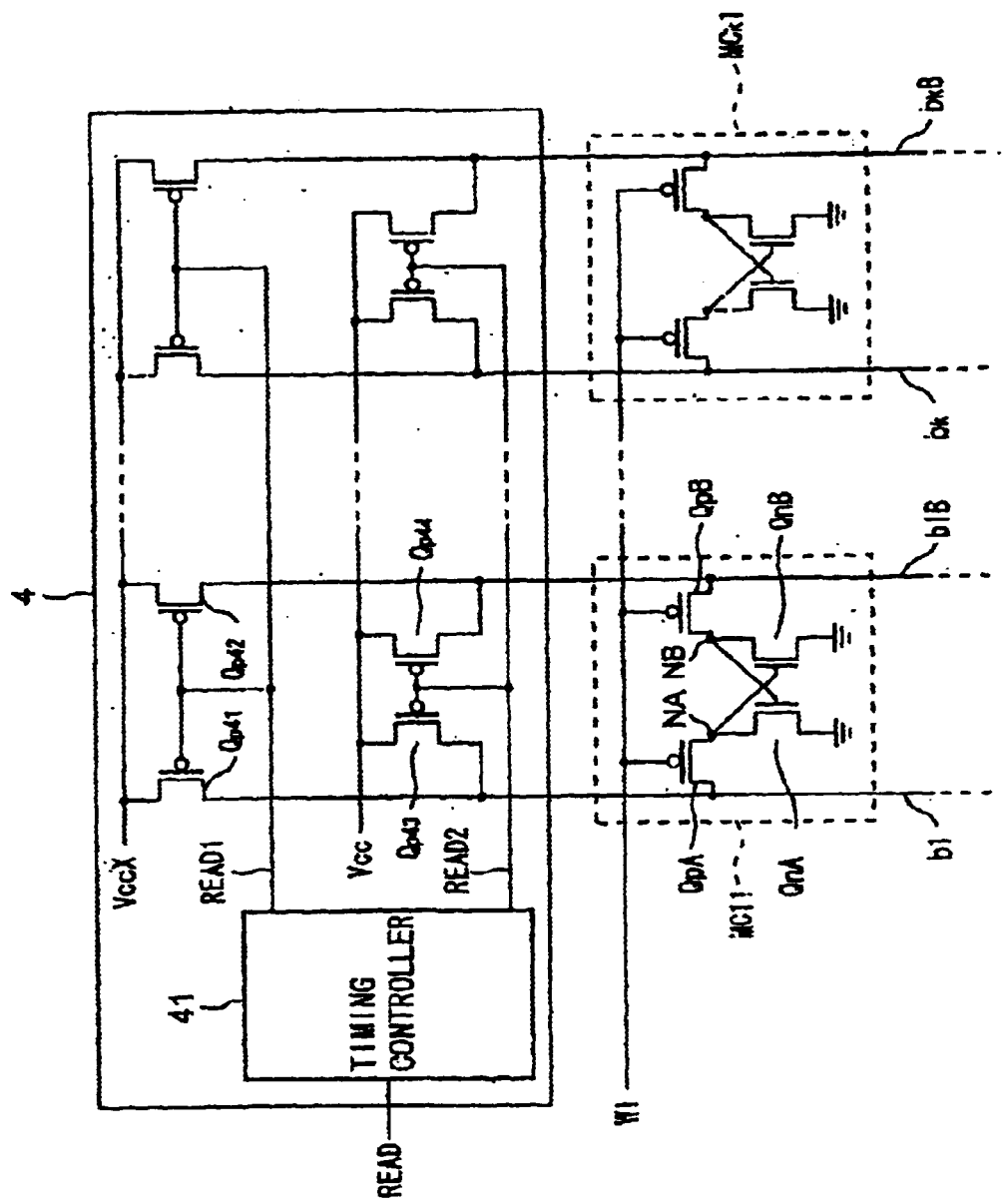
FIG. 2 is a view of an example of the configuration of a bit line voltage controller and memory cells of the SRAM shown in FIG. 1.

FIG. 2 is a view of an example of the configuration of the bit line voltage controller 4 and memory cells of the SRAM shown in FIG. 1.

Each memory cell shown in FIG. 2 has a p-type MOS transistor QpA, p-type MOS transistor QpB, n-type MOS transistor QnA, and n-type MOS transistor QnB. Note that, in FIG. 2, only the memory cell MC11 to memory cell MCk1 are shown, but the other memory cells have similar configurations.

Also, the bit line voltage controller 4 shown in FIG. 2 has a timing controller 41 and p-type MOS transistor Qp41 to p-type MOS transistor Qp44 corresponding to the bit line pairs.

First, an explanation will be made of the configuration and the operation of each memory cell shown in FIG. 2.

In the n-type MOS transistor QnA, the drain is connected to the node NA, the gate is connected to the node NB, and the source is connected to the reference potential.

In the n-type MOS transistor QnB, the drain is connected to the node NB, the gate is connected to the node NA, and the source is connected to the reference potential.

In the p-type MOS transistor QpA, the gate is connected to a word line Wi (i indicates a natural number of $1 \leq i \leq m$), the source is connected to a bit line Bj (j indicates a natural number of $1 \leq j \leq k$), and the drain is connected to the node NA.

In the p-type MOS transistor QpB, the gate is connected to the word line Wi, the source is connected to an inverted bit line bjB, and the drain is connected to the node NB.

The inputs and outputs of the inverter formed by the n-type MOS transistor QnA and the inverter formed by the n-type MOS transistor QnB are connected to each other in the form of a ring, whereby one memory circuit is comprised. Also, the circuit is set so that the leakage current in the off state of the p-type MOS transistor QpA and the p-type MOS transistor QpB becomes larger in comparison with the leakage current of the n-type MOS transistor QnA and the n-type MOS transistor QnB. Therefore charges are supplied from the bit line bj and the inverted bit line bjBe pulled up to the power supply voltage Vcc C to the node NA and the node NB. The stored data is held constant by this.

Next, an explanation will be made of the read operation and the write operation of the memory cell MC11 to the memory cell MCmk having the above configuration.

The stored data of a memory cell is stored in a two-transistor memory circuit in either of a state where the node NA is at the high level and the node NB is at the low level or a state where the node NA is at the low level and the node NB is at the high level. In the period for holding the stored data, the word line Wi is set at the high level, the p-type MOS transistor QpA and the p-type MOS transistor QpB are brought to the cutoff state, and the bit line bj and the inverted bit line bjB are pulled up to the power supply voltage Vcc. As mentioned above, due to the leakage current of the p-type MOS transistor QpA and the p-type MOS transistor QpB, charges are supplied to the node NA and the node NB, so the stored data is held constant.

At the time of reading the stored data of a memory cell, the pullup voltage of each bit line pair is boosted from the power supply voltage Vcc to the boost voltage VccX, and the word line Wi is set to the low level. By this, the p-type MOS transistor QpA and p-type MOS transistor QpB become conductive, and the voltage of the bit line bj or the inverted bit line bjB changes in accordance with the stored data.

For example, when the node NA is at the high level and the node NB is at the low level, the voltage of the bit line bj is the boost voltage VccX and the node NA is almost equal to the power supply voltage Vcc, so current corresponding to this potential difference flows through a p-type MOS transistor Qp101 and the voltage of the bit line bj is temporarily lowered. Note, since the n-type MOS transistor QnA is in the off state, the voltage of the bit line bj rises to the boost voltage VccX again after the current from the p-type MOS transistor QpA charges the gate capacity of the n-type MOS transistor QnB.

On the other hand, since the n-type MOS transistor QnB is on, the current flowing from the inverted bit line bjB to the p-type MOS transistor QpB constantly flows to the reference potential via the n-type MOS transistor QnB. Accordingly, the voltage of the inverted bit line bjB falls in comparison with the bit line bj. This potential difference (or current difference) between the bit line bj and the inverted bit line bjB is amplified by the differential amplifier circuit of the data input/output unit 3 and output to the data line.

At the time of writing the stored data of a memory cell, the word line Wi is set at the low level in the state where either of the bit line bj or the inverted bit line bjB is pulled down to the reference potential and the other is pulled up to the power supply voltage Vcc in accordance with the data to be written. By this, the node NA and the node NB are set at the potential in accordance with the data which is to be written.

Next, an explanation will be made of the bit line voltage controller 4 shown in FIG. 2.

Each bit line pair is connected to the boost voltage VccX via the p-type MOS transistor Qp41 and the p-type MOS transistor Qp42, and a gate signal READ1 of the timing controller 41 is input to gates of the p-type MOS transistor Qp41 and the p-type MOS transistor Qp42.

Also, each bit line pair is connected to the power supply voltage Vcc via the p-type MOS transistor Qp43, and the p-type MOS transistor Qp44, and a gate signal READ2 of the timing controller 41 is input to gates of the p-type MOS transistor Qp43 and the p-type MOS transistor Qp44.

The timing controller 41 sets the gate signal READ1 at the low level and sets the gate signal READ2 at the high level in the period for reading data in accordance with the control signal READ of the controller 1—which becomes active at the time of reading the data. By this, the p-type MOS transistor Qp41 and the p-type MOS transistor Qp42 become on, the p-type MOS transistor Qp43 and the p-type MOS transistor Qp44 become off, and each bit line pair is connected to the boost voltage VccX.

Also, in the data holding period other than the period for reading the data, the gate signal READ1 is set at the high level (boost voltage VccX) and the gate signal READ2 is set at the low level. By this, the p-type MOS transistor Qp41 and the p-type MOS transistor Qp42 become off, the p-type MOS transistor Qp43 and the p-type MOS transistor Qp44 become the on, and each bit line pair is connected to the power supply voltage Vcc.

FIGS. 3A and 3B and FIGS. 4A and 4B are views of an examples of the circuit of this timing controller 41 and timing charts thereof.

Figure 3A:
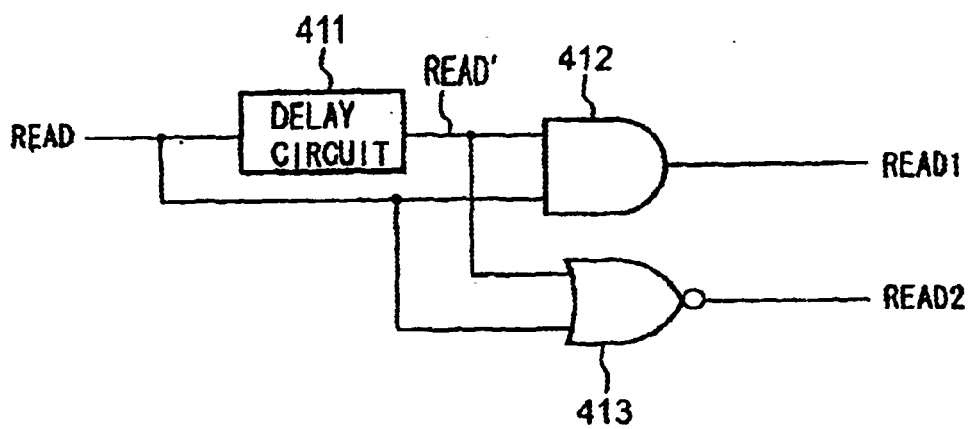
FIGS. 3A and 3B are a first view of an example of a timing control circuit and a timing chart of the bit line voltage controller shown in FIG. 2.

In the example of the circuit of the timing controller 4 shown in FIG. 3A, the control signal READ is input via a delay circuit 411 to one terminal of an AND circuit 412, and the control signal READ is directly input to the other terminal. The output of this AND circuit 412 becomes the gate signal READ1. Also, the control signal READ is input via the delay circuit 411 to one terminal of a NOR circuit 413, and the control signal READ is directly input to the other terminal. The output of this NOR circuit 413 becomes the gate signal READ2.

Figure 3B:
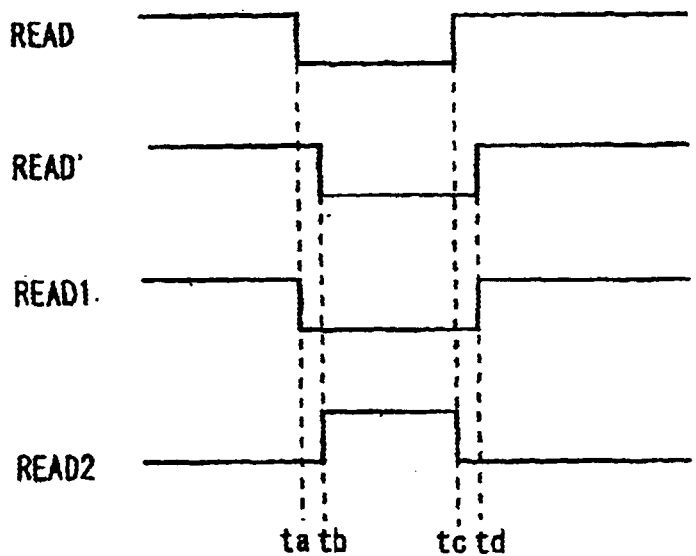

According to the timing controller 41 shown in FIG. 3A, as shown in the timing chart of FIG. 3B, at the start and end of the reading of the data at which the control signal READ becomes the low level, there is a period where the gate signal READ1 and the gate signal READ2 simultaneously become the low level.

Namely, when the control signal READ becomes the low level in an initial stage of the time of reading the data, this low level is input to the AND circuit 412, and the gate signal READ1 immediately becomes the low level (time ta). On the other hand, this low level is input to also the NOR circuit 413, but the other input of the NOR circuit 413 is still at the high level due to the delay by the delay circuit 411, so the gate signal READ2 is still at the low level. When the output of the delay circuit 411 becomes the low level after a constant delay time passes, the gate signal READ2 becomes the high level (time tb).

Similarly, when the control signal READ becomes the high level at the end of the time of reading the data, this high level is input to the NOR circuit 413, and the gate signal READ2 immediately becomes the low level (time tc). On the other hand, this high level is input to also the AND circuit 412, but the other input of the AND circuit 412 is still at the low level due to the delay by the delay circuit 411, so the gate signal READ1 is still at the low level,. When the output of the delay circuit 411 becomes the high level after a constant delay time passes, the gate signal READ1 becomes the high level (time td).

In this way, both of the p-type MOS transistor Qp41 and the p-type MOS transistor Qp42 and the p-type MOS transistor Qp43 and the p-type MOS transistor Qp44 become on in the periods of the start and end of the time of reading the data, so the boost voltage VccX and the power supply voltage Vcc are passed in these periods, and a large penetration current ends up flowing. However, the supply of the pullup voltage to the bit line pair is no longer interrupted by this control, and the supply of charges to each memory cell is reliably carried out, so the storage states of the memory cells can be reliably held.

Figure 4A:
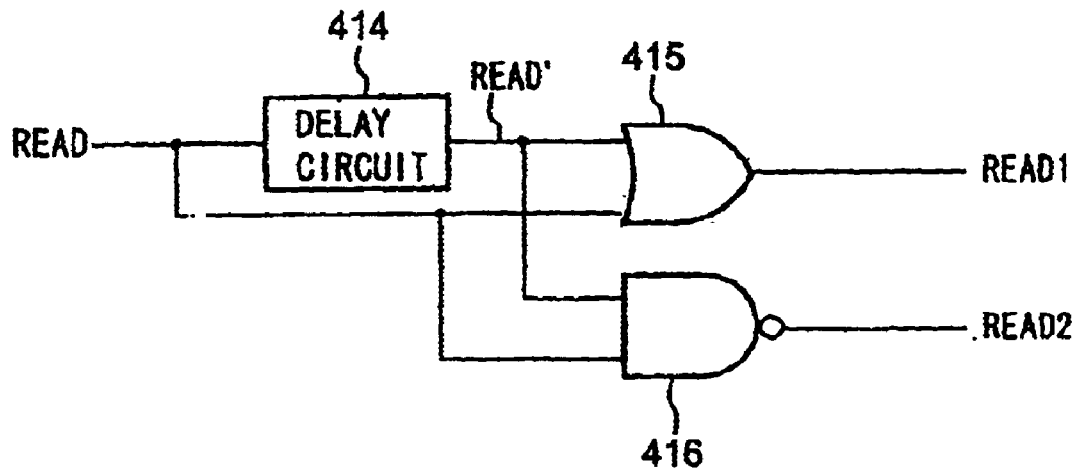
FIGS. 4A and 4B are a second view of an example of the timing control circuit and the timing chart of the bit line voltage controller shown in FIG. 2.

On the other hand, in the example of the circuit of the timing controller 41 shown in FIG. 4A, the control signal READ is input via a delay circuit 414 to one terminal of an OR circuit 415, and the control signal READ is directly input to the other terminal. The output of this OR circuit 415 becomes the gate signal READ1. Also, the control signal READ is input via the delay circuit 414 to one terminal of a NAND circuit 416, and the control signal READ is directly input to the other terminal. The output of this NAND circuit 416 becomes the gate signal READ2.

Figure 4B:
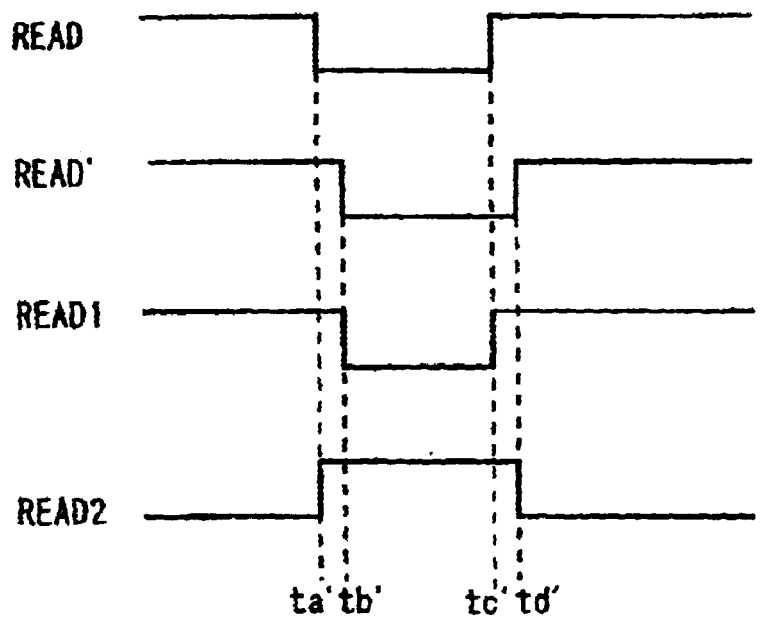

According to the timing controller 41 shown in FIG. 4A, as shown in the timing chart of FIG. 4B, at the start and end of the reading of the data at which the control signal READ becomes the low level, there is a period where the gate signal READ1 and the gate signal READ2 simultaneously become the high level.

Namely, when the control signal READ becomes the low level in an initial stage of the time of reading the data, this low level is input to the NAND circuit 416, and the gate signal READ2 immediately becomes the high level (time ta'). On the other hand, this low level is input to also the OR circuit 415, but the other input of the OR circuit 415 is still at the high level due to the delay by the delay circuit 414, so the gate signal READ1 is still at the high level. When the output of the delay circuit 414 becomes the low level after a constant delay time passes, the gate signal READ1 becomes the low level (time tb').

Similarly, when the control signal READ becomes the high level at the end of the time of reading the data, this high level is input to the OR circuit 415, and the gate signal READ1 immediately becomes the high level (time tc'). On the other hand, this high level is input to also the NAND circuit 416, but the other input of the NAND circuit 416 is still at the low level due to the delay by the delay circuit 414, so the gate signal READ2 is still at the high level. When the output of the delay circuit 414 becomes the high level after a constant delay time passes, the gate signal READ2 becomes the low level (time td').

In this way, in the example of the circuit of the timing controller 41 shown in FIG. 4A, both of the p-type MOS transistor Qp41 and p-type MOS transistor Qp42 and the p-type MOS transistor Qp43 and p-type MOS transistor Qp44 become off in the periods of the start and end of the time of reading the data. Accordingly, the boost voltage VccX and the power supply voltage Vcc are prevented from being passed in these periods, and the penetration current as in the example of the circuit of FIG. 3A no longer flows, so the consumed power can be reduced in comparison with the example of circuit of FIG. 3A. However, the supply of the pullup voltage to the bit line pair is interrupted by this control, so it is better to use the circuit of FIG. 3A when the storage states of the memory cells are liable to change in this interruption period.

Here, an explanation will be made of the change of the SNM by the boosting of the bit lines at the time of reading the data.

Figure 5A:
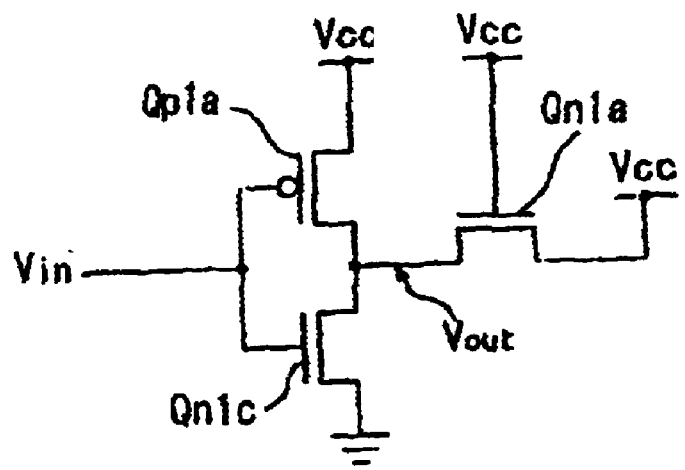
FIGS. 5A and 5B are a view of an example of an evaluation circuit of SNM and a butterfly plot in a six-transistor type memory cell.
Figure 5B:
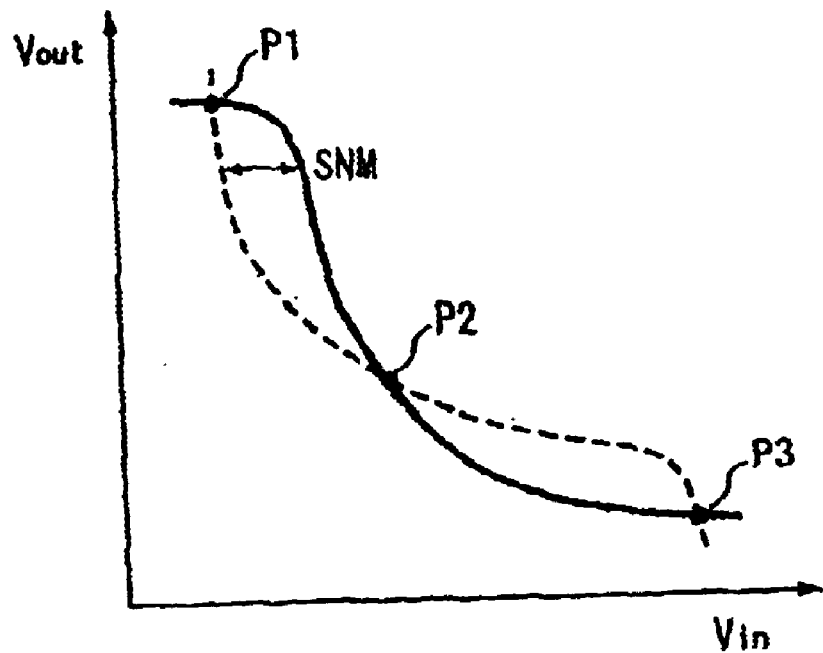

FIG. 5A is a view of an evaluation circuit of the SNM in a six-transistor type memory cell, while FIG. 5B is an example of a butterfly plot showing the relationship of the input/output voltage in this evaluation circuit.

The evaluation circuit of SNM shown in FIG. 5A has a p-type MOS transistor Qp1$a$, n-type MOS transistor Qn1$a$, and n-type MOS transistor Qn1$c$.

In the p-type MOS transistor Qp1$a$, the source is connected to the power supply voltage Vcc, the gate is connected to an input terminal Vin, and the drain is connected to an output terminal Vout. In the n-type MOS transistor Qn1$c$, the source is connected to the reference potential, the gate is connected to the input terminal Vin, and the drain is connected to the output terminal Vout.

In the n-type MOS transistor Qn1$a$, the source is connected to the output terminal Vout, and the drain and gate are connected to the power supply voltage Vcc.

Figure 23:
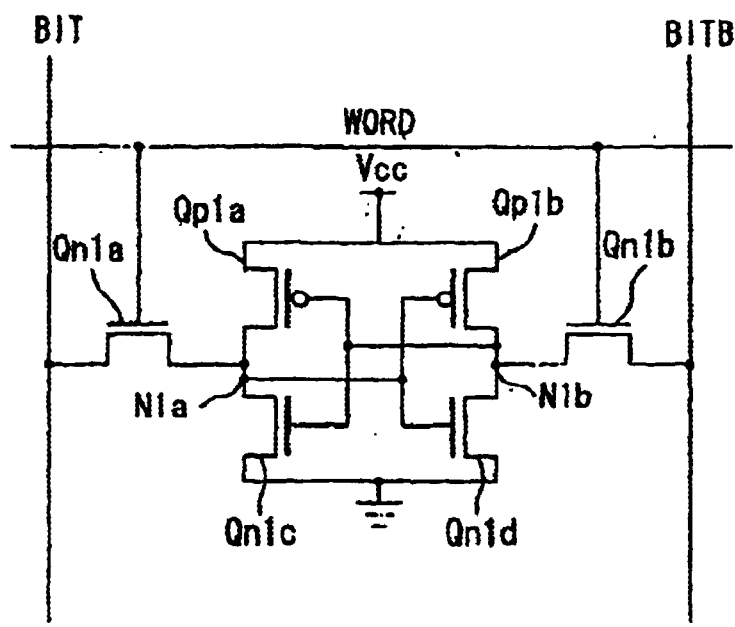
FIG. 23 is a circuit diagram of a six-transistor type SRAM cell.

The circuit shown in FIG. 5A is a circuit obtained by picking out one CMOS inverter (corresponding to the p-type MOS transistor Qp1$a$ and the n-type MOS transistor Qn1$c$ of FIG. 5A) and one n-type MOS transistor (corresponding to the n-type MOS transistor Qn1$a$ of FIG. 5A) for connecting this CMOS inverter to the bit line in the six-transistor type SRAM cell shown in FIG. 23. Note, for evaluating the SNM in the state where the data is read from the memory cell, the n-type MOS transistor Qn1$a$ is set on by applying the power supply voltage Vcc to the gate.

The memory cell can hold input/output voltages at three points, i.e., intersecting point P1 to intersecting point P3 at which solid lines and dotted lines of the butterfly plot shown in FIG. 5B intersect. Among them, the input/output voltage corresponding to the intersecting point P2 shows the state where the stored data is unstable. In the normal state, the state of the intersecting point P1 or the intersecting point P3 is held.

The SNM is evaluated by the voltage of the difference between the solid line and the dotted line of the butterfly plot. When noise exceeding the voltage of this difference is added to the memory cell at the time of reading, the stored data of the memory cell becomes the unstable state of the intersecting point P2 or is rewritten to completely reverse data.

Figure 6A:
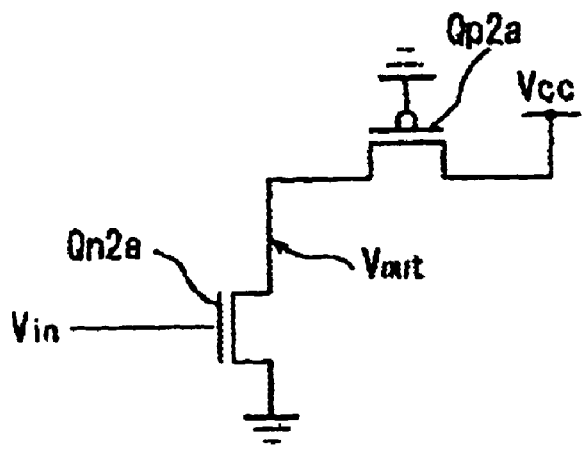
FIGS. 6A and 6B are a view of an example of an evaluation circuit of SNM and a butterfly plot in a four-transistor type memory cell.
Figure 6B:
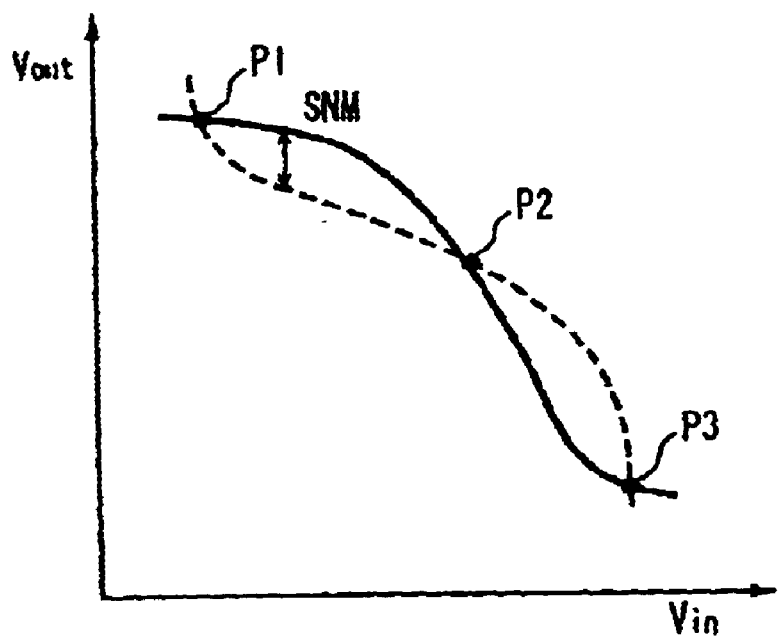

FIG. 6A is a view of the evaluation circuit of the SNM in a four-transistor type memory cell, while FIG. 6B is an example of a butterfly plot showing the relationship of the input/output voltage in this evaluation circuit.

The evaluation circuit of the SNM shown in FIG. 6A has a p-type MOS transistor Qp2$a$ and n-type MOS transistor Qn2$a$.

In the p-type MOS transistor Qp2$a$, the source is connected to the power supply voltage Vcc, the gate is connected to the reference potential, and the drain is connected to the output terminal Vout. In the n-type MOS transistor Qn2$a$, the source is connected to the reference potential, the gate is connected to the input terminal Vin, and the drain is connected to the output terminal Vout.

The circuit shown in FIG. 6A is a circuit obtained by picking out an inverter of one transistor (corresponding to the n-type MOS transistor Qn2$a$ of FIG. 6A) and one p-type MOS transistor (corresponding to the pn type MOS transistor Qp2$a$ of FIG. 6A) for connecting this inverter of one transistor to the bit line in the four-transistor type memory cell explained in FIG. 2. Note, for the evaluation of the SNM in the state where the data is read from the memory cell, the p-type MOS transistor Qp2$a$ is set on by the gate being connected to the reference potential In the same way as the butterfly plot of FIG. 5B, the four-transistor type SRAM cell can hold the input/output voltage at three intersecting points P1 to P3 shown in FIG. 6B at which the solid lines and the dotted lines of the butterfly plot intersect, but when noise exceeding the SNM is added to the memory cell at the time of reading, the stored data of the memory cell becomes the unstable state of the intersecting point P2 or is rewritten to completely the reverse data.

Figure 7:
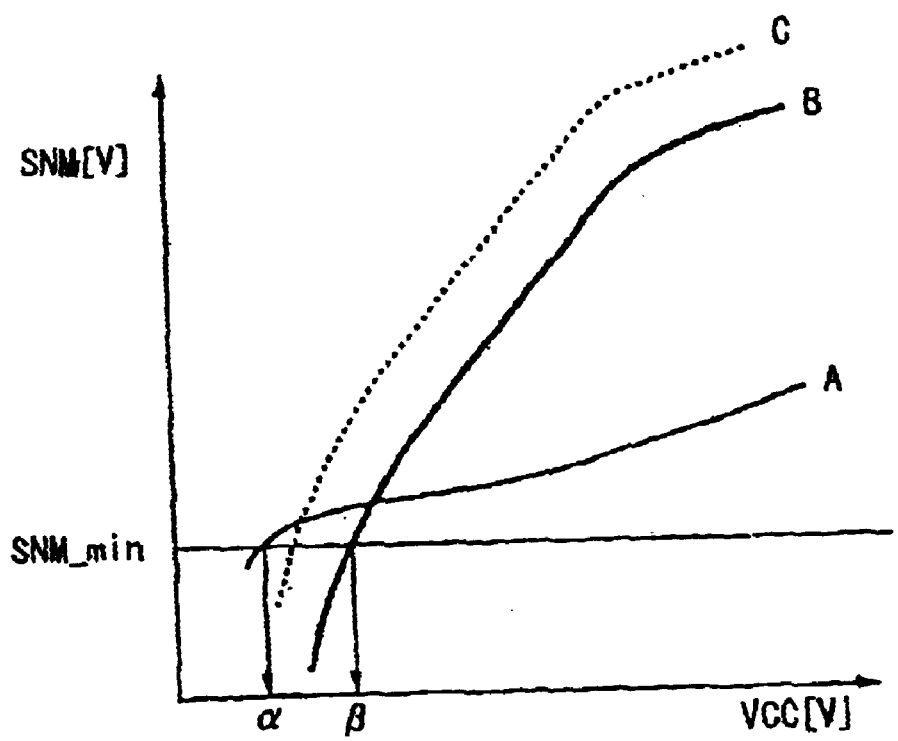
FIG. 7 is a view of an example of a change of the SNM in accordance with a power supply voltage.

FIG. 7 is a view of an example of the change of the SNM with respect to the power supply voltage Vcc.

A curve A of FIG. 7 shows the relationship between the power supply voltage Vcc and the SNM in the SNM evaluation circuit of the six-transistor type SRAM cell shown in FIG. 5A, while a curve B shows the relationship between the power supply voltage Vcc and the SNM in the SNM evaluation circuit of the four-transistor type SRAM cell shown in FIG. 6A. As seen from FIG. 7, usually, the higher the power supply voltage Vcc, the larger the SNM.

Also, in FIG. 7, SNM_min shows the allowable minimum SNM and usually has a value of about 0.1 to 0.2V—although different according to the process. A power supply voltage β of the four-transistor type SRAM cell in this minimum SNM is larger than the power supply voltage of the six-transistor type SRAM cell. Namely, in the four-transistor type SRAM cell, the voltage of the limit of the low voltage operation is higher in comparison with the six-transistor type SRAM cell, so this is unsuited for lowering the voltage.

As seen from the SNM evaluation circuit of the four-transistor type memory cell shown in FIG. 6A, the power supply voltage Vcc applied to the circuit is only the bit line voltage at the time of the read operation. Accordingly, by raising the pullup voltage of the bit line only at the time of this read operation, the power supply voltage Vcc in FIG. 7 can seem to be raised.

A curve C of the dotted line in FIG. 7 shows the relationship between the power supply voltage Vcc and the SNM in a case where the bit line voltage at the time of reading is raised in the four-transistor type memory cell. For example, in a case where the power supply voltage Vcc is 1.2V, when the pullup voltage of the bit line at the time of reading is boosted to 1.5V by the bit line voltage controller 4 shown in FIG. 1 and FIG. 2, the SNM becomes equal to the SNM in a case where the power supply voltage Vcc is 1.5V, so the reduction of the SNM due to the voltage drop of the power supply voltage can be suppressed. Due to this, the four-transistor type memory cell can be operated with a lower power supply voltage than the conventional power supply voltage.

As explained above, according to the SRAM shown in FIG. 1, a plurality of memory cells MC11 to MCmk arranged in the matrix are connected to word lines Wj provided corresponding to the rows of the matrix in the related rows and, at the same time, connected to bit line pairs (bj, bjB) provided corresponding to the columns of the matrix within the related columns. Also, each of these memory cells has the configuration of a four-transistor type SRAM cell including the node NA and the node NB, the n-type MOS transistor QnB having the gate connected to the node NA and having the drain and source terminals connected between the node NB and the reference potential, the n-type MOS transistor QnA having the gate connected to the node NB and having the drain and source terminals connected between the node NA and the reference potential, the p-type MOS transistor QpA having the drain and source terminals connected between the node NA and the bit line bj and having the gate connected to the word line Wj, and the p-type MOS transistor QpB having the drain and source terminals connected between the node NB and the inverted bit line bjB and having the gate connected to the word line Wj. In the period for holding the stored data, the power supply voltage Vcc is supplied to each bit line pair by the bit line voltage controller 4, while at the time of reading of the stored data, a boost voltage VccX higher than the power supply voltage Vcc is supplied to each bit line, and one of the word lines Wj is activated. By this, the stored data is read from the memory cells connected to the activated word line.

Accordingly, the reduction of the SNM of a four-transistor type SRAM cell accompanying a drop in the voltage of the power supply can be suppressed, and a four-transistor type memory cell can be used even within the range of the power supply voltage which could not be used due to reduction of the SNM in the case mentioned as the related art above. Due to this, the degree of integration of the circuit can be improved in comparison with the case where a six-transistor type memory cell is used, and the production cost per memory cell can be reduced.

Also, the SNM becomes larger due to the boosting of the pullup voltage of the bit line pair at the time of reading of the stored data, so durability with respect to noise can be improved.

Further, the amplitude of the differential signal between the pair of bit lines at the time of reading becomes larger, so the reading can be speeded up and, at the same time, the noise resistance can be improved.

SECOND EMBODIMENT

Next, an explanation will be made of a second embodiment of the present invention.

Figure 8:
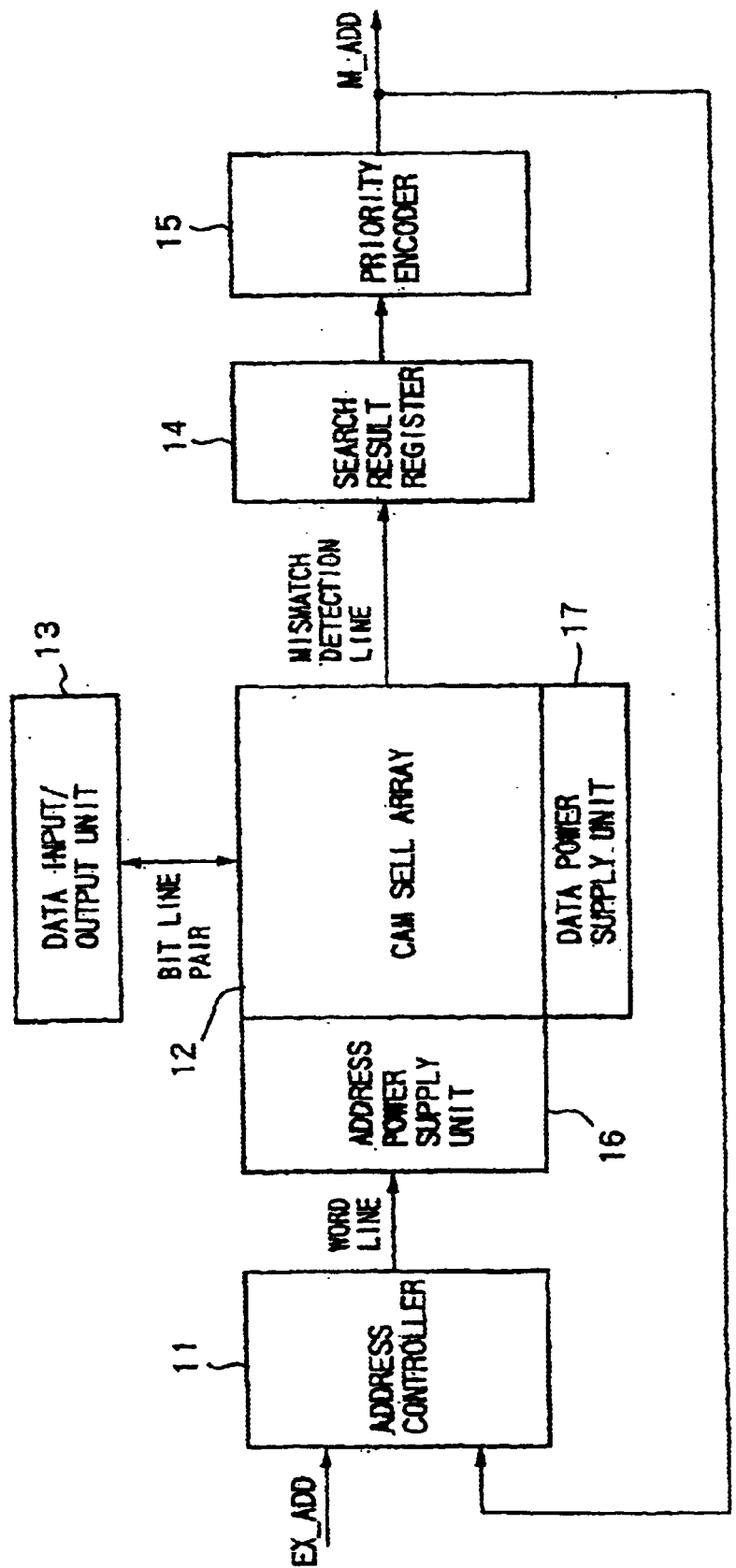
FIG. 8 is a schematic block diagram of an example of the configuration of an associative memory according to a second embodiment to fifth embodiment of the present invention.

FIG. 8 is a schematic block diagram of an example of the configuration of an associative memory according to the second embodiment of the present invention.

The associative memory shown in FIG. 8 has an address controller 11, CAM cell array 12, data input/output unit 13, search result register 14, priority encoder 15, address power supply unit 16, and data power supply unit 17.

The address controller 11 receives an address data EX_ADD input from the outside or an address data M_ADD of the search result selected at the priority encoder, selects the word line of the CAM cell array 12 corresponding to the input address data, and activates the selected word line at the time of writing and the time of reading of the data. In the period for holding the stored data and at the time of the match search explained later, all word lines are deactivated, and access from the bit lines to the CAM cells is prohibited.

The CAM cell array 12 is a memory cell array obtained by arranging the CAM cells of FIG. 9 mentioned later in a matrix and includes a plurality of word lines and a plurality of mismatch detection lines provided corresponding to the rows of the matrix and a plurality of bit line pairs provided corresponding to the columns of the matrix. The CAM cells of the same row of the matrix are connected to a common word line and mismatch detection line, while the CAM cells of the same column of the matrix are connected to a common bit line pair.

At the time of writing and the time of reading of the data, the CAM cells connected to the word line activated by the address controller 11 become accessible by the bit line pairs, and the reading or writing of the stored data is carried out with the data input/output unit 13.

In the period for holding the data, the leakage current flows from the data power supply unit 17 to the CAM cells via each bit line pair. The state of the stored data is held constant by this.

At the time of a match search, a match or mismatch between the search data output from the data input/output unit 13 to the bit line pairs and the data stored in the CAM cells is judged in each CAM cell. Then, when the search data and the stored data do not match, the mismatch detection lines are activated by the CAM cells for which mismatch was judged. By this, the mismatch detection lines of rows including even one CAM cell for which mismatch was judged are activated, therefore the address of stored data matching with the search data can be found by investigating the mismatch detection line which has not been activated.

The data input/output unit 13 accesses the CAM cells of the CAM cell array 12 via the bit line pairs to perform the writing or reading of the data. It includes a switch circuit for switching an input/output direction of the data in accordance with an instruction from a not illustrated controller.

At the time of reading the data, the data of each bit line pair is amplified by the read use amplifier circuit, then this amplified read data is output to the data line.

Also, at the time of writing data and at the time of a match search, the data input from the data line is amplified by the write use amplifier circuit, then this amplified write data or the search data is output to each bit line pair.

The search result register 14 is a register that temporarily holds the data of the search results output from the mismatch detection lines at the time of a match search.

The priority encoder 15 selects one row from among a plurality of matching rows in the search results held in the search result register 14 based on a priority order set in advance. Also, it converts the selected row to the address data and outputs the same as the search result address M_ADD to the address line.

The address power supply unit 16 supplies the power supply voltage to each word line and mismatch detection line. For example, it is comprised by a circuit for pulling up each word line and mismatch detection line to the power supply voltage via a pair of input/output terminals of the transistor.

The data power supply unit 17 supplies the power supply voltage to each bit line pair. For example, it is comprised by a circuit for pulling up each bit line pair to the power supply voltage via a pair of input/output terminals of the transistor.

According to the associative memory of FIG. 8 having the above configuration, at the time of reading the data, one word line in accordance with the address data EX_ADD supplied from the outside or the address data M_ADD of the search results is activated by the address controller 11. The CAM cells connected to the activated word line becomes accessable by the bit line pairs, and the data stored in these CAM cells are output to the bit line pairs. The stored data output to the bit lines are amplified at the data input/output unit 13 and output to the data line.

At the time of writing the data, in the same way as the time of reading, one word line in accordance with the address data EX_ADD supplied from the outside or the address data M_ADD of the search results is activated by the address controller 11, and the CAM cells connected to this word line become accessable by the bit line pairs. In this state, the write data amplified at the data input/output unit 13 are output to the bit line pairs, and the stored data of the accessable CAM cell are rewritten to the data of the bit line pairs.

At the match search, the search data are output from the data input/output unit 13 to the bit line pairs in the state where all word lines are deactivated. A match or mismatch with the stored data is judged for the search data at each CAM cell. When a mismatch is judged, the mismatch detection line connected to that CAM cell is activated, therefore, if even one CAM cell judging mismatch is included in the CAM cells connected to a common mismatch detection line, that mismatch detection line is activated by that CAM cell. The mismatch detection line is held in the inactive state only in the case where there is a match in all CAM cells. Such a state of the mismatch detection line (active or inactive) is held in the search result register 14, and the row for which the match between the stored data and the search data is judged is extracted by the priority encoder 15. Further, the address data of the matching row selected from among extracted matching rows based on the predetermined priority order is output as the search result address M_ADD.

Next, an explanation will be made of a CAM cell comprising the CAM cell array 12 by referring to FIG. 9.

Figure 9:
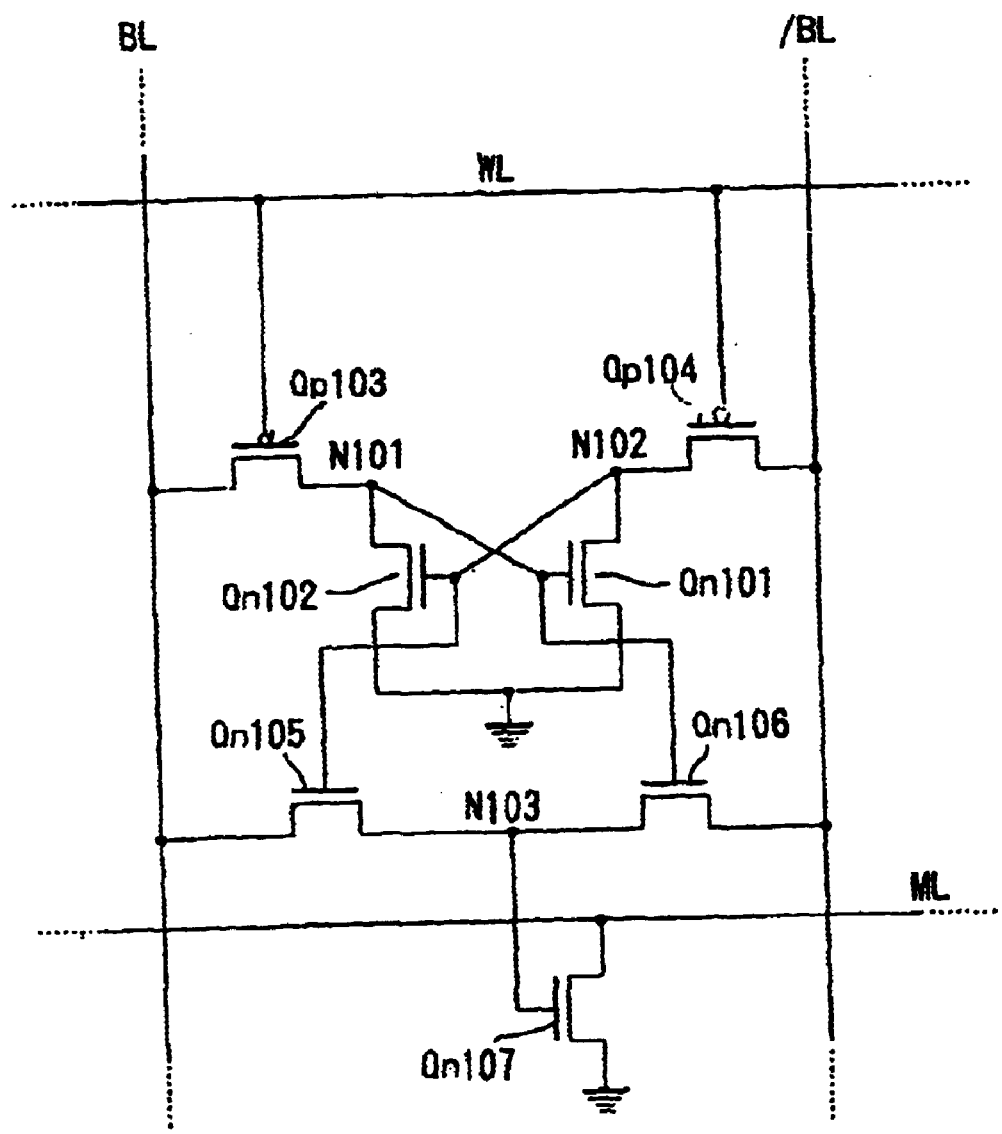
FIG. 9 is a circuit diagram of an example of the configuration of a binary CAM cell according to a second embodiment of the present invention.

FIG. 9 is a circuit diagram of an example of the configuration of a binary CAM cell according to the second embodiment of the present invention.

In FIG. 9, notation Qp103 and notation Qp104 designate p-type MOS transistors, notation Qn101, notation Qn102, and notation Qn105 to notation Qn107 designate n-type MOS transistors, notation WL designates a word line, notation BL and the notation/BL designate a bit line pair, and notation ML designates a mismatch detection line.

In the n-type MOS transistor Qn102, the drain and source terminals are connected between the storage node N101 and the reference potential, and the gate is connected to the storage node N102.

In the n-type MOS transistor Qn101, the drain and source terminals are connected between the storage node N102 and the reference potential, and the gate is connected to the storage node N101.

In the p-type MOS transistor Qp103, the source and drain terminals are connected between the bit line BL and the storage node N101, and the gate is connected to the word line WL.

In the p-type MOS transistor Qp104, the source and drain terminals are connected between the bit line /BL and the storage node N102, and the gate is connected to the word line WL.

In the n-type MOS transistor Qn105 and the n-type MOS transistor Qn106, the source and drain terminals are connected in series between the bit line BL and the bit line /BL with a node N103 as the midpoint of the connection. Also, the gate of the n-type MOS transistor Qn105 is connected to the storage node N102, and the gate of the n-type MOS transistor Qn106 is connected to the storage node N101.

In the n-type MOS transistor Qn107, the gate is connected to the node N103, and the source and drain terminals are connected between the mismatch detection line ML and the reference potential.

Next, an explanation will be made of the operation of the binary CAM cell of FIG. 9 having the above configuration.

The circuit obtained by connecting the inputs and the outputs of the inverter comprised by the n-type MOS transistor Qn102 using the storage node N102 as an input and using the storage node N101 as an output and the inverter comprised by the n-type MOS transistor Qn101 using the storage node N101 as an input and using the storage node N102 as an output in the form of a ring forms a memory circuit which can store one bit of data. For example, it forms a memory circuit storing a state where the storage node N101 becomes the high level and the storage node N102 becomes the low level as the logical value "1" and storing a state where the storage node N101 becomes the low level and the storage node N102 becomes the high level as the logical value "0".

The p-type MOS transistor Qp103 and the p-type MOS transistor Qp104 are transistors for controlling the access from the bit line BL and the bit line /BL to the storage nodes. In the period of holding the stored data, the word line WL is pulled up to the high level by the address power supply unit 16, and these transistors become off. By this, each storage node and bit line pair become separated.

Note that the leakage current of the p-type MOS transistor Qp103 and the p-type MOS transistor Qp104 is set so as to become larger than that of the n-type MOS transistor Qn102 and the n-type MOS transistor Qn101 by for example about 100 times. This leakage current is supplied to the n-type MOS transistor Qn102 and the n-type MOS transistor Qn101. Namely, the p-type MOS transistor Qp103 and the p-type MOS transistor Qp104 also perform a role as load transistors for holding the memory state of the memory device.

When the stored data of the CAM cell is read, the bit line BL and the bit line /BL are pulled up to the power supply voltage Vcc in advance by the data power supply unit 17, and the word line WL selected at the address controller 11 in this state is pulled down to the reference potential. By this, the p-type MOS transistor Qp103 and the p-type MOS transistor Qp104 become on, and the voltages of the bit line BL and the bit line /BL change in accordance with the stored data of the CAM cell.

For example, when the storage node N101 is at the high level and the storage node N102 is at-the low level, the bit line BL and the storage node N101 have almost equal voltages and the n-type MOS transistor Qn102 is in the off state, so no current flows through the p-type MOS transistor Qp103 and the potential of the bit line BL remains at the power supply voltage Vcc and does not change. On the other hand, the bit line /BL has a higher voltage than the storage node N102 and the n-type MOS transistor Qn101 is in the on state, so the current flows from the bit line /BL to the storage node N102 and the potential of the bit line /BL falls. This potential difference (or current difference) between the bit line BL and the bit line /BL is amplified by the reading use differential amplifier circuit of the data input/output unit 13 and output as the data of the logical value "1" or the logical value "0" to the data line.

When the stored data is written into the CAM cell, either of the bit line BL and the bit line /BL is pulled down to the reference potential and the other is pulled up to the power supply voltage Vcc in accordance with the write data input to the data input/output unit 13. By setting the word line WL selected by the address controller 11 at the low level in this state, the p-type MOS transistor Qp103 and the p-type MOS transistor Qp104 become on, and the levels of the storage node N101 and the storage node N102 are set to levels in accordance with the write data.

When the match search between the stored data of the CAM cell and the search data is carried out, in the inactive state where the word line WL is pulled up to the power supply voltage Vcc by the address power supply unit 16, either of the bit line BL or the bit line /BL is pulled down to the reference potential and the other is pulled up to the power supply voltage Vcc in accordance with the value of the search data input to the data input/output unit 13. Also, at this time, the mismatch detection line ML is pulled up to the power supply voltage Vcc by the address power supply unit 16.

Here, the match search operation of this binary CAM cell will be explained by concretely showing the search data and the stored data. In the following explanation, assume that the bit line BL is set at the high level and the bit line /BL is set at the low level when the search data has the logical value "1" and that reverse levels thereto are set in these bit lines when the search data has the logical value "0". Also, assume that the storage node N101 becomes the high level and the storage node N102 becomes the low level when the stored data of the CAM cell has the logical value "1" and that levels reverse to those are held in the storage nodes when the stored data has the logical value "0".

For example, when the search data input from the bit line has the logical value "1" and the stored data has the logical value "0", the storage node N101 becomes the low level, so the n-type MOS transistor Qn106 becomes off and the storage node N102 becomes the high level, therefore the n-type MOS transistor Qn105 becomes on. Accordingly, positive charges are supplied from the bit line BL to the node N103 via the n-type MOS transistor Qn105 and it is charged to the high level, so the n-type MOS transistor Qn107 becomes on and the mismatch detection line ML becomes the low level.

When the search data has the logical value "0" and the stored data has the logical value "1", the n-type MOS transistor Qn105 becomes off, the n-type MOS transistor Qn106 becomes on, and the mismatch detection line ML similarly becomes the low level.

When both of the search data and the stored data have the logical value "1", the storage node N102 becomes the low level, so the n-type MOS transistor Qn105 becomes off and the storage node N101 becomes the high level, therefore the n-type MOS transistor Qn106 becomes on. At this time, since the bit line /BL is at the low level, the node N103 becomes the low level, the n-type MOS transistor Qn107 becomes off, and the mismatch detection line ML becomes the high level.

When both of the search data and the stored data have the logical value "0", the n-type MOS transistor Qn105 becomes on and the n-type MOS transistor Qn106 becomes off. At this time, the bit line BL is at the low level, so the node N103 becomes the low level and the mismatch detection line ML similarly becomes the high level.

In this way, the mismatch detection line ML is activated and becomes the low level when the stored data and the search data do not match, while it becomes the high level when the stored data and the search data match. Also, one type of NOR circuit is formed by a common mismatch detection line ML and n-type MOS transistors Qn107 of a plurality of CAM cells connected in parallel to this. If there is even one CAM cell wherein the stored data and the search data do not match in these plurality of CAM cells, the common mismatch detection line ML is activated and becomes the low level. Accordingly, by only searching for the high level mismatch detection line ML from among all mismatch detection lines ML of the CAM cell array, the address of the stored data matching with the search data can be searched for from among all stored data.

Figure 25:
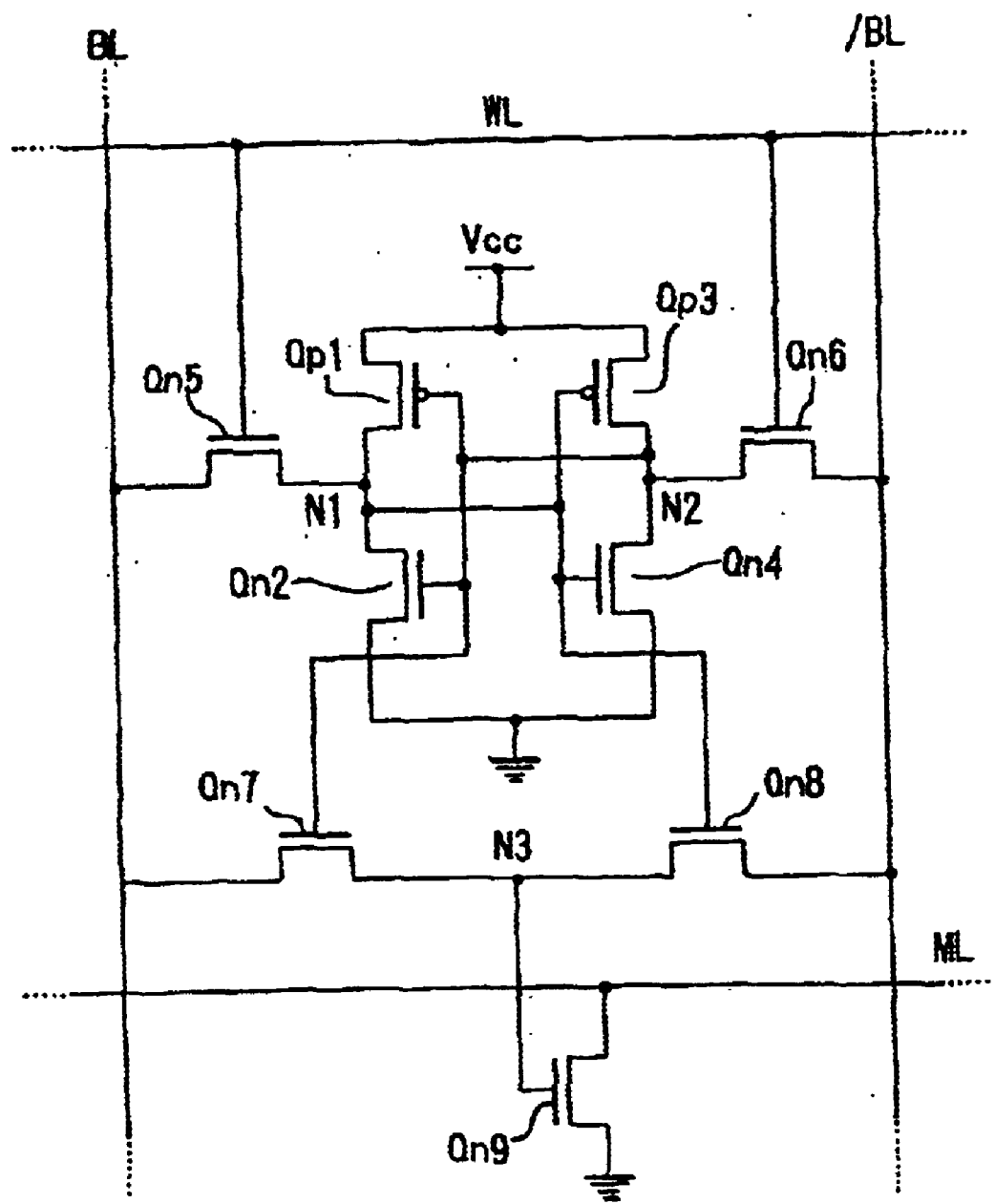
FIG. 25 is a circuit diagram of an example of the configuration of a binary CAM cell having an SRAM type memory circuit.
Figure 26:
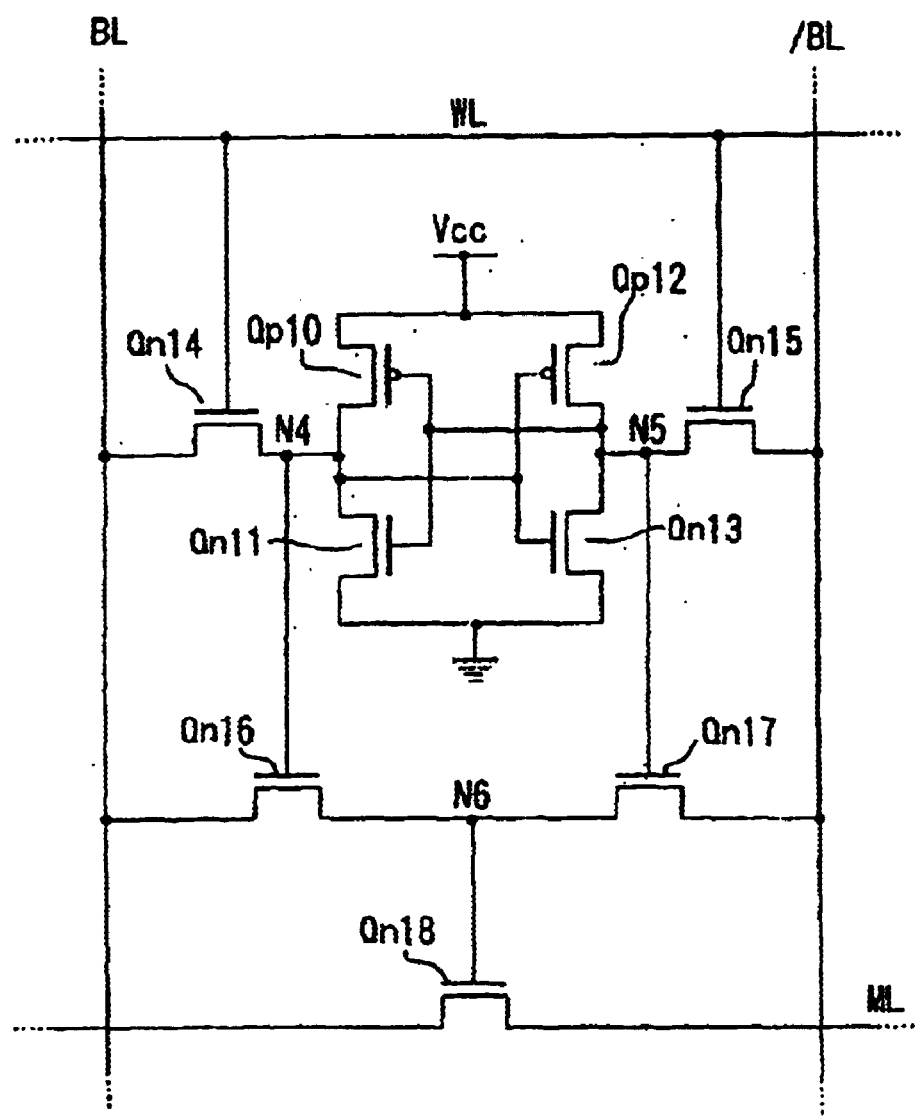
FIG. 26 is a circuit diagram of an example of another configuration of a binary CAM cell having an SRAM type memory circuit.

As explained above, according to the binary CAM cell shown in FIG. 9, an operation equivalent to that of the binary CAM shown in FIG. 25 and FIG. 26 is possible and, further, the number of used transistors can be decreased from nine to seven in comparison with the binary CAM cell of FIG. 25 and FIG. 26. Namely, the cell area can be reduced by about one-fourth, so the degree of integration of the circuit can be improved.

Also, in the binary CAM cell shown in FIG. 9, the load transistors (the p-type MOS transistor Qp1 and p-type MOS transistor Qp3 in FIG. 25 and the p-type MOS transistor Qp10 and the p-type MOS transistor Qp12 in FIG. 26) for pulling up the storage nodes to the power supply voltage Vcc are omitted, so the write speed of the data is raised and the read speed of the data falls. In the usual usage method of the associative memory, the writing of data and match search are frequently carried out, while read operations of the data are merely carried out, so the entire operation speed can be raised by increasing the write speed.

Figure 24:
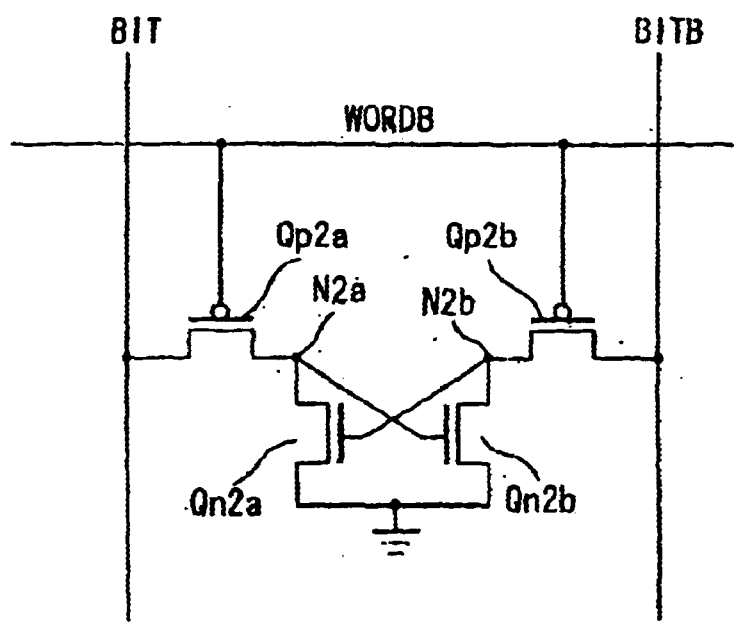
FIG. 24 is a circuit diagram of a four-transistor type SRAM cell.

Note, the binary CAM cell shown in FIG. 9 has a memory circuit (n-type MOS transistor Qn101, n-type MOS transistor Qn102, p-type MOS transistor Qp103, and p-type MOS transistor Qp104) having a configuration equivalent to that of the four-transistor type SRAM cell shown in FIG. 24, therefore, as explained in the first embodiment, there is the disadvantage of the reduction of the SNM at the time of reading at a particularly low voltage.

Therefore, in the reading period of the data, it is also possible to make the data power supply unit 17 perform control so that the pullup voltage of the bit line BL and the bit line /BL becomes a higher voltage than the power supply voltage Vcc.

Figure 10:
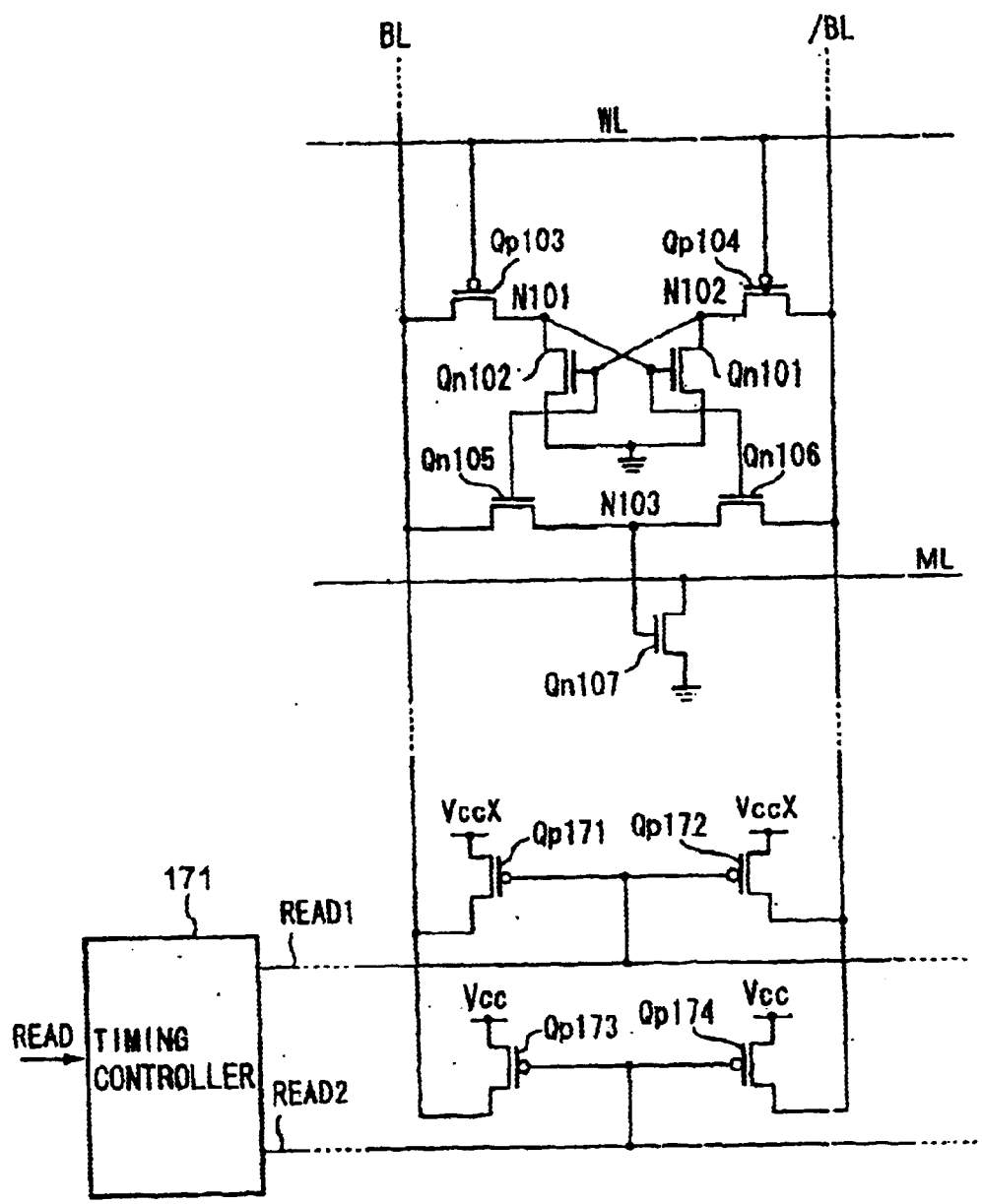
FIG. 10 is a circuit diagram of an example of the configuration of a data power supply unit for supplying power to each bit line of the binary CAM cell shown in FIG. 9.

FIG. 10 is a circuit diagram of an example of the configuration of such a data power supply unit 17.

In the example of FIG. 10, the data power supply unit 17 includes a p-type MOS transistor Qp171 to p-type MOS transistor Qp174 and a timing controller 171. Other than them, the same notations of FIG. 10 and FIG. 9 designate the same components.

Note that the example of FIG. 10 shows the example of a circuit of the data power supply unit 17 corresponding to a pair of bit lines. While not particularly shown, a similar circuit is provided also for other bit line pairs.

As shown in FIG. 10, each bit line pair is connected via the p-type MOS transistor Qp171 and the p-type MOS transistor Qp172 to the boost voltage VccX, and the gate signal READ1 of the timing controller 171 is input to the gates of the p-type MOS transistor Qp171 and the p-type MOS transistor Qp172.

Also, each bit line pair is connected to the power supply voltage Vcc via the p-type MOS transistor Qp173 and the p-type MOS transistor Qp174, and the gate signal READ2 of the timing controller 171 is input to the gates of the p-type MOS transistor Qp173 and the p-type MOS transistor Qp174.

The timing controller 171 receives the control signal READ which becomes active at the time of reading of the data and sets the gate signal READ1 at the low level and sets the gate signal READ2 at the high level in the reading period of the data. By this, the p-type MOS transistor Qp171 and the p-type MOS transistor Qp172 become on and the p-type MOS transistor Qp173 and the p-type MOS transistor Qp174 become off, and each bit line pair is connected to the boost voltage VccX.

Also, in the data holding period other than the reading period of the data, the gate signal READ 1 is set at the high level (boost voltage VccX) and, at the same time, the gate signal READ2 is set at the low level. By this, the p-type MOS transistor Qp171 and the p-type MOS transistor Qp172 become off, the p-type MOS transistor Qp173 and the p-type MOS transistor Qp174 become on, and each bit line pair is connected to the power supply voltage Vcc.

In this way, in the reading period of the data, by setting the pullup voltage of the bit line BL and the bit line /BL at a higher voltage than the voltage (power supply voltage Vcc) of the data holding period, the power supply voltage of the CAM cell at the time of reading of the data apparently becomes high and the SNM increases. By this, the noise resistance of the CAM can be improved. Also, the amplitude of the differential signal between the pair of the bit line at the time of reading becomes large, so the read speed can be increased.

Also, the timings of the gate signal READ1 and the gate signal READ2 are set as shown in for example FIG. 3B and FIG. 4B.

At the timing chart of FIG. 3B, in a constant period at the time of start and the time of end of the reading of the data, both of the p-type MOS transistor Qp171 and p-type MOS transistor Qp172, and the p-type MOS transistor Qp173 and p-type MOS transistor Qp174 become on, so charges are reliably supplied to the memory cells and the memory state of the memory cells can be reliably held.

Also, at the timing chart of FIG. 4B, in a constant period at the time of start and the time of end of the reading of the data, both of the p-type MOS transistor Qp171 and p-type MOS transistor Qp172 and the p-type MOS transistor Qp173 and p-type MOS transistor Qp174 become off, so the power supply voltage Vcc and the boost voltage VccX are not passed and the power consumption can be reduced in comparison with the timing of FIG. 3b.

THIRD EMBODIMENT

Next, an explanation will be made of a third embodiment of the present invention. The difference between the second embodiment and the third embodiment resides in the point that the configuration of the logical circuit portion for outputting the match search result to the mismatch detection line ML in the CAM cell is different.

Note that, the overall configuration of the associative memory is similar to that of FIG. 8, so the explanation is omitted, and just the binary CAM cell will be explained by referring to FIG. 11.

Figure 11:
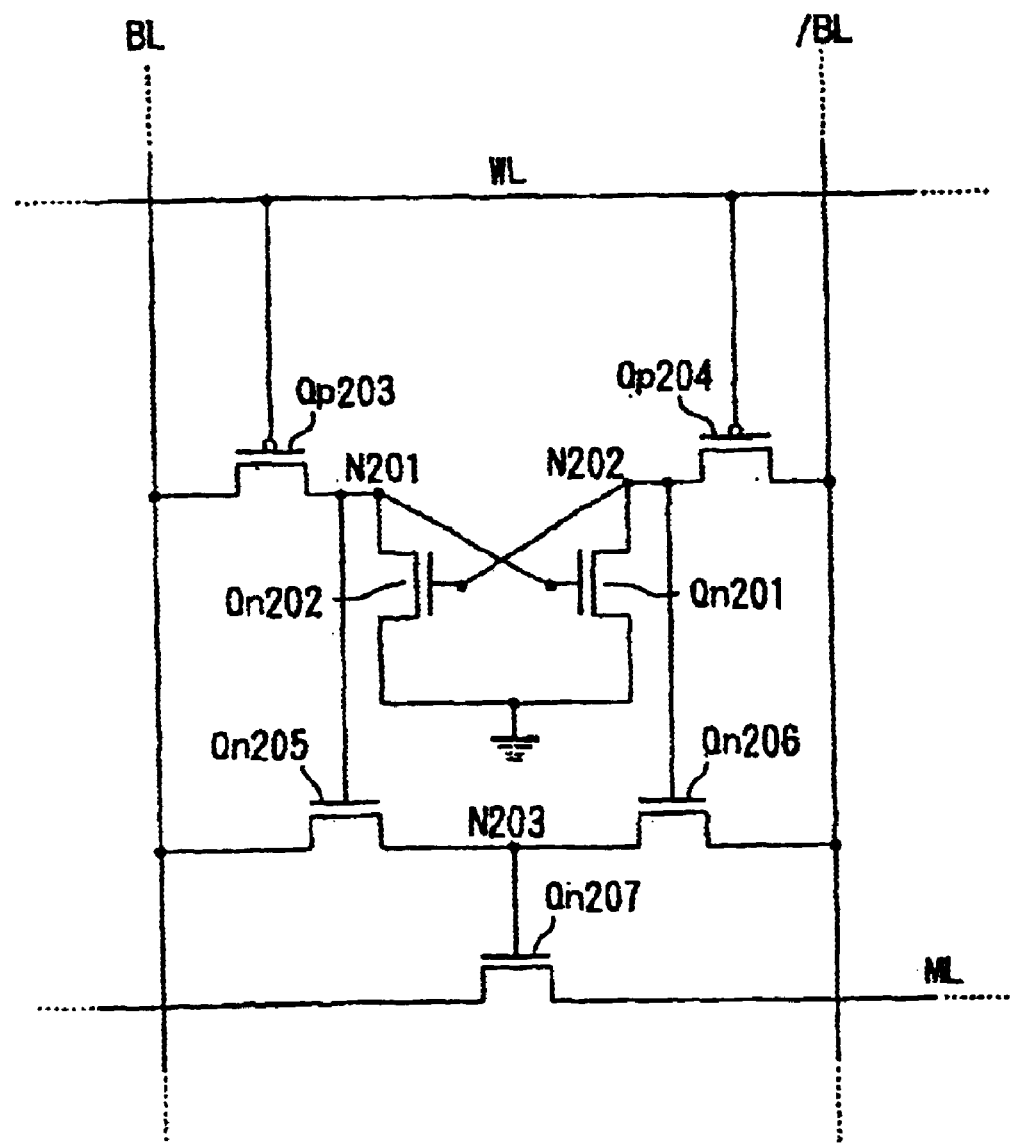
FIG. 11 is a circuit diagram of an example of the configuration of a binary CAM cell according to a second embodiment of the present invention.

FIG. 11 is a circuit diagram showing the example of the configuration of the binary CAM cell according to the third embodiment of the present invention.

In FIG. 11, notation Qp203 and notation Qp204 designate p-type MOS transistors, notation Qn201, notation Qn202, and notation Qn205 to notation Qn207 designate n-type MOS transistors, notation WL designates the word line, notation BL and notation/BL designate the bit line pair, and notation ML designates the mismatch detection line.

In the n-type MOS transistor Qn202, the drain and source terminals are connected between the storage node N201 and the reference potential, and the gate is connected to the storage node N202.

In the n-type MOS transistor Qn201, the drain and source terminals are connected between the storage node N202 and the reference potential, and the gate is connected to the storage node N201.

In the p-type MOS transistor Qp203, the source and drain terminals are connected between the bit line BL and the storage node N201, and the gate is connected to the word line WL.

In the p-type MOS transistor Qp204, the source and drain terminals are connected between the bit line /BL and the storage node N202, and the gate is connected to the word line WL.

In the n-type MOS transistor Qn205 and the n-type MOS transistor Qn206, the source and drain terminals are connected in series between the bit line BL and the bit line /BL with the node N203 as the midpoint of the connection. Also, the gate of the n-type MOS transistor Qn205 is connected to the storage node N201, and the gate of the n-type MOS transistor Qn206 is connected to the storage node N202.

In the n-type MOS transistor Qn207, the gate is connected to the node N203, and the source and drain terminals are inserted in series on the mismatch detection line ML.

Next, an explanation will be made of the operation of the binary CAM cell of FIG. 11 having the above configuration.

In the same way as the CAM cell shown in FIG. 9, the circuit obtained by connecting the inputs and outputs of the inverter comprised by the n-type MOS transistor Qn202 and the inverter comprised by the n-type MOS transistor Qn201 in the form of a ring form a memory circuit which can store one bit of data. For example, it forms a memory circuit storing a state where the storage node N201 is at the high level and the storage node N202 is at the low level as the logical value "1" and storing a state where the storage node N201 is at the low level and the storage node N202 is at the high level as the logical value "0". Also, the p-type MOS transistor Qp203 and the p-type MOS transistor Qp204 control the access from the bit line BL and the bit line /BL to the storage nodes.

The read operation and write operation of the stored data with respect to this memory circuit are similar to those of the binary CAM cell of FIG. 9 mentioned above, so the explanation of these operations will be omitted. Below, an explanation will be made of the match search operation.

When a match search between the stored data of the CAM cell and the search data is carried out, in the state where the word line WL is pulled up to the power supply voltage Vcc by the address power supply unit 16, either of the bit line BL or the bit line /BL is pulled down to the reference potential and the other is pulled up to the power supply voltage Vcc in accordance with the value of the search data input to the data input/output unit 13. Also, at this time, the current is being supplied to the mismatch detection line ML by the address power supply unit 16. For example, current is supplied to the mismatch detection line ML by the pullup of one end of the mismatch detection line ML to the power supply voltage Vcc and the connection of the other end to the reference potential by the load of the constant current circuit, resistor, or the like.

For example, when the search data input from the bit line has the logical value "1" and the stored data has the logical value "0", the storage node N201 becomes the low level, so the n-type MOS transistor Qn205 becomes off and the storage node N202 becomes the high level, therefore the n-type MOS transistor Qn206 becomes on. At this time, since the bit line /BL is at the low level, the node N203 becomes the low level, the n-type MOS transistor Qn 207 becomes off, and the current flowing through the mismatch detection line ML is cut off.

When the search data has the logical value "0" and the stored data has the logical value "1", the n-type MOS transistor Qn206 becomes off and the n-type MOS transistor Qn205 becomes on. At this time, the bit line BL is at the low level, so the node N203 becomes the low level, the n-type MOS transistor Qn207 becomes off, and the current flowing through the mismatch detection line ML is similarly cut off.

When both of the search data and the stored data have the logical value "1", the n-type MOS transistor Qn206 becomes off since the storage node N202 becomes the low level, and the n-type MOS transistor Qn205 becomes on since the storage node N201 becomes the high level. At this time, the bit line BL is at the high level, so the node N203 becomes the high level. the n-type MOS transistor Qn207 becomes on, and the current of the mismatch detection line ML is not cut off.

When both of the search data and the stored data have the logical value "0", the n-type MOS transistor Qn206 becomes on and the n-type MOS transistor Qn205 becomes off. At this time, since the bit line /BL is at the high level, the node N203 becomes the high level, the n-type MOS transistor Qn207 becomes on, and the current of the mismatch detection line ML is similarly not cut off.

In this way, the current of the mismatch detection line ML is cut off when the stored data and the search data do not match, while it is not cut off when they match. Also, one type of NAND circuit is formed by the n-type MOS transistors Qn207 of a plurality of CAM cells inserted on the mismatch line. If there is even one CAM cell wherein the stored data and the search data do not match in these plurality of CAM cells, the common mismatch detection line ML is activated and the current is cut off. Accordingly, by only searching for the mismatch detection line ML wherein the current is not cut off from among all mismatch detection lines ML of the CAM cell array, the address of the stored data matching with the search data can be searched for from among all stored data.

Note that, existence of current flowing through the mismatch detection line ML can be judged by pulling up one end of the mismatch detection line ML to the power supply voltage Vcc by for example the address power supply unit 16 and, at the same time, connecting the load of a constant current circuit, resistor, or the like between the other end and the reference potential and checking the voltages of both ends of this load.

As explained above, in the binary CAM cell shown in FIG. 11 as well, an operation equivalent to that of the binary CAM shown in FIG. 25 and FIG. 26 is possible and, further, the number of the used transistors can be decreased from nine to seven in comparison with the binary CAM cell of FIG. 25 and FIG. 26. Namely, the cell area can be reduced by about one-fourth, and the degree of integration of the circuit can be improved.

Also, the write speed of the data can be raised in the same way as the CAM cell of FIG. 9, so the overall operation speed of the associative memory can be raised.

Also in the binary CAM cell shown in FIG. 11, in the same way as the binary CAM cell of FIG. 9, it is also possible to make the data power supply unit 7 perform control for boosting the pullup voltage of the bit line BL and the bit line /BL to a voltage higher than the usual power supply voltage Vcc in the reading period of the data.

Figure 12:
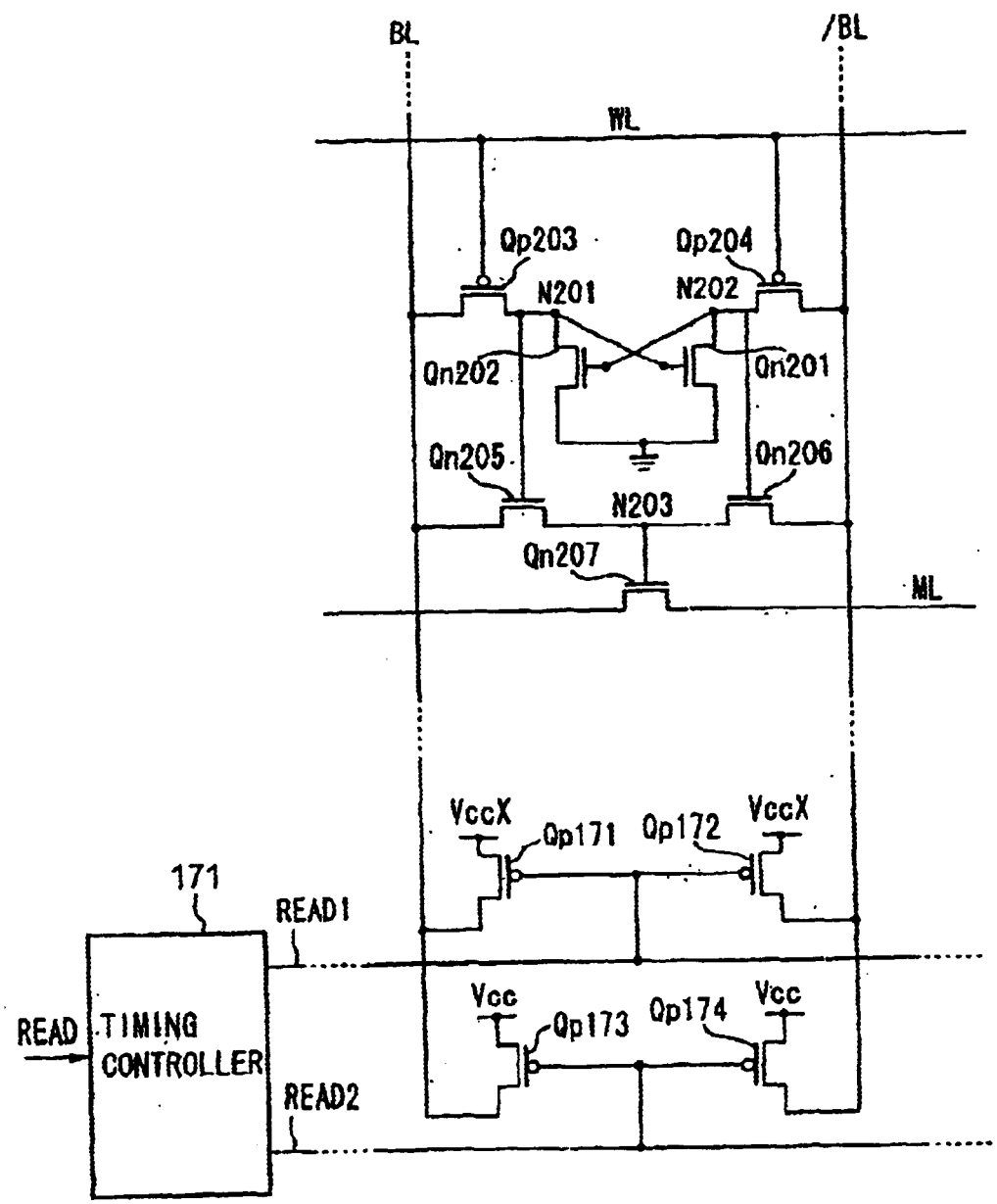
FIG. 12 is a circuit diagram of an example of the configuration of a data power supply unit for supplying power to each bit line of the binary CAM cell shown in FIG. 11.

FIG. 12 is a circuit diagram of an example of the configuration of such a data power supply unit 17. The same notations of FIG. 12, FIG. 10, and FIG. 11 designate same components.

Also in FIG. 12, in the same way as FIG. 10, the bit lines are connected via the p-type MOS transistor Qp171 and the p-type MOS transistor Qp172 to the boost voltage VccX and, at the same time, connected via the p-type MOS transistor Qp173 and the p-type MOS transistor Qp174 to the power supply voltage Vcc.

Further, in accordance with the gate signal READ1 and the gate signal READ2 generated by the timing controller 171, in the reading period of the data, the p-type MOS transistor Qp171 and the p-type MOS transistor Qp172 become on, the p-type MOS transistor Qp173 and the p-type MOS transistor Qp174 become off, and each bit line pair is connected to the boost voltage VccX. In the period for holding the data, the p-type MOS transistor Qp171 and the p-type MOS transistor Qp172 become off, the p-type MOS transistor Qp173 and the p-type MOS transistor Qp174 become on, and each bit line pair is connected to the power supply voltage Vcc.

In this way, in the reading period of the data, by setting the pullup voltage of the bit line BL and the bit line /BL at the boost voltage VccX higher than the voltage (power supply voltage Vcc) of the data holding period, the power supply voltage of the CAM cell at the time of reading of the data apparently becomes high and the SNM increases. By this, the noise resistance of the CAM can be improved. Also, the amplitude of the differential signal between the pair of bit line at the time of reading becomes large, so the read speed can be increased.

Also, the timings of the gate signal READ1 and the gate signal READ2 are set as shown in for example FIG. 3B and FIG. 4B. At the timing of FIG. 3B, the memory state of the memory can be reliably held, while at the timing of FIG. 4B, the power consumption can be reduced in comparison with the timing of FIG. 3b.

FOURTH EMBODIMENT

Next, an explanation will be made of a fourth embodiment of the present invention.

The CAM cells in the second embodiment and the third embodiment mentioned above store binary data, but the CAM cell in the fourth embodiment stores ternary data by 2 bits' worth of memory circuits.

Also, the fourth embodiment is different from the above embodiments in the point that there are two word lines and a search data line is added other than the bit line pair as a data line.

Due to such a difference, the operations of the address controller 11 and the data input/output unit 13 are slightly different from those of the second embodiment and the third embodiment.

Namely, the address controller 11 independently activates the two word lines (word line WLa and word line WLb) corresponding to the intended write address in accordance with the write operation to the two memory circuits (first memory circuit and second memory circuit) mentioned later at the time of the writing of data. At the time of reading data, two word lines corresponding to the intended read address are independently activated in accordance with the read operation from the first memory circuit or the second memory circuit. In the data holding period and at the time of a match search, both of two word lines are deactivated.

Also, at the time of writing of data, the data input/output unit 13 outputs the data to be stored in the first memory circuit or the second memory circuit to the bit line pair bit by bit in accordance with the timing of the activation of two word lines. At the time of reading the data, it receives as input the data read from the first memory circuit or the second memory circuit from the bit line pair bit by bit in accordance with the timing when the two word lines are activated. At the time of a match search of the data, it outputs one bit of the search data to the search data line pair (search data line SD and search data line /SD).

The rest of the configuration of FIG. 8 is substantially the same as those of the second embodiment and the third embodiment, so the explanation will be omitted. Below, an explanation will be made of the ternary CAM cell by referring to FIG. 13.

Figure 13:
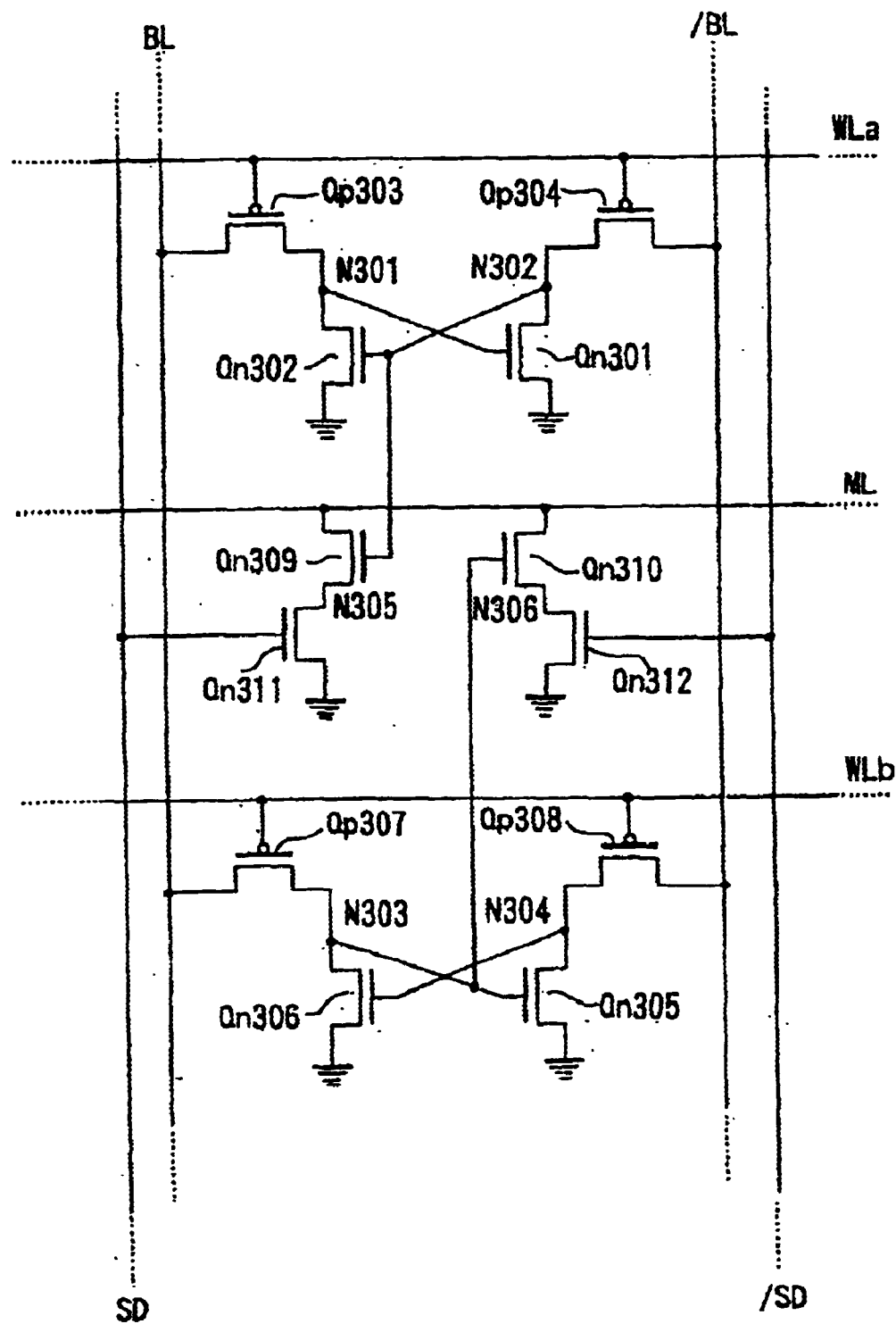
FIG. 13 is a circuit diagram of an example of the configuration of a ternary CAM cell according to a third embodiment of the present invention.

FIG. 13 is a circuit diagram of an example of the configuration of a ternary CAM cell according to a third embodiment of the present invention.

In FIG. 13, notation Qp303, notation Qp304, notation Qp307, and notation Qp308 designate p-type MOS transistors, notation Qn301, notation Qn302, notation Qn305, notation Qn306, and notation Qn309 to notation Qn312 designate n-type MOS transistors, notation WLa and notation WLb designate word lines, notation BL and notation/BL designate a bit line pair, notation ML designates the mismatch detection line, and notation SD and notation/ SD designate a search data line pair.

In the n-type MOS transistor Qn302, the drain and source terminals are connected between the storage node N301 and the reference potential, and the gate is connected to the storage node N302.

In the n-type MOS transistor Qn301, the drain and source terminals are connected between the storage node N302 and the reference potential, and the gate is connected to the storage node N301.

In the p-type MOS transistor Qp303, the source and drain terminals are connected between the bit line BL and the storage node N301, and the gate is connected to the word line WLa.

In the p-type MOS transistor Qp304, the source and drain terminals are connected between the bit line /BL and the storage node N302, and the gate is connected to the word line WLa.

In the n-type MOS transistor Qn306, the drain and source terminals are connected between the storage node N303 and the reference potential, and the gate is connected to the storage node N304.

In the n-type MOS transistor Qn305, the drain and source terminals are connected between the storage node N304 and the reference potential, and the gate is connected to the storage node N303.

In the p-type MOS transistor Qp307, the source and drain terminals are connected between the bit line BL and the storage node N303, and the gate is connected to the word line WLb.

In the p-type MOS transistor Qp308, the source and drain terminals are connected between the bit line /BL and the storage node N304, and the gate is connected to the word line WLb.

In the n-type MOS transistor Qn309 and the n-type MOS transistor Qn311, the source and drain terminals are connected in series between the mismatch detection line ML and the reference potential with the node N305 as the midpoint of connection. The gate of the n-type MOS transistor Qn309 is connected to the storage node N302, and the gate of the n-type MOS transistor Qn311 is connected to the search data line SD.

In the n-type MOS transistor Qn310 and the n-type MOS transistor Qn312, the source and drain terminals are connected in series between the mismatch detection line ML and the reference potential with the node N306 as the midpoint of connection. The gate of the n-type MOS transistor Qn310 is connected to the storage node N303, and the gate of the n-type MOS transistor Qn312 is connected to the search data line /SD.

Next, an explanation will be made of the ternary CAM cell of FIG. 13 having the above configuration.

The ternary CAM cell shown in FIG. 13 has two memory circuits of the four-transistor type SRAM cell explained in the first embodiment. Three values are distinguished by the combination of the data of the logical value "1" or the logical value "0" stored in these two memory circuits.

Namely, the first memory circuit is formed by the n-type MOS transistor Qn301, n-type MOS transistor Qn302, p-type MOS transistor Qp303, and the p-type MOS transistor Qp304. Access from the bit line pair to the storage node N301 and the storage node N302 is controlled by the p-type MOS transistor Qp303 and the p-type MOS transistor Qp304 becoming on or off in accordance with the voltage of the word line WLa.

Also, the second memory circuit is formed by the n-type MOS transistor Qn305, n-type MOS transistor Qn306, p-type MOS transistor Qp307, and the p-type MOS transistor Qp308. Access from the bit line pair to the storage node N303 and the storage node N304 is controlled by the p-type MOS transistor Qp307 and the p-type MOS transistor Qp308 becoming on or off in accordance with the voltage of the word line WLb.

The read operation or the write operation of the data with respect to these first memory circuit and second memory circuit are similar to those of the memory circuit of the binary CAM cell explained in FIG. 9 and FIG. 11, so the explanation of these operations will be omitted. Below, an explanation will be made of the match search operation in the ternary CAM cell.

Note that, in the following concrete example, assume that the search data line SD is set at the high level and the search data line /SD is set at the low level when the search data has the logical value "1" and that levels reverse to those are set in the bit lines when the search data has the logical value "0".

Also, assume that the storage node N301 and the storage node N303 become the high level and the storage node N302 and the storage node N304 become the low level when the stored data of the ternary CAM cell has the logical value "1", the nodes becomes levels reverse to those when the stored data has the logical value "0", and the storage node N302 and the storage node N303 become the low level and the storage node N301 and the storage node N304 become the high level in the case of the logical value "x".

When a match search between the stored data of the CAM cell and the search data is carried out, in the state where the word line WLa and the word line WLb are deactivated to the low level, either of the search data line SD or the search data line /SD is pulled down to the reference potential and the other is pulled up to the power supply voltage Vcc in accordance with the value of the search data. Also, the mismatch detection line ML is pulled up to the power supply voltage Vcc by the address power supply unit 16.

For example, when the search data has the logical value "1" and the stored data has the logical value "0", the storage node N302 becomes the high level and the n-type MOS transistor Qn309 becomes on and the storage node N303 becomes the low level and the n-type MOS transistor Qn310 becomes off. Also, since the search data line SD is at the high level, the n-type MOS transistor Qn311 becomes on, while since the search data line /SD is at the low level, the n-type MOS transistor Qn312 becomes off. Accordingly, the serial circuit of the n-type MOS transistor Qn309 and the n-type MOS transistor Qn311 becomes on, and the mismatch detection line ML becomes the low level.

When the search data has the logical value "0" and the stored data has the logical value "1", the serial circuit of the n-type MOS transistor Qn310 and the n-type MOS transistor Qn312 becomes on, and the mismatch detection line ML similarly becomes the low level.

When both of the search data and the stored data have the logical value "1", the n-type MOS transistor Qn309 and the n-type MOS transistor Qn312 become off, so both of the serial circuit of the n-type MOS transistor Qn309 and the n-type MOS transistor Qn311 and the serial circuit of the n-type MOS transistor Qn310 and the n-type MOS transistor Qn312 become off. Accordingly, the mismatch detection line ML is held at the high level.

When both of the search data and the stored data have the logical value "0", both of the n-type MOS transistor Qn310 and the n-type MOS transistor Qn311 become off, so both of the serial circuit of the n-type MOS transistor Qn309 and the n-type MOS transistor Qn311 and the serial circuit of the n-type MOS transistor Qn310 and the n-type MOS transistor Qn312 similarly become off. Also, in this case, the mismatch detection line ML is held at the high level.

Also, when the stored data of the ternary CAM cell has the logical value "x", both of the storage node N302 and the storage node N303 become the low level, so both of the n-type MOS transistor Qn309 and the n-type MOS transistor Qn310 become off. Accordingly, irrespective of the value of the search data, both of the serial circuit of the n-type MOS transistor Qn309 and the n-type MOS transistor Qn311 and the serial circuit of the n-type MOS transistor Qn310 and the n-type MOS transistor Qn312 become off, and the mismatch detection line ML is held at the high level.

In this way, the mismatch detection line ML is activated and becomes the low level when the stored data and the search data do not match, while is held at the high level when they match. Also, one type of NOR circuit is formed by the common mismatch detection line ML and the n-type MOS transistor Qn309 to the n-type MOS transistor Qn312 of a plurality of CAM cells parallely connected to this. If there is even one CAM cell wherein the stored data and the search data do not match among these plurality of CAM cells, the common mismatch detection line ML is activated and becomes the low level. Accordingly, by judging the level of the mismatch detection line ML for every address corresponding to each word line, the address of the stored data matching with the search data can be searched for.

Further, when the logical value "x" is stored in the ternary CAM cell, the mismatch detection line ML is set at the high level irrespective of the value of the search data, and it is judged that the search data and the stored data match.

Figure 27:
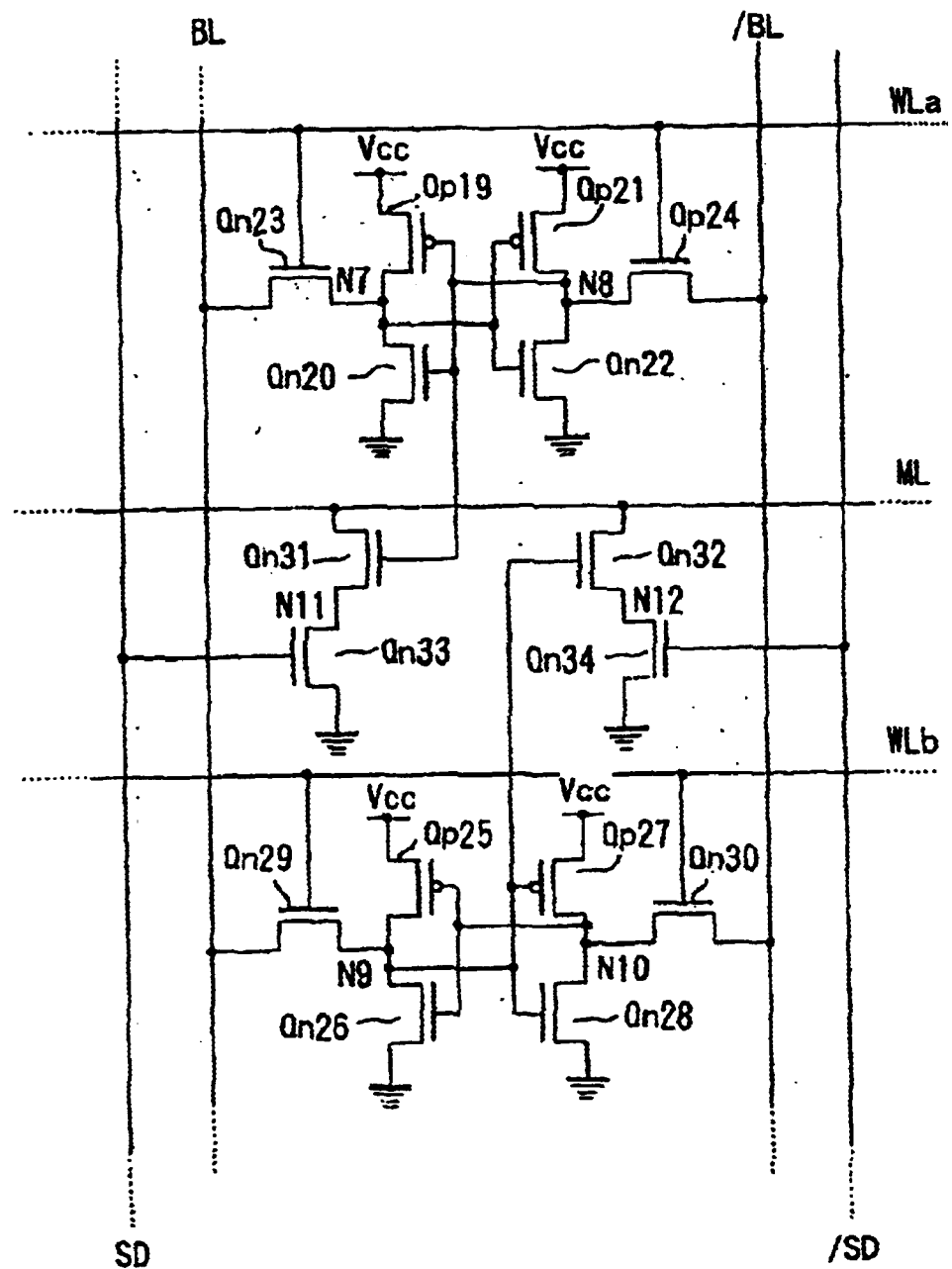
FIG. 27 is a circuit diagram of an example of another configuration of a ternary CAM cell having an SRAM type memory circuit.

As explained above, in the ternary CAM cell shown in FIG. 13, an operation equivalent to that of the ternary CAM cell shown in FIG. 27 is possible and, further the number of used transistors can be decreased from 16 to 12 in comparison with the ternary CAM cell of FIG. 27. Namely, the cell area can be reduced by about one-fourth, and the degree of integration of the circuit can be improved.

Also, since the write speed of the data can be raised in the same way as the CAM cells of FIG. 9 and FIG. 11, the overall operation speed of the associative memory can be raised in comparison with the ternary CAM cell of FIG. 27.

Also in the ternary CAM cell shown in FIG. 13, in the same way as the CAM cells of FIG. 9 and FIG. 11, in the reading period of the data, it is also possible to make the data power supply unit 17 perform control for boosting the pullup voltage of the bit line BL and the bit line /BL to a voltage higher than the usual power supply voltage Vcc.

Figure 14:
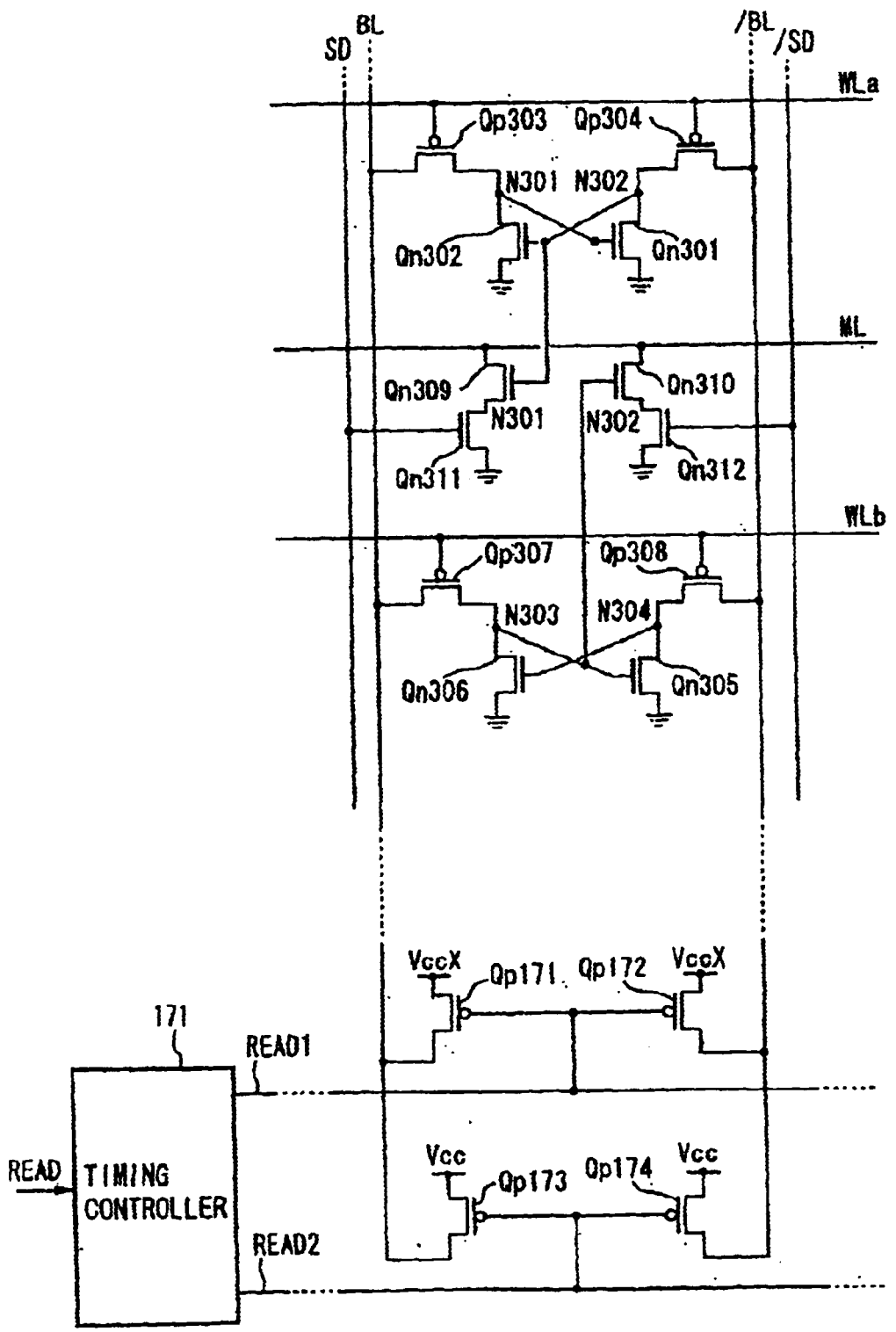
FIG. 14 is a circuit diagram of an example of the configuration of a data power supply unit for supplying power to each bit line of the ternary CAM cell shown in FIG. 13.

FIG. 14 is a circuit diagram of example of the configuration of such a data power supply unit 17. The same notations of FIG. 14, FIG. 10, and FIG. 13 designate the same components.

Also in FIG. 14, in the same way as FIG. 10, each bit line pair is connected via the p-type MOS transistor Qp171 and the p-type MOS transistor Qp172 to the boost voltage VccX and, at the same time, connected via the p-type MOS transistor Qp173 and the p-type MOS transistor Qp174 to the power supply voltage Vcc.

Then, in accordance with the gate signal READ1 and the gate signal READ2 generated by the timing controller 171, in the reading period of the data, the p-type MOS transistor Qp171 and the p-type MOS transistor Qp172 become on, the p-type MOS transistor Qp173 and the p-type MOS transistor Qp174 become off, and each bit line pair is connected to the boost voltage VccX. In the period for holding the data, the p-type MOS transistor Qp171 and the p-type MOS transistor Qp172 become off, the p-type MOS transistor Qp173 and the p-type MOS transistor Qp174 become on, and each bit line pair is connected to the power supply voltage Vcc.

Accordingly, the power supply voltage of the CAM cell at the time of reading of the data apparently becomes high and the SNM increases, so the noise resistance of the CAM can be improved. Also, the amplitude of the differential signal between the pair of bit lines at the time of reading becomes large, so the read speed can be increased.

Also, by setting the timing of the gate signal READ1 and the gate signal READ2 to the timing of FIG. 3*b*, the memory state of the memory cell can be reliably held, and by setting it to the timing of FIG. 4*b*, the power consumption can be reduced in comparison with the timing of FIG. 3*b*.

FIFTH EMBODIMENT

Next, an explanation will be made of a fifth embodiment of the present invention.

In the fourth embodiment mentioned above, there were two word lines connected to each memory cell (word line WLa and word line WLb) and one bit line pair (bit line BL and the bit line /BL). In the fifth embodiment, there is one word line and two bit line pairs.

Due to such a difference, the operations of the address controller 11 and the data input/output unit 13 are slightly different from those of the fourth embodiment.

Namely, the address controller 11 activates the word line (word line WL) corresponding to the intended write address at the time of writing of data. At the time of reading the data, the word line corresponding to the intended read address is activated. The word line is deactivated in the data holding period and at the time of a match search.

Also, the data input/output unit 13 simultaneously outputs two bits of data to be stored in the first memory circuit and the second memory circuit to the two bit line pairs at the time of the writing data. At the time of reading of the data, it simultaneously receives as input the two bits of data read from the first memory circuit and the second memory circuit from the two bit line pairs.

The rest of the configuration of FIG. 8 is substantially the same as that of the fourth embodiment.

Figure 15:
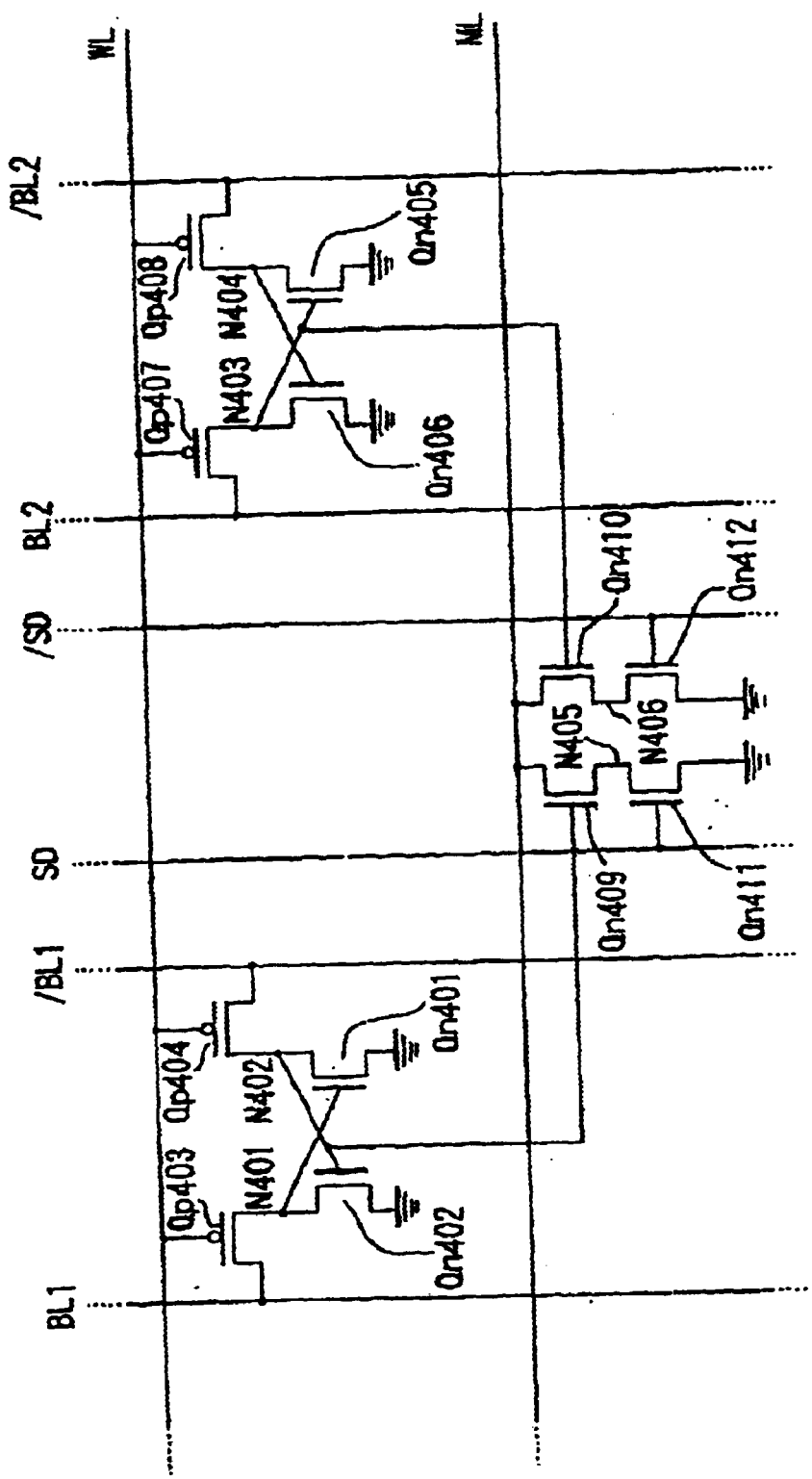
FIG. 15 is a circuit diagram of an example of the configuration of a ternary CAM cell according to a fourth embodiment of the present invention.

FIG. 15 is a circuit diagram of an example of the configuration of the ternary CAM cell according to the fifth embodiment of the present invention.

In FIG. 15, notation Qp403, notation Qp404, notation Qp407, and notation Qp408 designate p-type MOS transistors, notation Qn401, notation Qn402, notation Qn405, notation Qn406, and notation Qn409 to notation Qn412 designate n-type MOS transistors, notation WL designates the word line, notation BL1 and notation/BL1 designate a first bit line pair, notation BL2 and notation/BL2 designate a second bit line pair, notation ML designates the mismatch detection line, and notation SD and notation/SD designate a search data line pair.

In the n-type MOS transistor Qn402, the drain and source terminals are connected between the storage node N401 and the reference potential, and the gate is connected to the storage node N402.

In the n-type MOS transistor Qn401, the drain and source terminals are connected between the storage node N402 and the reference potential, and the gate is connected to the storage node N401.

In the p-type MOS transistor Qp403, the source and drain terminals are connected between the bit line BL1 and the storage node N401, and the gate is connected to the word line WL.

In the p-type MOS transistor Qp404, the source and drain terminals are connected between the bit line /BL1 and the storage node N402, and the gate is connected to the word line WL.

In the n-type MOS transistor Qn406, the drain and source terminals are connected between the storage node N403 and the reference potential, and the gate is connected to the storage node N404.

In the n-type MOS transistor Qn405, the drain and source terminals are connected between the storage node N404 and the reference potential, and the gate is connected to the storage node N403.

In the p-type MOS transistor Qp407, the source and drain terminals are connected between the bit line BL2 and the storage node N403, and the gate is connected to the word line WL.

In the p-type MOS transistor Qp408, the source and drain terminals are connected between the bit line /BL2 and the storage node N404, and the gate is connected to the word line WL.

In the n-type MOS transistor Qn409 and the n-type MOS transistor Qn411, the source and drain terminals are connected in series between the mismatch detection line ML and the reference potential with the node N405 as the midpoint of connection. The gate of the n-type MOS transistor Qn409 is connected to the storage node N402, and the gate of the n-type MOS transistor Qn411 is connected to the search data line SD.

In the n-type MOS transistor Qn410 and the n-type MOS transistor Qn412, the source and drain terminals are connected in series between the mismatch detection line ML and the reference potential with the node N406 as the midpoint of connection. The gate of the n-type MOS transistor Qn410 is connected to the storage node N403, and the gate of the n-type MOS transistor Qn412 is connected to the search data line /SD.

The ternary CAM cell of FIG. 15 having such a configuration has two memory circuits in the same way as the ternary CAM cell of FIG. 13. Three values are distinguished by the combination of the data of the logical value "1" or the logical value "0" stored in these two memory circuits.

Namely, the first memory circuit is formed by the n-type MOS transistor Qn401, n-type MOS transistor Qn402, p-type MOS transistor Qp403, and p-type MOS transistor Qp404. Access from the first bit line pair (bit line BL1 and the bit line /BL1) to the storage node N401 and the storage node N402 is controlled by the p-type MOS transistor Qp403 and the p-type MOS transistor Qp404 becoming on or off in accordance with the voltage of the word line WL.

Also, the second memory circuit is formed by the n-type MOS transistor Qn405, n-type MOS transistor Qn406, p-type MOS transistor Qp407, and p-type MOS transistor Qp408. Access from the second bit line pair (bit line BL2 and the bit line /BL2) to the storage node N403 and the storage node N404 is controlled by the p-type MOS transistor Qp407 and the p-type MOS transistor Qp408 becoming on or off in accordance with the voltage of the word line WL.

The read operation and the write operation of the data with respect to the first memory circuit and second memory circuit are similar to those of the memory circuit of the binary CAM cell explained in FIG. 9 and FIG. 11.

Also, the match search operation of the ternary data stored in these first memory circuit and second memory circuit with the search data input to the search data line pair is similar to that of the ternary CAM cell shown in FIG. 13. Namely, the mismatch detection line ML is activated and becomes the low level when the stored data and the search data do not match, while is held at the high level when they match. When the logical value "x" is stored in the ternary CAM cell, the mismatch detection line ML is held at the high level irrespective of the value of the search data.

As explained above, in the ternary CAM cell shown in FIG. 15, in the same way as the ternary CAM cell shown in FIG. 13, the degree of integration of the circuit can be improved from the ternary CAM cell shown in FIG. 27, and the overall operation speed can be increased.

Also, in the ternary CAM cell shown in FIG. 15, in the same way as FIG. 10, FIG. 12, and FIG. 14, it is also possible to make the data power supply unit 17 perform control for boosting the pullup voltage of the first bit line pair and second bit line pair to a voltage higher than the usual power supply voltage Vcc in the reading period of the data.

Figure 16:
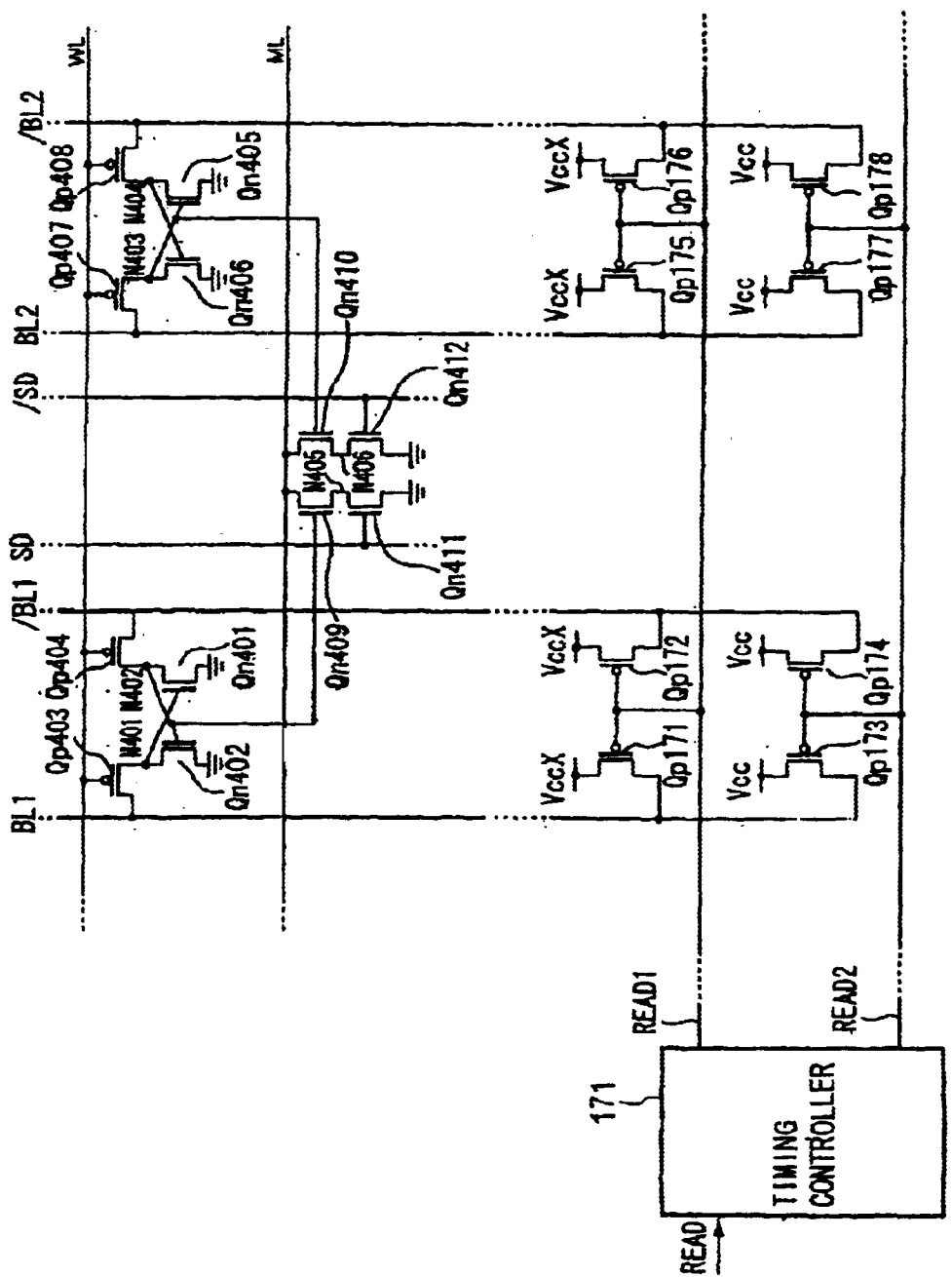
FIG. 16 is a circuit diagram of an example of the configuration of a data power supply unit for supplying power to each bit line of the ternary CAM cell shown in FIG. 15.

FIG. 16 is a circuit diagram of an example of the configuration of such a data power supply unit 17. The same notations of FIG. 16, FIG. 10, and FIG. 15 designate same components.

In FIG. 16, the first bit line pair is connected via the p-type MOS transistor Qp171 and the p-type MOS transistor Qp172 to the boost voltage VccX and, at the same time, connected via the p-type MOS transistor Qp173 and the p-type MOS transistor Qp174 to the power supply voltage Vcc. Also, the second bit line pair is connected via the p-type MOS transistor Qp175 and the p-type MOS transistor Qp176 to the boost voltage VccX and, at the same time, connected via the p-type MOS transistor Qp177 and the p-type MOS transistor Qp178 to the power supply voltage Vcc.

Then, in accordance with the gate signal READ1 and the gate signal READ2 generated by the timing controller 171, in the reading period of the data, the p-type MOS transistor Qp171, p-type MOS transistor Qp172, p-type MOS transistor Qp175, and p-type MOS transistor Qp176 become on, the p-type MOS transistor Qp173, p-type MOS transistor Qp174, p-type MOS transistor Qp177, and p-type MOS transistor Qp178 become off, and the bit line pairs are connected to the boost voltage VccX. In the period for holding the data, the p-type MOS transistor Qp171, p-type MOS transistor Qp172, p-type MOS transistor Qp175, and p-type MOS transistor Qp176 become off, the p-type MOS transistor Qp173, p-type MOS transistor Qp174, p-type MOS transistor Qp177, and p-type MOS transistor Qp178 become on, and the bit line pairs are connected to the power supply voltage Vcc.

Accordingly, the power supply voltage of the CAM cell at the time of reading of data apparently becomes high and the SNM increases, so the noise resistance of the CAM can be improved. Also, the amplitude of the differential signal between the pair of bit lines at the time of reading becomes large, so the read speed can be increased.

Also, by setting the timing of the gate signal READ1 and the gate signal READ2 to the timing of FIG. 3B, the memory state of the memory cell can be reliably held, while by setting the same to the timing of FIG. 4B, the power consumption can be reduced in comparison with the timing of FIG. 3B.

Next, an explanation will be made of a concrete structure of the case where the ternary CAM cell shown in FIG. 15 is formed on a semiconductor substrate by referring to FIG. 17 to FIG. 22.

Figure 17:
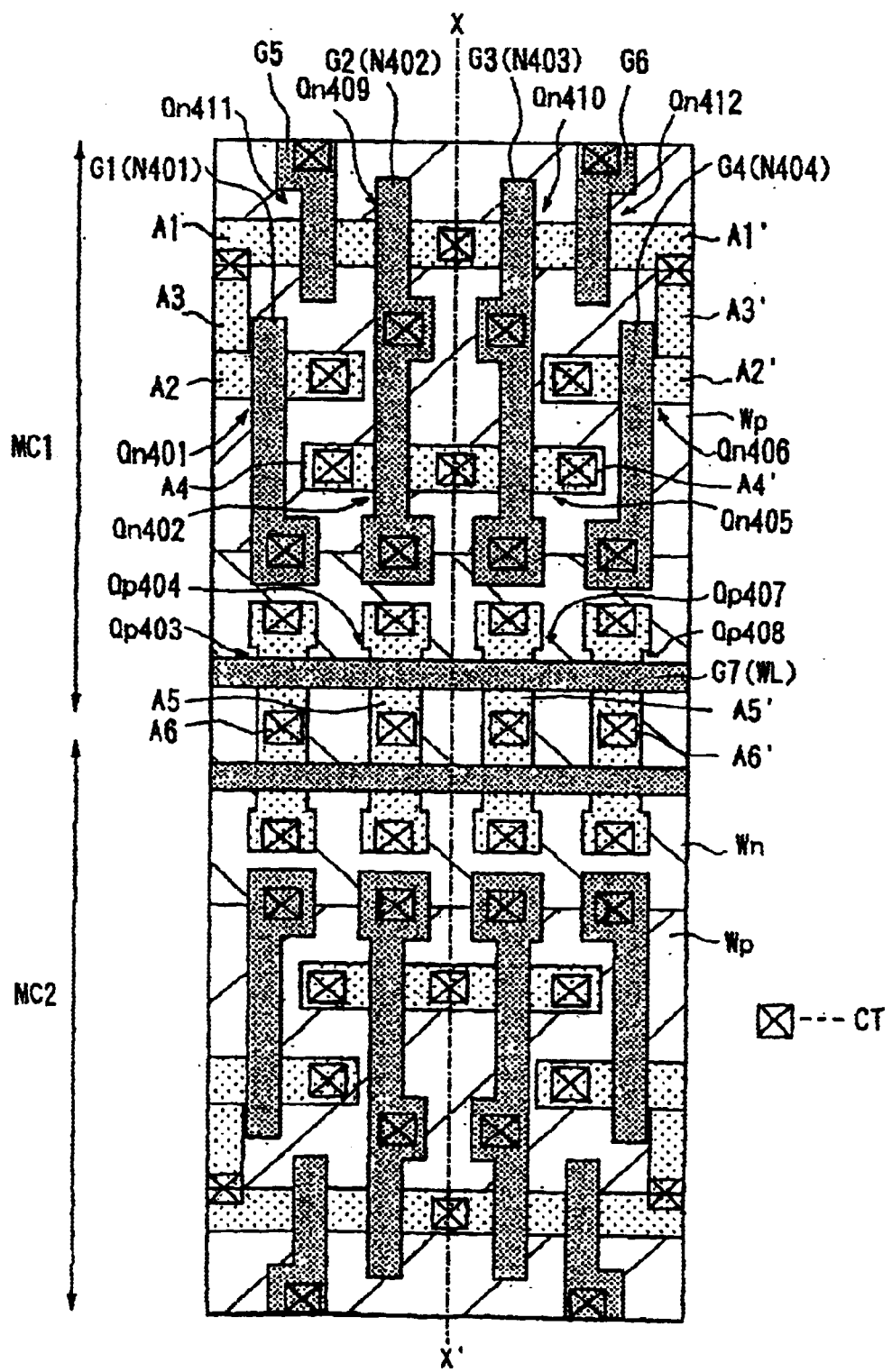
FIG. 17 is a first plan view of an example of the, structure of the ternary CAM cell shown in FIG. 15.

FIG. 17 is a first plan view of an example of the configuration of the ternary CAM cell shown in FIG. 15 and shows a layer formed with gate electrodes.

In FIG. 17, notations MC1 and MC2 designate memory cells, notation A1 to notation A6 and notation A1' to notation A6' designate active regions, notation G1 to notation G7 designate gate electrodes, notation CT designates a contact connected to an upper interconnection layer (first interconnection layer), Wn designates an n-type well, and Wp designates a p-type well. Other than them, the same notations as those of FIG. 15 designate the same components.

Note that, in the plan views of FIG. 17 to FIG. 21, illustrations of the element isolation regions and inter-layer insulation regions for insulating between the active regions are omitted.

As shown in FIG. 17, the plan structure of the memory cell becomes line symmetric with respect to a center line X–X'. Namely, in the example of FIG. 17, the first memory circuit comprised by the n-type MOS transistor Qn401, n-type MOS transistor Qn402, p-type MOS transistor Qp 403, and p-type MOS transistor Qp 404 and the serial circuit (first activation circuit) of the n-type MOS transistor Qn409 and n-type MOS transistor Qn411 comprise a first circuit formed on the left side of the center line X–X'. On the other hand, the second memory circuit comprised by the n-type MOS transistor Qn405, n-type MOS transistor Qn406, p-type MOS transistor Qp407, and p-type MOS transistor Qp 408 and the serial circuit (second activation circuit) of the n-type MOS transistor Qn410 and n-type MOS transistor Qn412 comprise a second circuit formed on the right side of the center line X–X'. These first circuit and second circuit are formed so as to exhibit a structure line symmetric with respect to the center line X–X'. Note that, FIG. 17 shows only the layer formed with the gate electrodes, but this line symmetric structure is maintained also in the upper interconnection layer mentioned later.

The n-type MOS transistor Qn409 and the n-type MOS transistor Qn411 are serially formed in the first active region A1 on the p-type well Wp. Note, the drain of the n-type MOS transistor Qn409 is formed on the center line X–X' side.

Also, the n-type MOS transistor Qn410 and n-type MOS transistor Qn412 are serially formed in the first active region A1' at a location symmetric to this first active region A1. Note, the drain of the n-type MOS transistor Qn410 is formed on the center line X–X' side.

In the example of FIG. 17, the drain of the n-type MOS transistor Qn409 and the drain of the n-type MOS transistor Qn410 are formed in the common active region on the center line X–X'.

The n-type MOS transistor Qn401 is formed in the second active region A2 facing the first active region A1 on the p-type well Wp. The source of this n-type MOS transistor Qn401 and the source of the n-type MOS transistor Qn411 are connected via a third active region A3.

Also, the n-type MOS transistor Qn406 is formed in a second active region A2' at a location line symmetric to the second active region A2. The source of this n-type MOS transistor Qn406 and the source of the n-type MOS transistor Qn412 are connected via a third active region A3' at a location line symmetric to the third active region A3.

The n-type MOS transistor Qn402 having a gate electrode G2 (storage node N402) common to the n-type MOS transistor Qn409 is formed in a fourth active region A4 on the p-type well Wp facing the second active region A2.

Also, the n-type MOS transistor Qn405 having a gate electrode G3 (storage node N403) common to the n-type MOS transistor Qn410 is formed in a fourth active region A4' at a location line symmetric to the fourth active region A4.

In the example of FIG. 17, the source of the n-type MOS transistor Qn402 and the source of the n-type MOS transistor Qn405 are formed in the common active region on the center line X–X'.

The p-type MOS transistor Qp404 is formed in a fifth active region on the n-type well Wn facing the fourth active region on the p-type well Wp.

Also, the p-type MOS transistor Qp407 is formed in a fifth active region A5' at a location line symmetric to the fifth active region A5 on the n-type well Wn.

The p-type MOS transistor Qp403 having a gate electrode G7 (word line WL) common to the p-type MOS transistor Qp404 is formed in a sixth active region A6 facing the fifth active region A5 on the n-type well Wn. Note that, in the example of FIG. 17, the fifth active region A5 is located on the center line X–X' side with respect to the sixth active region A6.

Also, the p-type MOS transistor Qp408 is formed in a sixth active region A6' at a location line symmetric to the sixth active region A6 on the n-type well Wn. The p-type MOS transistor Qp407 and the p-type MOS transistor Qp408 have the gate electrode G7 (word line WL) common to the p-type MOS transistor Qp403 and the p-type MOS transistor Qp404.

Figure 18:
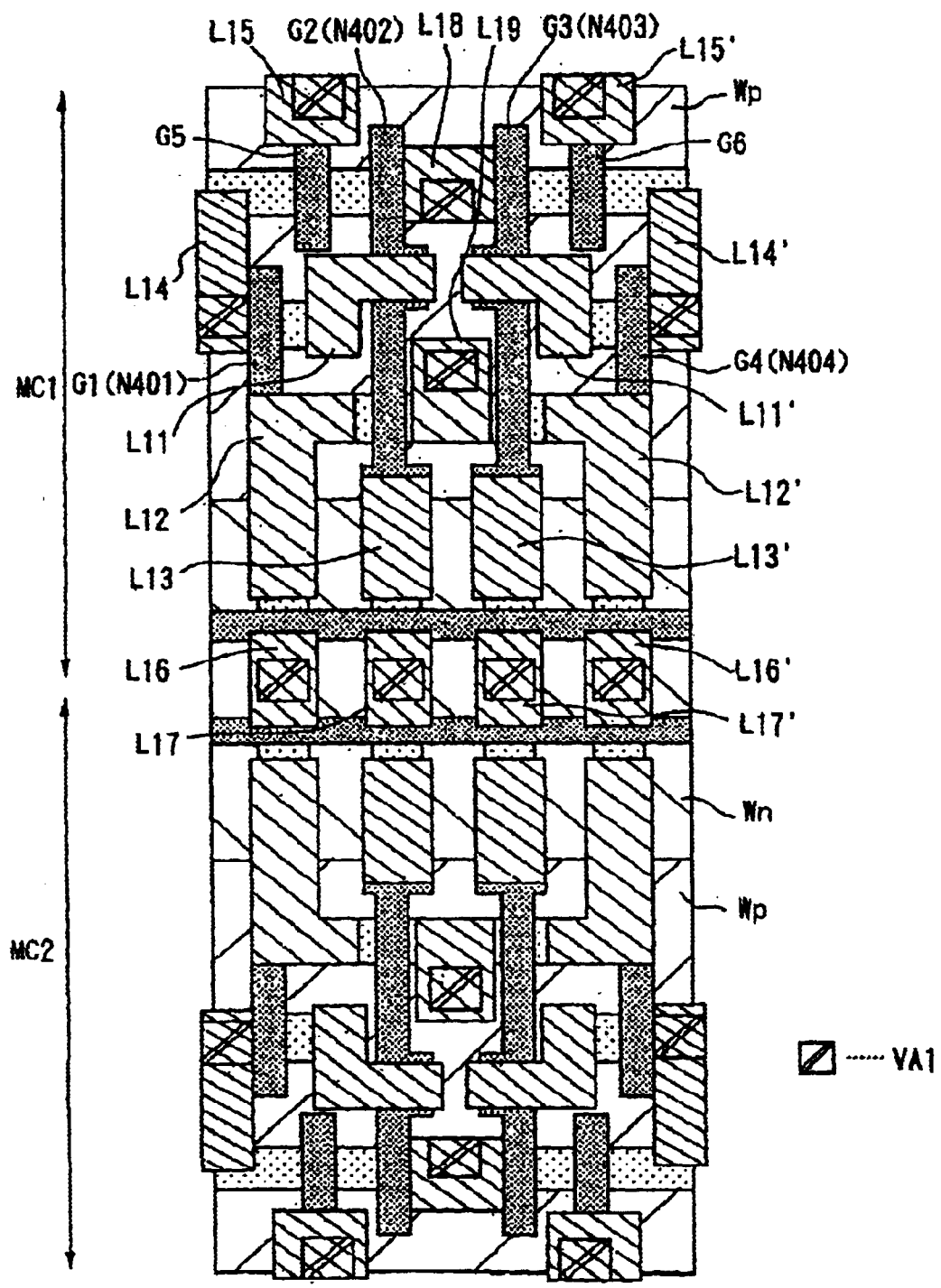
FIG. 18 is a second plan view of an example of the structure of the ternary CAM cell shown in FIG. 15.

FIG. 18 is a second plan view of an example of the configuration of the ternary CAM cell shown in FIG. 15 and shows the first interconnection layer formed above the substrate layer shown in FIG. 17.

In FIG. 18, notation L11 to notation L19 and notation L11' to notation L17' designate interconnections formed in the first interconnection layer, and VA1 designates a via for connecting the interconnections between the first interconnection layer and the second interconnection layer. Other than these, the same notations as those of FIG. 15 and FIG. 17 designate the same components.

The drain of the n-type MOS transistor Qn401 and the gate electrode G2 (storage node N402) of the n-type MOS transistor Qn402 are connected via an interconnection L11 (first interconnection) of the first interconnection layer. Also, the drain of the n-type MOS transistor Qn406 and the gate electrode G3 (storage node N403) of the n-type MOS transistor Qn405 are connected via an interconnection L11' of the first interconnection layer at a location line symmetric to the interconnection L11.

The gate electrode G1 (storage node N401) of the n-type MOS transistor Qn401, the drain of the n-type MOS transistor Qn402, and the drain of the p-type MOS transistor Qp403 are connected via an interconnection L12 (second interconnection) of the first interconnection layer. Also, a gate electrode G4 (storage node N404) of the n-type MOS transistor Qn406, the drain of the n-type MOS transistor Qn405, and the drain of the p-type MOS transistor Qp408 are connected via an interconnection L12' at a location line symmetric to the interconnection L12.

The gate electrode G2 (storage node N402) of the n-type MOS transistor Qn402 and the drain of the p-type MOS transistor Qp404 are connected via an interconnection L13 (third interconnection) of the first interconnection layer. Also, the gate electrode G3 (storage node N403) of the n-type MOS transistor Qn405 and the drain of the p-type MOS transistor Qp407 are connected via an interconnection L13' at a location line symmetric to an interconnection L13.

An interconnection L14 of the first interconnection layer is connected to the third active region A3 via the contact CT. An interconnection L14' at a location line symmetric to the interconnection L14 is connected to the third active region A3' via the contact CT.

An interconnection L15 of the first interconnection layer is connected to a gate electrode G5 (node N405) of the n-type MOS transistor Qn411 via the contact CT. An interconnection L15' at a location line symmetric to the interconnection L15 is connected to the gate electrode G6 (node N406) of the n-type MOS transistor Qn412 via the contact CT.

An interconnection L16 of the first interconnection layer is connected to the source of the p-type MOS transistor Qp403 via the contact CT. An interconnection L16' at a location line symmetric to the interconnection L16 is connected to the source of the p-type MOS transistor Qp408 via the contact CT.

An interconnection L17 of the first interconnection layer is connected to the source of the p-type MOS transistor Qp404 via the contact CT. An interconnection L17' at a location line symmetric to the interconnection L17 is connected to the source of the p-type MOS transistor Qp407 via the contact CT.

An interconnection L18 of the first interconnection layer is connected to the drains of the n-type MOS transistor Qn409 and the n-type MOS transistor Qn410 via the contact CT.

An interconnection L19 of the first interconnection layer is connected to the sources of the n-type MOS transistor Qn402 and the n-type MOS transistor Qn405 via the contact CT.

Figure 19:
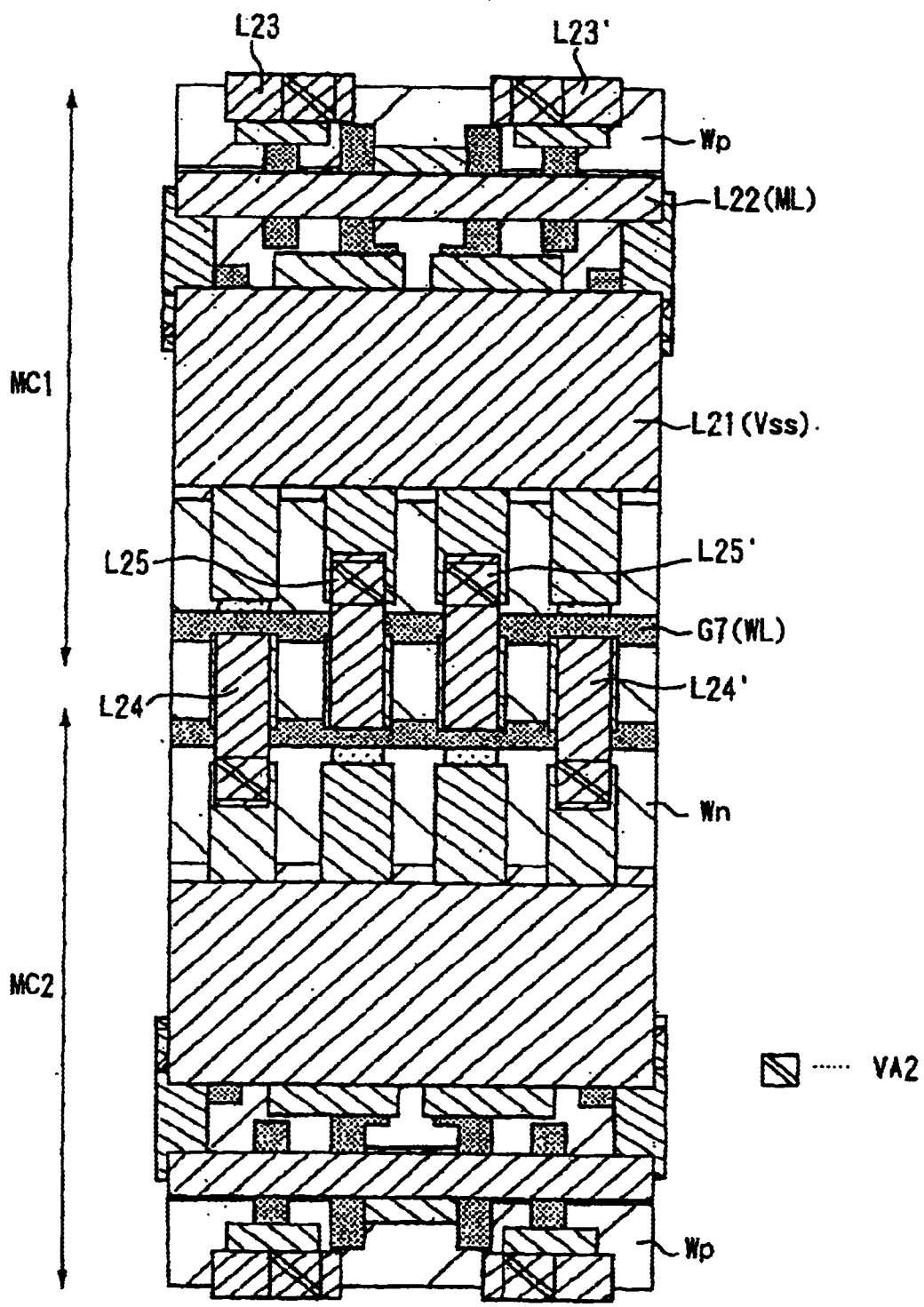
FIG. 19 is a third plan view of an example of the structure of the ternary CAM cell shown in FIG. 15.

FIG. 19 is a third plan view of an example of the configuration of the ternary CAM cell shown in FIG. 15 and shows a second interconnection layer formed above the first interconnection layer shown in FIG. 18.

In FIG. 19, notation L21 to notation L25 and notation L23' to notation L25' designate interconnections formed in the second interconnection layer, and VA2 designates a via for connecting interconnections between the second interconnection layer and the third interconnection layer. Other than these, the same notations of FIG. 15, FIG. 17, and FIG. 18 designate the same components.

The interconnection L18 of the first interconnection layer is connected via the via VA1 to an interconnection L22 (mismatch detection line ML) of the second interconnection layer extended in a direction vertical to the center line X–X'. Namely, drains of the n-type MOS transistor Qn409 and the n-type MOS transistor Qn410 are connected to the mismatch detection line ML via the contact CT, interconnection 18, and the via VA1.

The interconnection L14, interconnection L14', and interconnection L19 of the first interconnection layer are connected via the via VA1 to an interconnection L21 (reference potential Vss) of the second interconnection layer.

Namely, sources of the n-type MOS transistor Qn401 and the n-type MOS transistor Qn411 are connected to the reference potential Vss via the contact CT, interconnection L14, and the via VA1. The sources of the n-type MOS transistor Qn406 and the n-type MOS transistor Qn412 are connected to the reference potential Vss via the contact CT, interconnection L14', and the via VA1. The sources of the n-type MOS transistor Qn402 and the n-type MOS transistor Qn405 are connected to the reference potential Vss via the contact CT, interconnection L19, and the via VA1.

An interconnection L23 of the second interconnection layer is connected via the via VA1 to the interconnection L15 of the first interconnection layer. An interconnection L23' at a location line symmetric to the interconnection L23 is connected via the via VA1 to the interconnection L15' of the first interconnection layer.

An interconnection L24 of the second interconnection layer is connected via the via VA1 to the interconnection L16 of the first interconnection layer. An interconnection L24' at a location line symmetric to the interconnection L24 is connected via the via VA1 to the interconnection L16' of the first interconnection layer.

An interconnection L25 of the second interconnection layer is connected via the via VA1 to the interconnection L17 of the first interconnection layer. An interconnection L25' at a location line symmetric to the interconnection L25 is connected via the via VA1 to the interconnection L17' of the first interconnection layer.

Figure 20:
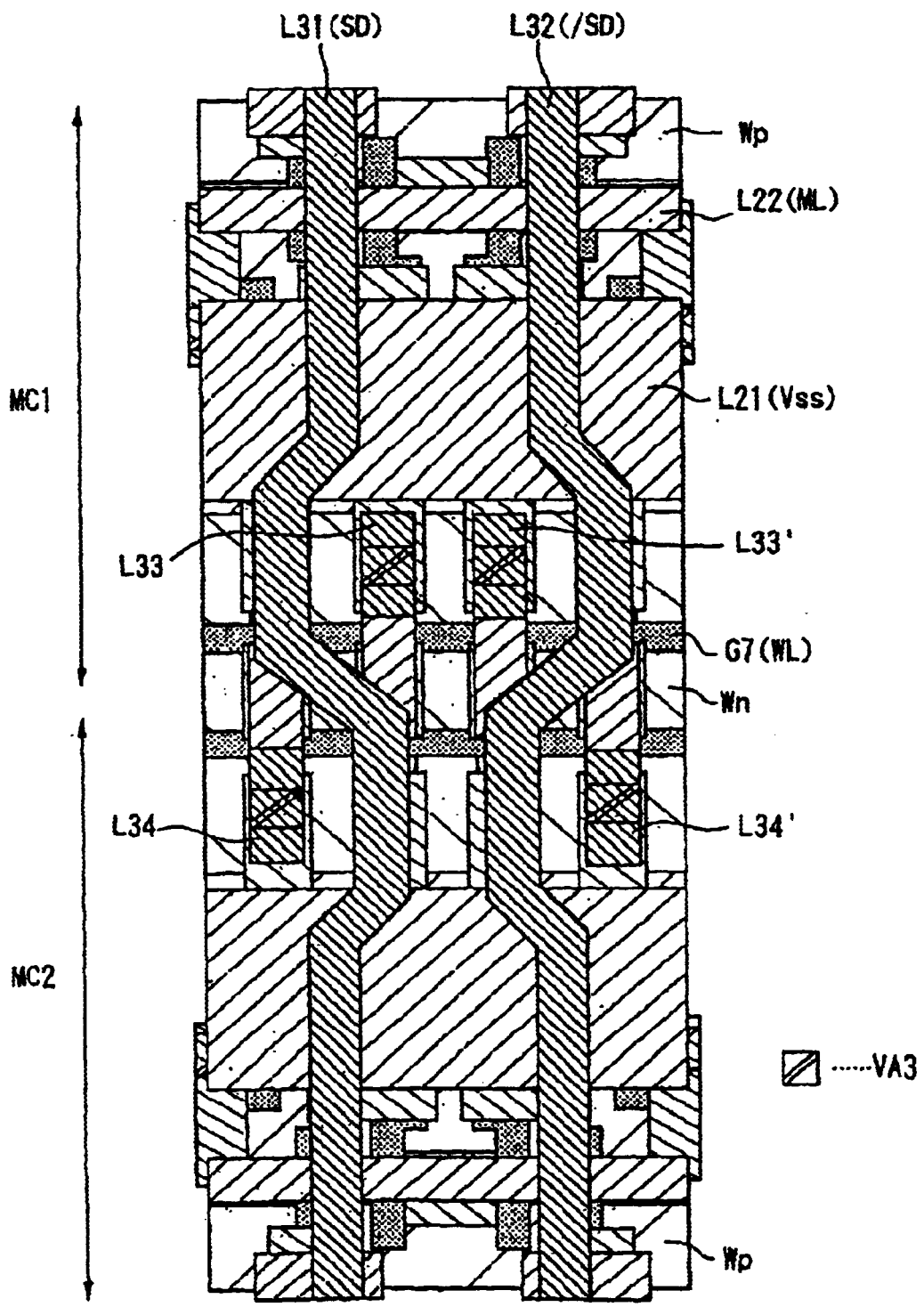
FIG. 20 is a fourth plan view of an example of the structure of the ternary CAM cell shown in FIG. 15.

FIG. 20 is a fourth plan view showing the example of configuration of the ternary CAM cell shown in FIG. 15 and shows a third interconnection layer formed above the second interconnection layer shown in FIG. 19.

In FIG. 20, notation L31 to notation L34, notation L33', and notation L34' designate interconnections formed in the third interconnection layer, and VA3 designates a via for connecting interconnections between the third interconnection layer and the fourth interconnection layer. Other than these, the same notations of FIG. 15 and FIG. 17 to FIG. 19 designate the same components.

An interconnection L31 (search data line SD) of the third interconnection layer extended in a direction parallel to the center line X–X' is connected via the via VA2 to the interconnection L23 of the second interconnection layer. Namely, the gate electrode G5 of the n-type MOS transistor Qn411 is connected to the search data line SD via the contact CT, interconnection L15, via VA1, interconnection L23, and the via VA2.

Also, an interconnection L32 (search data line /SD) line symmetric to the interconnection L31 (search data line SD) is connected to an interconnection L23' of the second interconnection layer via the via VA2. Namely, the gate electrode G6 of the n-type MOS transistor Qn412 is connected to the search data line /SD via the contact CT, interconnection L15', via VA1, interconnection L23', and the via VA2.

An interconnection L33 of the third interconnection layer is connected via the via VA2 to the interconnection L25 of the second interconnection layer. An interconnection L33' at a location symmetric to the interconnection L33 is connected via the via VA2 to the interconnection L25' of the second interconnection layer.

An interconnection L34 of the third interconnection layer is connected via the via VA2 to the interconnection L24 of the second interconnection layer. An interconnection L34' at a location symmetric to the interconnection L34 is connected via the via VA2 to the interconnection L24' of the second interconnection layer.

Figure 21:
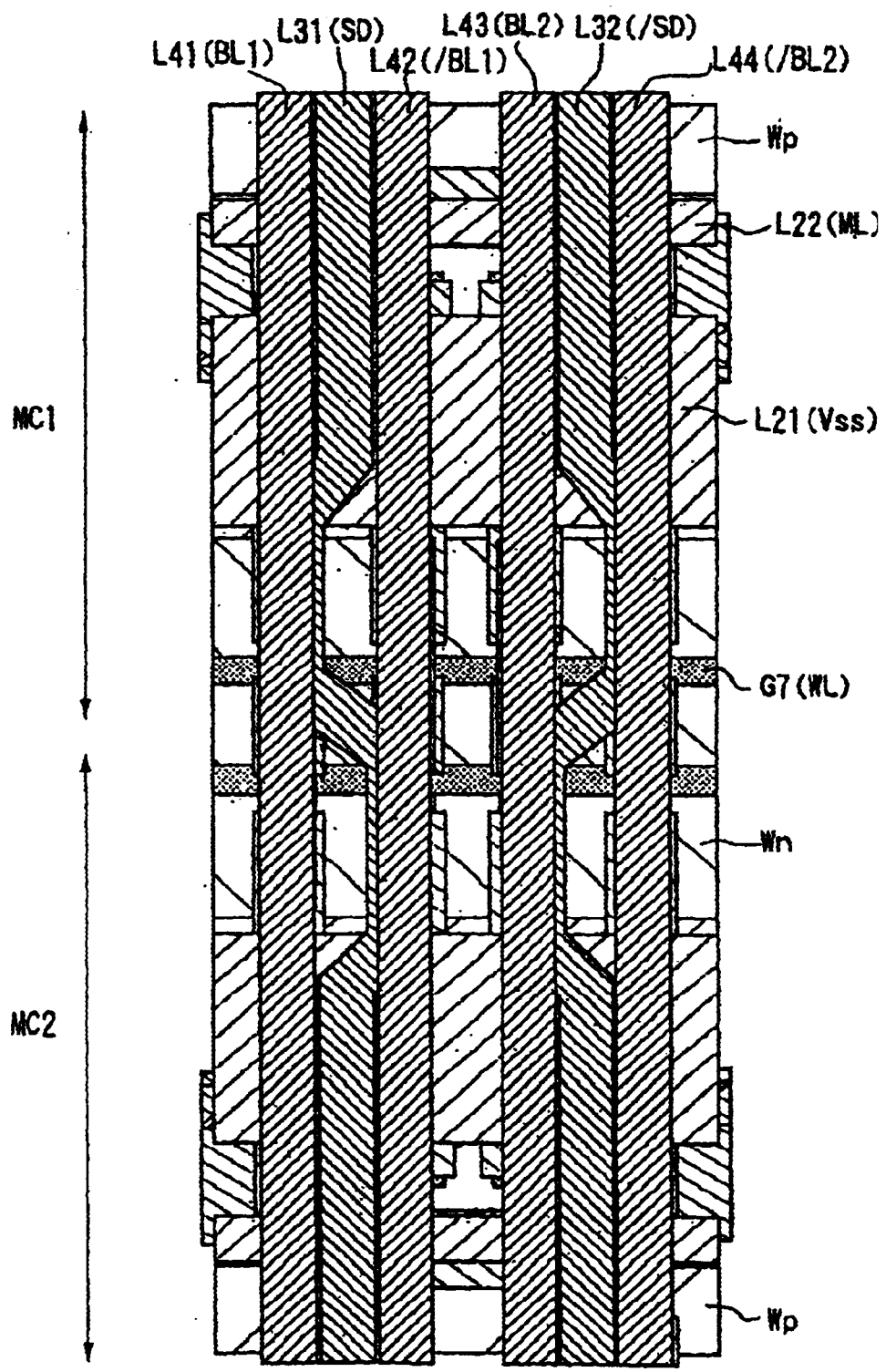
FIG. 21 is a fifth plan view of an example of the structure of the ternary CAM cell shown in FIG. 15.

FIG. 21 is a fifth plan view of an example of the configuration of the ternary CAM cell shown in FIG. 15 and shows a fourth interconnection layer formed above the third interconnection layer shown in FIG. 20.

In FIG. 21, notation L41 to notation L44 designate interconnections formed in the fourth interconnection layer. Other than these, the same notations of FIG. 15 and FIG. 17 to FIG. 20 designate the same components.

An interconnection L41 (bit line BL1) of the fourth layer interconnection extended in a direction parallel to the center line X–X' is connected via the via VA3 to the interconnection L34 of the third interconnection layer. Namely, the source of the p-type MOS transistor Qp403 is connected to the bit line BL1 via the contact CT, interconnection L16, via VA1, interconnection L24, via VA2, interconnection L34, and the via VA3.

An interconnection L44 (bit line /BL2) line symmetric to the interconnection L41 (bit line BL1) is connected via the via VA3 to the interconnection L34' of the third interconnection layer. Namely, the source of the p-type MOS transistor Qp408 is connected to the bit line /BL2 via the contact CT, interconnection L16', via VA1, interconnection L24', via VA2, interconnection L34', and the via VA3.

An interconnection L42 (bit line /BL1) of the fourth layer interconnection extended in a direction parallel to the center line X–X' is connected via the via VA3 to the interconnection L33 of the third interconnection layer. Namely, the source of the p-type MOS transistor Qp404 is connected to the bit line /BL1 via the contact CT, interconnection L17, via VA1, interconnection L25, via VA2, interconnection L33, and the via VA3.

An interconnection L43 (bit line BL2) line symmetric to the interconnection L42 (bit line /BL1) is connected via the via VA3 to the interconnection L33' of the third interconnection layer. Namely, the source of the p-type MOS transistor Qp407 is connected to the bit line BL2 via the contact CT, interconnection L17', via VA1, interconnection L25', via VA2, interconnection L33', and the via VA3.

As explained above, the ternary CAM cell having the structure shown in the plan views of FIG. 17 to FIG. 21 can be produced by using a general process for the production of a semiconductor device having four or more interconnection layers.

Also, when comparing structures of the memory cell MC1 and the memory cell MC2 connected to the common bit line pair, in the interconnection layers other than the second interconnection layer of FIG. 19 and the third interconnection layer of FIG. 20, it is seen that they have structures line symmetric with respect to their border line. Accordingly, as shown in for example FIG. 22, by pairing the memory cell MC1 and the memory cell MC2, a memory cell array having a cyclic structure can be easily comprised.

Note that, the present invention is not limited to the above embodiments.

Namely, the circuit diagrams shown in the embodiments are only examples for explaining the present invention. The present invention can also be worked by various other circuits.

For example, it is also possible to replace the MOS transistors shown in the diagrams by various other transistors such as bipolar transistors.

Also, the example of the timing controller 41 shown in FIG. 3 and FIG. 4 shows a case where there is a period in which both of the p-type MOS transistor Qp11 and p-type MOS transistor Qp12 and both of the p-type MOS transistor Qp13 and p-type MOS transistor Qp14 become on or off at the time of start and the time of end of the reading of the data, but the present invention is not limited to this example. For example, it is also possible to comprise the timing controller 5 so that these transistors simultaneously switch without this period where these transistors simultaneously become on or off.

Also, as the voltage for boosting the bit line pairs, it is also possible to provide a booster circuit in the bit line voltage controller 4 of FIG. 2 and boost the power supply voltage Vcc to the boost voltage VccX by this booster circuit or to supply the voltage from the outside of the semiconductor memory device.

Summarizing the effects of the invention, according to the present invention, first, the reduction of the static noise margin of the four-transistor type SRAM cell accompanying a drop in the voltage of the power supply can be suppressed.

Second, the degree of integration of the circuit can be improved in comparison with the associative memory described as the related art above.

What we claim is:

1. A method of reading stored data of a semiconductor memory device which has a first storage node and a second storage node, a first transistor having a control terminal connected to the first storage node and having a pair of input/output terminals connected between said second storage node and a reference potential, a second transistor having a control terminal connected to said second storage node and having a pair of input/output terminals connected between said first storage node and said reference potential, a third transistor having a pair of input/output terminals connected between said first storage node and a first bit line and having a control terminal connected to a word line, and a forth transistor having a pair of input/output terminals connected between said second storage node and a second bit line and having a control terminal connected to said word line, comprising the steps of:

applying a first voltage to said first bit line and said second bit line in a period for holding said stored data;

activating said word line and applying a second voltage higher than said first voltage to said first bit line and said second bit line at the time of reading said stored data;

connecting a supply terminal of said first voltage to said first bit line and said second bit line said cutting off a supply terminal of said second voltage from said first bit line and said second bit line in the period for holding the stored data;

connecting the supply terminal of said second voltage to said first bit line and said second bit line and, after connection, cutting off the supply terminal of said first voltage from said first bit line and said second bit line when starting to read said stored data; and connecting the supply terminal of said first voltage to said first bit line and said second bit line and, after connection, cutting off the supply terminal of said second voltage from said first bit line and said second bit line when finishing reading said stored data.

2. A method of reading stored data as set forth in claim 1, further comprising:

connecting a supply terminal of said first voltage to said first bit line and said second bit line and cutting off a supply terminal of said second voltage from said first bit line and said second bit line in the period for holding the stored data;

cutting off the supply terminal of said first voltage from said first bit line and said second bit line and, after cutoff, connecting the supply terminal of said second voltage to said first bit line and said second bit line when starting to read said stored data; and cutting off the supply terminal of said second voltage from said first bit line and said second bit line and, after cutoff, connecting the supply terminal of said first voltage to said first bit line and said second bit line when finishing reading said stored data.

3. A method of reading stored data of a semiconductor memory device having a plurality of memory cells arranged in a matrix, a plurality of word lines connected to memory cells of the same row of said matrix, and a plurality of first bit lines and second bit lines connected to memory cells of the same column of said matrix, wherein said memory cell has a first storage node and a second storage node, a first transistor having a control terminal connected to the first storage node and having a pair of input/output terminals connected between said second storage node and a reference potential, a second transistor having a control terminal connected to said second storage node and having a pair of input/output terminals connected between said first storage node and said reference potential, a third transistor having a pair of input/output terminals connected between said first storage node and a first bit line and having a control terminal connected to a word line, and a fourth transistor having a pair of input/output terminals connected between said second storage node and a second bit line and having a control terminal connected to said word line, comprising the steps of:

applying a first voltage to said first bit line and said second bit line in the period for holding said stored data;

activating at least one of said plurality of word lines and applying a second voltage higher than said first voltage to said first bit line and said second bit line at the time of reading said stored data;

connecting a supply terminal of said first voltage to said first bit line and said second bit line and cutting off a supply terminal of said second voltage from said first bit line and said second bit line in the period for holding the stored data;

connecting the supply terminal of said second voltage to said first bit line and said second bit line and, after connection, cutting off the supply terminal of said first voltage from said first bit line and said second bit line when starting to read said stored data; and connecting the supply terminal of said first voltage to said first bit line and said second bit line and, after connection, cutting off the supply terminal of said second voltage from said first bit line and said second bit line when finishing reading said stored data.

4. A method of reading stored data as set forth in claim 3, further comprising connecting a supply terminal of said first voltage to said first bit line and said second bit line and cutting off a supply terminal of said second voltage from said first bit line and said second bit line in the period for holding the stored data;

cutting off the supply terminal of said first voltage from said first bit line and said second bit line and, after cutoff, connecting the supply terminal of said second voltage to said first bit line and said second bit line when starting to read said stored data; and cutting off the supply terminal of said second voltage from said first bit line and said second bit line and, after cutoff, connecting the supply terminal of said first voltage to said first bit line and said second bit line when finishing reading said stored data.

5. A semiconductor memory device comprising:

a first storage node and a second storage node;

a first transistor having a control terminal connected to the first storage node and having a pair of input/output terminals connected between said second storage node and a reference potential;

a second transistor having a control terminal connected to said second storage node and having a pair of input/output terminals connected between said first storage node and said reference potential;

a third transistor having a pair of input/output terminals connected between said first storage node and a first bit line and having a control terminal connected to a word line;

a fourth transistor having a pair or input/output terminals connected between said second storage node and a second bit line and having a control terminal connected to said word line;

a control circuit for applying a first voltage to said first bit line and said second bit line in the period for holding said stored data and activating said word line and applying a second voltage higher than said first voltage to said first bit line and said second bit line at the time of reading said stored data;

a first terminal for supplying said first voltage;

a second terminal for supplying said second voltage;

a first switch circuit for connecting said first terminal and said first bit line and second bit line in accordance with an input first control signal;

a second switch circuit for connecting said second terminal and said first bit line and second bit line in accordance with an input second control signal; and a switch control circuit for generating said first control signal and second control signal for connecting said first terminal and said first bit line and second bit line and cutting off said second terminal from said first bit line and said second bit line in the period for holding the stored data, connecting said second terminal and said first bit line and second bit line and, after connection, cutting off said first terminal from said first bit line and said second bit line when starting to read said stored data, and connecting said first terminal and said first bit line and second bit line and, after connection, cutting off said second terminal from said first bit line and second bit line when finishing reading said stored data.

6. A semiconductor memory device as set forth in claim 5, wherein said control circuit includes
   a first terminal for supplying said first voltage;
   a second terminal for supplying said second voltage;
   a first switch circuit for connecting said first terminal and said first bit line and second bit line in accordance with an input first control signal;
   a second switch circuit for connecting said second terminal and said first bit line and second bit line in accordance with an input second control signal; and
   a switch control circuit for generating said first control signal and second control signal for connecting said first terminal and said first bit line and second bit line and cutting off said second terminal from said first bit line and said second bit line in the period for holding the stored data, cutting off said first terminal from said first bit line and second bit line and, after cutoff, connecting said second terminal and said first bit line and second bit line when starting to read said stored data, and cutting off said second terminal from said first bit line and second bit line and, after cutoff, connecting said first terminal to said first bit line and said second bit line when finishing reading said stored data.

7. A semiconductor memory device as set forth in claim 5, wherein
   said first transistor and said second transistor are n-type field effect transistors and said third transistor and said fourth transistor are p-type field effect transistors.

8. A semiconductor memory device as set forth in claim 5, wherein said third transistor and said fourth transistor have a leakage current between input/output terminals larger in comparison with that of said first transistor and said second transistor.

9. A semiconductor memory device comprising:
   a plurality of memory cells arranged in a matrix;
   a plurality of word lines connected to memory cells of the same row of said matrix;
   a plurality of first bit lines and second bit lines connected to memory cells of the same column of said matrix; and
   a control circuit for applying a first voltage to said first bit line and said second bit line in a period for holding said stored data and activating at least one of said plurality of word lines and applying a second voltage higher than said first voltage to said first bit line and said second bit line at the time of reading said stored data;
   a first terminal for supplying said first voltage;
   a second terminal for supplying said second voltage;
   a first switch circuit for connecting said first terminal and said first bit line and second bit line in accordance with an input first control signal;
   a second switch circuit for connecting said second terminal and said first bit line and second bit line in accordance with an input second control signal; and
   a switch control circuit for generating said first control signal and second control signal for connecting said first terminal and said first bit line and second bit line and cutting off said second terminal from said first bit line and said second bit line in the period for holding the stored data, connecting said second terminal and said first bit line and second bit line and, after connection, cutting off said first terminal from said first bit line and said second bit line when starting to read said stored data, and connecting said first terminal and said first bit line and second bit line and, after connection, cutting off said second terminal from said first bit line and second bit line when finishing reading said stored data;
   wherein said memory cell has:
      a first storage node and a second storage node,
      a first transistor having a control terminal connected to the first storage node and having a pair of input/output terminals connected between said second storage node and a reference potential,
      a second transistor having a control terminal connected to said second storage node and having a pair of input/output terminals connected between said first storage node and said reference potential,
      a third transistor having a pair of input/output terminals connected between said first storage node and said first bit line and having a control terminal connected to said word line, and
      a fourth transistor having a pair of input/output terminals connected between said second storage node and said second bit line and having a control terminal connected to said word line.

10. A semiconductor memory device as set forth in claim 9, wherein said control circuit includes
    a first terminal for supplying said first voltage;
    a second terminal for supplying said second voltage;
    a first switch circuit for connecting said first terminal and said first bit line and second bit line in accordance with an input first control signal;
    a second switch circuit for connecting said second terminal and said first bit line and second bit line in accordance with an input second control signal; and
    a switch control circuit for generating said first control signal and second control signal for connecting said first terminal and said first bit line and second bit line and cutting off said second terminal from said first bit line and said second bit line in the period for holding the stored data, cutting off said first terminal from said first bit line and second bit line and, after cutoff, connecting said second terminal and said first bit line and second bit line when starting to read said stored data, and cutting off said second terminal from said first bit line and second bit line and, after cutoff connecting said first terminal to said first bit line and said second bit line when finishing reading said stored data.

11. A semiconductor memory device as set forth in claim 9, wherein
    said first transistor and said second transistor are n-type field effect transistors and said third transistor and said fourth transistor are p-type field effect transistors.

12. A semiconductor memory device as set forth in claim 9, wherein said third transistor and said fourth transistor have a leakage current between input/output terminals larger in comparison with that of said first transistor and said second transistor.

13. A semiconductor memory device comprising:
    a first storage node and a second storage node;
    a first transistor having a control terminal connected to the first storage node and having a pair of input/output terminals connected between said second storage node and a reference potential;

a second transistor having a control terminal connected to said second storage node and having a pair of input/output terminals connected between said first storage node and said reference potential;

a third transistor for controlling access with respect to said first storage node;

a fourth transistor for controlling access with respect to said second storage node;

a mismatch judgement circuit for judging a mismatch between the stored data in accordance with levels of said first storage node and said second storage node and the input search data; and a control circuit for setting said third transistor and said fourth transistor in a nonconductive state and applying a stored data holding voltage to said first storage node and said second storage node via said third transistor or said fourth transistor in a period of holding said stored data.

14. A semiconductor memory device as set forth in claim 13, wherein said third transistor and said fourth transistor have a leakage current between input/output terminals larger in comparison with that of said first transistor and said second transistor.

15. A semiconductor memory device as set forth in claim 13, wherein said control circuit sets said third transistor and said fourth transistor in a conductive state and applies a read voltage higher than said stored data holding voltage to said first storage node and said second storage node through said third transistor or said fourth transistor in a period for reading said stored data.

16. A semiconductor memory device as set forth in claim 15, wherein
said device further includes
a first bit line connected to said first storage node through said third transistor and
a second bit line connected to said second storage node through said fourth transistor; wherein
said control circuit includes
a first terminal for supplying said stored data holding voltage;
a second terminal for supplying said read voltage;
a first switch circuit for connecting said first terminal and said first bit line and second bit line in accordance with an input first control signal;
a second switch circuit for connecting said second terminal and said first bit line and second bit line in accordance with an input second control signal; and
a switch control circuit for generating said first control signal and second control signal for connecting said first terminal and said first bit line and second bit line and cutting off said second terminal from said first bit line and said second bit line in the period for holding the stored data, connecting said second terminal and said first bit line and second bit line and, after connection, cutting off said first terminal from said first bit line and said second bit line when starting to read said stored data, and connecting said first terminal and said first bit line and second bit line and, after connection, cutting off said second terminal from said first bit line and second bit line when finishing reading said stored data.

17. A semiconductor memory device as set forth in claim 15, wherein
said device further includes a first bit line connected to said first storage node through said third transistor and
a second bit line connected to said second storage node through said fourth transistor; and
said control circuit includes
a first terminal for supplying said stored data holding voltage;
a second terminal for supplying said read voltage;
a first switch circuit for connecting said first terminal and said first bit line and second bit line in accordance with an input first control signal;
a second switch circuit for connecting said second terminal and said first bit line and second bit line in accordance with an input second control signal; and
a switch control circuit for generating said first control signal and second control signal for connecting said first terminal and said first bit line and second bit line and cutting off said second terminal from said first bit line and said second bit line in the period for holding the stored data, cutting off said first terminal from said first bit line and second bit line and, after cutoff, connecting said second terminal and said first bit line and second bit line when starting to read said stored data, and cutting off said second terminal from said first bit line and second bit line and, after cutoff, connecting said first terminal to said first bit line and said second bit line when finishing reading said stored data.

18. A semiconductor memory device as set forth in claim 13, wherein
said device further includes
a first bit line connected to said first storage node through said third transistor,
a second bit line connected to said second storage node through said fourth transistor,
a mismatch detection line, and
a mismatch detection line voltage supply circuit for supplying voltage to the said mismatch detection line;
said mismatch judgement circuit includes:
a third node,
a fifth transistor having a control terminal connected to said second storage node and having a pair of input/output terminals connected between said third node and said first bit line,
a sixth transistor having a control terminal connected to said first storage node and having a pair of input/output terminals connected between said third node and said second bit line, and
a seventh transistor having a control terminal connected to said third node and having a pair of input/output terminals connected between said mismatch detection line and a reference potential; and
said control circuit sets said third transistor and said fourth transistor in the nonconductive state and applying a voltage in accordance with said search data to said first bit line and said second bit line in the period of detecting mismatch between said stored data and said search data.

19. A semiconductor memory device as set forth in claim 13, wherein
said device further includes
a first bit line connected to said first storage node through said third transistor,
a second bit line connected to said second storage node through said fourth transistor,
a mismatch detection line, and a mismatch detection line current supply circuit for supplying current to the said mismatch detection line;

said mismatch judgement circuit includes:
  a third node,
  a fifth transistor having a control terminal connected to said first storage node and having a pair of input/output terminals connected between said third node and said first bit line,
  a sixth transistor having a control terminal connected to said second storage node and having a pair of input/output terminals connected between said third node and said second bit line, and
  a seventh transistor having a control terminal connected to said third node and having a pair of input/output terminals inserted on said mismatch detection line; and said control circuit sets said third transistor and said fourth transistor in the nonconductive state and applying a voltage in accordance with said search data to said first bit line and said second bit line in the period of detecting mismatch between said stored data and said search data.

20. A semiconductor memory device comprising:
a plurality of memory cells arranged in a matrix;
a plurality of word lines connected to memory cells of the same row of said matrix;
a plurality of mismatch detection lines connected to memory cells of the same row of said matrix;
a plurality of first bit lines and second bit lines connected to memory cells of the same column of said matrix; and
a control circuit for deactivating said word line and applying a stored data holding voltage so said first bit line and said second bit line in a period for holding the stored data of said memory cell, while deactivating said word line and applying voltage in accordance with input search data to said first bit line and said second bit line in a period for detecting mismatch between said search data and said stored data, wherein
said memory cell has:
  a first storage node and a second storage node,
  a first transistor having a control terminal connected to the first storage node and having a pair of input/output terminals connected between said second storage node and a reference potential,
  a second transistor having a control terminal connected to said second storage node and having a pair of input/output terminals connected between said first storage node and said reference potential,
  a third transistor having a pair of input/output terminals connected between said first storage node and said first bit line and having a control terminal connected to said word line,
  a fourth transistor having a pair of input/output terminals connected between said second storage node and said second bit line and having a control terminal connected to said word line, and
  a mismatch judgement circuit for judging a mismatch between said stored data in accordance with levels of said first storage node and said second storage node and said search data, and activating said mismatch detection line when mismatch is judged.

21. A semiconductor memory device as set forth in claim 20, wherein said third transistor and said fourth transistor have a leakage current between input/output terminals larger in comparison with that of said first translator and said second transistor.

22. A semiconductor memory device as set forth in claim 20, wherein said control circuit activates a desired word line and applies a read voltage higher than said stored data holding voltage to said first bit line and said second bit line in a period for reading said stored data.

23. A semiconductor memory device as set forth in claim 20, wherein
said device further includes a mismatch detection line voltage supply circuit for supplying voltage to the said mismatch detection line; and
said mismatch judgement circuit includes:
  a third node,
  a fifth transistor having a control terminal connected to said second storage node and having a pair of input/output terminals connected between said third node and said first bit line,
  a sixth transistor having a control terminal connected to said first storage node and having a pair of input/output terminals connected between said third node and said second bit line, and
  a seventh transistor having a control terminal connected to said third node and having a pair of input/output terminals connected between said mismatch detection line and a reference potential.

24. A semiconductor memory device as set forth in claim 20, wherein
said device further includes a mismatch detection line current supply circuit for supplying current to the said mismatch detection line; and
said mismatch judgement circuit includes:
  a third node,
  a fifth transistor having a control terminal connected to said first storage node and having a pair of input/output terminals connected between said third node and said first bit line,
  a sixth transistor having a control terminal connected to said second storage node and having a pair of input/output terminals connected between said third node and said second bit line, and
  a seventh transistor having a control terminal connected to said third node and having a pair of input/output terminals inserted on said mismatch detection line.

25. A semiconductor memory device comprising:
a first memory circuit; and
a second memory circuit, wherein each of the first and second memory circuits includes
  a first storage node and a second storage node,
  a first transistor having a control terminal connected to the first storage node and having a pair of input/output terminals connected between said second storage node and a reference potential,
  a second transistor having a control terminal connected to said second storage node and having a pair of input/output terminals connected between said first storage node and said reference potential,
  a third transistor for controlling an access with respect to said first storage node, and
  a fourth transistor for controlling access with respect to said second storage node;
a mismatch judgment circuit for judging mismatch between the stored data in accordance with the combination of data stored in said first memory circuit and said second memory circuit and the input search data; and
a control circuit for setting said third transistor and said fourth drain in a nonconductive state, and applying a stored data holding voltage to said first storage node and said second storage node via said third transistor or said fourth transistor in a period of holding said stored data.

26. A semiconductor memory device as set forth in claim 25, wherein said third transistor and said fourth transistor have a leakage current between input/output terminals larger in comparison with that of said first transistor and said second transistor.

27. A semiconductor memory device as set forth in claim 25, wherein said control circuit sets said third transistor and said fourth transistor in a conductive state and applies a read voltage higher than said stored data holding voltage to said first storage node and said second storage node through said third transistor or said fourth transistor in a period for reading said stored data.

28. A semiconductor memory device as set forth in claim 27, wherein
said device further includes
a first bit line connected to said first storage node through said third transistor and
a second bit line connected to said second storage node through said fourth transistor; and
said control circuit includes
a first terminal for supplying said stored data holding voltage;
a second terminal for supplying said read voltage;
a first switch circuit for connecting said first terminal and said first bit line and second bit line in accordance with an input first control signal;
a second switch circuit for connecting said second terminal and said first bit line and second bit line in accordance with an input second control signal; and
a switch control circuit for generating said first control signal and second control signal for connecting said first terminal and said first bit line and second bit line and cutting off said second terminal from said first bit line and said second bit line in the period for holding the stored data, connecting said second terminal and said first bit line and second bit line and, after connection, cutting off said first terminal from said first bit line and said second bit line when starting to read said stored data, and connecting said first terminal and said first bit line and second bit line and, after connection, cutting off said second terminal from said first bit line and second bit line when finishing reading said stored data.

29. A semiconductor memory device as set forth in claim 27, wherein
said device further includes
a first bit line connected to said first storage node through said third transistor and
a second bit line connected to said second storage node through said fourth transistor; and
said control circuit includes
a first terminal for supplying said stored data holding voltage;
a second terminal for supplying said read voltage;
a first switch circuit for connecting said first terminal and said first bit line and second bit line in accordance with an input first control signal;
a second switch circuit for connecting said second terminal and said first bit line and second bit line in accordance with an input second control signal; and
a switch control circuit for generating said first control signal said second control signal for connecting said first terminal and said first bit line and second bit line and cutting off said second terminal from said first bit line and said second bit line in the period for holding the stored data, cutting off said first terminal from said first bit line and second bit line and, after cutoff, connecting said second terminal and said first bit line and second bit line when starting to read said stored data, and cutting off said second terminal from said first bit line and second bit line and, after cutoff, connecting said first terminal to said first bit line and said second bit line when finishing reading said stored data.

30. A semiconductor memory device as set forth in claim 25, wherein
said device feather includes
a mismatch detection line,
a first search data line said second search data line, and
a mismatch detection line voltage supply circuit for supplying voltage to the said mismatch detection line;
said mismatch judgement circuit includes:
a first activation circuit for activating said mismatch detection line in accordance with a level of said first storage node or second storage node of said first memory circuit and a level of said first search data line, and
a second activation circuit for activating said mismatch detection line in accordance with a level of said first storage node or second storage node of said second memory circuit and a level of said second search data line; and
said control circuit sets said third transistor and said fourth transistor in the nonconductive state and applying a voltage in accordance with said search data to said first search data line and said second search data line in the period of detecting mismatch between said stored data and said search data.

31. A semiconductor memory device as set forth in claim 30, wherein
said first activation circuit and said second activation circuit each include a fifth transistor and sixth transistor connected in series between said mismatch detection line and said reference potential,
a control terminal of said fifth transistor is connected to said first storage node or said second storage node, and
a control terminal of said sixth transistor is connected to said first search data line or said second search data line.

32. A semiconductor memory device comprising:
a plurality of memory cells arranged in a matrix;
a plurality of first word lines and second word lines connected to memory cells of the same row of said matrix;
a plurality of mismatch detection lines connected to memory cells of the same row of said matrix;
a plurality of first bit lines and second bit lines connected to memory cells of the same column of said matrix;
a first search data line and a second search data line connected to memory cells of the same column of said matrix; and
a control circuit for deactivating said first word lines and said second word lines, applying a stored data holding voltage to said first bit lines and said second bit lines, and applying voltage in accordance with input search data to said first search data line and said second search data line in a period for detecting mismatch between said search data and the stored data of said memory cell, wherein said memory cell includes:
  a first memory circuit connected to said first word line,
  a second memory circuit connected to said second word line, and
  a mismatch judgment circuit for judging mismatch between said stored data in accordance with the combination of data stored in said first memory circuit and said second memory circuit and said search data, and activating said mismatch detection line when judging mismatch;
said first memory circuit and said second memory circuit each include:
  a first storage node and a second storage node,
  a first transistor having a control terminal connected to the first storage node and having a pair of input/output terminals connected between said second storage node and a reference potential,
  a second transistor having a control terminal connected to said second storage node and having a pair of input/output terminals connected between said first storage node and said reference potential,
  a third transistor having a pair of input/output terminals connected between said first storage node and said first bit line and having a control terminal connected to said first word line or said second word line, and
  a fourth transistor having a pair of input/output terminals connected between said second storage node and said second bit line and having a control terminal connected to said first word line or said second word line.

33. A semiconductor memory device as set forth in claim 32, wherein said third transistor and said fourth transistor have a leakage current between input/output terminals larger in comparison with that of said first transistor and said second transistor.

34. A semiconductor memory device as set forth in claim 32, wherein said control circuit activates a desired first word line or second word line and applies a read voltage higher than said stored data holding voltage to said first bit line and said second bit line in a period for reading said stored data.

35. A semiconductor memory device as set forth in claim 32, wherein
  said device further includes a mismatch detection line voltage supply circuit for supplying voltage to the said mismatch detection line; and
  said mismatch judgement circuit includes:
    a first activation circuit for activating said mismatch detection line in accordance with a level of said first storage node or said second storage node of said first memory circuit and a level of said first search data line and
    a second activation circuit for activating said mismatch detection line in accordance with a level of said first storage node or said second storage node of said second memory circuit and a level of said second search data line.

36. A semiconductor memory device as set forth in claim 35, wherein
  said first activation circuit and said second activation circuit each include a fifth transistor and sixth transistor connected in series between said mismatch detection line and said reference potential,
  a control terminal of said fifth transistor is connected to said first storage node or said second storage node, and
  a control terminal of said sixth transistor is connected to said first search data line or said second search data line.

37. A semiconductor memory device comprising:
  a plurality of memory cells arranged in a matrix;
  a plurality of word lines connected to memory cells of the same row of said matrix;
  a plurality of mismatch detection lines connected to memory cells of the same row of said matrix;
  a plurality of first bit line pairs and second bit line pairs connected to memory cells of the same column of said matrix;
  a first search data line and a second search data line connected to memory cells of the same column of said matrix; and
  a control circuit for deactivating said word lines, applying a stored data holding voltage to said first bit line pairs and said second bit line pairs, and applying voltage in accordance with input search data to said first search data line and said second search data line in a period for detecting mismatch between said search data and the stored data of said memory cell, wherein
said memory cell includes:
  a first memory circuit connected to said first bit line pair,
  a second memory circuit connected to said second bit line pair, and
  a mismatch judgement circuit for judging mismatch between said stored data in accordance with the combination of data stored in said first memory circuit and said second memory circuit and said search data, and activating said mismatch detection line when judging mismatch;
said first memory circuit and said second memory circuit each include:
  a first storage node and a second storage node,
  a first transistor having a control terminal connected to the first storage node and having a pair of input/output terminals connected between said second storage node and a reference potential,
  a second transistor having a control terminal connected to said second storage node and having a pair of input/output terminals connected between said first storage node and said reference potential,
  a third transistor having a pair of input/output terminals connected between one bit line of said first bit line pair or said second bit line pair and said first storage node and having a control terminal connected to said word line, and
  a fourth transistor having a pair of input/output terminals connected between the other bit line of said first bit line pair or said second bit line pair and said second storage node, and having a control terminal connected to said word line.

38. A semiconductor memory device as set forth in claim 37, wherein said third transistor and said fourth transistor have a leakage current between input/output terminals larger in comparison with that of said first transistor and said second transistor.

39. A semiconductor memory device as set forth in claim 37, wherein said control circuit activates a desired word line and applies a read voltage higher than said stored data holding voltage to said first bit line pair or said second bit line pair in a period for reading said stored data.

40. A semiconductor memory device as set forth in claim 37, wherein
  said device further includes a mismatch detection line voltage supply circuit for supplying voltage to the said mismatch detection line; and said mismatch judgment circuit includes:
- a first activation circuit for activating said mismatch detection line in accordance with a level of said first storage node or said second storage node of said first memory circuit and a level of said first search data line, and
- a second activation circuit for activating said mismatch detection line in accordance with a level of said first storage node or said second storage node of said second memory circuit and a level of said second search data line.

41. A semiconductor memory device as set forth in claim 40, wherein
said first activation circuit and said second activation circuit each include a fifth transistor and sixth transistor connected in series between said mismatch detection line and said reference potential,
a control terminal of said fifth transistor is connected to said first storage node or said second storage node, and
a control terminal of said sixth transistor is connected to said first search data line or said second search data line.

42. A semiconductor memory device as set forth in claim 41, wherein said memory cell is formed line symmetrically on a semiconductor substrate by a first circuit including said first memory circuit and said first activation circuit and a second circuit including said second memory circuit and said second activation circuit.

43. A semiconductor memory device as set forth in claim 42, wherein
in said first circuit and said second circuit,
said fifth transistor and said sixth transistor are formed in series in a first active region on said semiconductor substrate using the drain side of said fifth transistor as the center line side of said line symmetry,
said first transistor is formed on a second active region facing said first active region, a source of said first transistor and a source of said sixth transistor being connected through a third active region,
said second transistor is formed in a fourth active region facing said second active region and has a gate electrode common with said fifth transistor,
said fourth transistor is formed in a filth active region facing said fourth active region,
said third transistor is formed in a sixth active region facing said fifth active region and has a gate electrode common with said fourth transistor,
a drain of said first transistor and a gate electrode of said second transistor are connected through a first interconnection formed in a first interconnection layer,
a gate electrode of said first transistor, a drain of said second electrode, and a drain of said third transistor are connected through a second interconnection formed in said first interconnection layer,
a gate electrode of said second transistor and a drain of said fourth transistor are connected through a third interconnection formed in said first interconnection layer,
a drain of said fifth transistor is connected to said mismatch detection line formed in a second interconnection layer,
said third active region and a source of said second transistor are connected to a reference potential line formed in said second interconnection layer,
a gate electrode of said sixth transistor is connected to said first search data line or said second search data line formed in a third interconnection layer,
a source of said third transistor is connected to one bit line of said first bit line pair or said second bit line pair formed in a fourth interconnection layer, and
a source of said fourth transistor is connected to the other bit line of said first bit line pair or said second bit line pair formed in said fourth interconnection layer.

* * * * *

UNITED STATES PATENT AND TRADEMARK OFFICE
CERTIFICATE OF CORRECTION

PATENT NO. : 6,738,283 B2
DATED : May 18, 2004
INVENTOR(S) : Gen Kasai et al.

It is certified that error appears in the above-identified patent and that said Letters Patent is hereby corrected as shown below:

<u>Title page,</u>
Item [54], Title, should read -- METHOD OF PRODUCING STORED DATA AND SEMICONDUCTOR MEMORY DEVICE --.

<u>Column 47,</u>
Line 6, "said" should read -- and --.

<u>Column 48,</u>
Line 14, "comprising" should read -- comprising: --.

<u>Column 50,</u>
Line 51, "cutoff" should read -- cutoff, --.

Signed and Sealed this

Sixth Day of September, 2005

JON W. DUDAS
*Director of the United States Patent and Trademark Office*